United States Patent
Yamamoto et al.

(10) Patent No.: US 9,685,273 B2
(45) Date of Patent: Jun. 20, 2017

(54) CHIP CAPACITOR, CIRCUIT ASSEMBLY, AND ELECTRONIC DEVICE

(71) Applicant: ROHM CO., LTD., Kyoto (JP)

(72) Inventors: Hiroki Yamamoto, Kyoto (JP); Keishi Watanabe, Kyoto (JP); Hiroshi Tamagawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/051,648

(22) Filed: Feb. 23, 2016

(65) Prior Publication Data

US 2016/0211077 A1 Jul. 21, 2016

Related U.S. Application Data

(63) Continuation of application No. 14/440,016, filed as application No. PCT/JP2013/078969 on Oct. 25, 2013, now Pat. No. 9,288,908.

(30) Foreign Application Priority Data

Nov. 2, 2012 (JP) .................................. 2012-242834
Sep. 4, 2013 (JP) .................................. 2013-183157

(51) Int. Cl.
*H01L 27/00* (2006.01)
*H01G 4/30* (2006.01)
(Continued)

(52) U.S. Cl.
CPC ................. *H01G 4/30* (2013.01); *H01G 2/06* (2013.01); *H01G 4/005* (2013.01); *H01G 4/228* (2013.01); *H01G 4/40* (2013.01); *H01L 22/14* (2013.01); *H01L 22/20* (2013.01); *H01L 23/5223* (2013.01); *H01L 24/48* (2013.01); *H01L 27/0676* (2013.01); *H01L 27/101* (2013.01);
(Continued)

(58) Field of Classification Search
CPC . H01L 2224/48227; H01L 2224/49175; H01L 24/48
See application file for complete search history.

(56) References Cited

U.S. PATENT DOCUMENTS 3,916,508 A * 11/1975 Conzelmann ........... G05F 1/468
219/121.19
5,173,622 A * 12/1992 Maemura ......... H03K 19/09432
326/115
(Continued)

FOREIGN PATENT DOCUMENTS

JP H05-13201 A 1/1993
JP H06-21325 A 1/1994
(Continued)

*Primary Examiner* — Ngan Ngo
(74) *Attorney, Agent, or Firm* — Rabin & Berdo, P.C.

(57) ABSTRACT

A chip capacitor according to the present invention includes a substrate, a pair of external electrodes formed on the substrate, a capacitor element connected between the pair of external electrodes, and a bidirectional diode connected between the pair of external electrodes and in parallel to the capacitor element. Also, a circuit assembly according to the present invention includes the chip capacitor according to the present invention and a mounting substrate having lands, soldered to the external electrodes, on a mounting surface facing a front surface of the substrate.

16 Claims, 53 Drawing Sheets

(51) Int. Cl.
| | |
|---|---|
| *H01L 23/522* | (2006.01) |
| *H01L 27/10* | (2006.01) |
| *H01L 27/24* | (2006.01) |
| *H01L 23/00* | (2006.01) |
| *H01G 4/40* | (2006.01) |
| *H01L 29/66* | (2006.01) |
| *H01L 29/94* | (2006.01) |
| *H01G 2/06* | (2006.01) |
| *H05K 1/11* | (2006.01) |
| *H05K 1/16* | (2006.01) |
| *H05K 1/18* | (2006.01) |
| *H01L 21/66* | (2006.01) |
| *H01L 27/06* | (2006.01) |
| *H01G 4/005* | (2006.01) |
| *H01G 4/228* | (2006.01) |
| *H01G 4/232* | (2006.01) |

(52) U.S. Cl.
CPC .... *H01L 27/2409* (2013.01); *H01L 29/66189* (2013.01); *H01L 29/94* (2013.01); *H05K 1/111* (2013.01); *H05K 1/162* (2013.01); *H05K 1/18* (2013.01); *H05K 1/181* (2013.01); *H01G 4/232* (2013.01); *H01L 2224/48227* (2013.01); *H01L 2224/49175* (2013.01); *H01L 2924/0002* (2013.01); *H05K 2201/10015* (2013.01)

(56) References Cited

U.S. PATENT DOCUMENTS

| | | | | | |
|---|---|---|---|---|---|
| 5,227,655 | A | * | 7/1993 | Kayama | H01L 27/0688 257/327 |
| 5,459,684 | A | * | 10/1995 | Nakamura | G11C 11/4074 365/149 |
| 6,191,538 | B1 | | 2/2001 | Hirschmann et al. | |
| 6,320,229 | B1 | * | 11/2001 | Uchikoba | H01L 23/62 257/173 |
| 6,320,782 | B1 | * | 11/2001 | Takashima | G11C 11/22 257/E27.104 |
| 7,039,202 | B1 | * | 5/2006 | Takeuchi | H04R 19/016 330/303 |
| 8,631,562 | B2 | * | 1/2014 | Bertin | B82Y 10/00 29/622 |
| 9,117,749 | B1 | * | 8/2015 | Or-Bach | H01L 27/2436 |
| 2004/0141269 | A1 | * | 7/2004 | Kitagawa | H01L 27/0251 361/56 |
| 2004/0217441 | A1 | * | 11/2004 | Lehmann | H01L 23/5252 257/530 |
| 2005/0023575 | A1 | * | 2/2005 | Wu | H01L 25/167 257/256 |
| 2005/0168899 | A1 | * | 8/2005 | Sato | H01L 27/15 361/91.1 |
| 2006/0113971 | A1 | * | 6/2006 | Watanabe | H01L 29/7787 323/265 |
| 2006/0181828 | A1 | * | 8/2006 | Sato | H01L 27/15 361/91.1 |
| 2007/0046369 | A1 | * | 3/2007 | Schober | G06K 19/0707 330/7 |
| 2007/0274014 | A1 | * | 11/2007 | Berberich | H01L 23/642 361/91.7 |
| 2008/0151447 | A1 | * | 6/2008 | Czarnecki | G11B 33/1493 361/56 |
| 2008/0174925 | A1 | * | 7/2008 | Woo | H01L 27/0251 361/56 |
| 2009/0009100 | A1 | * | 1/2009 | Rooymans | H05B 33/0824 315/246 |
| 2009/0096386 | A1 | * | 4/2009 | Yeh | H01L 25/0753 315/294 |
| 2009/0283137 | A1 | * | 11/2009 | Croft | H01L 31/0201 136/251 |
| 2010/0043863 | A1 | * | 2/2010 | Wudu | H01L 31/0504 136/244 |
| 2010/0073032 | A1 | * | 3/2010 | Abe | H03K 5/2481 327/50 |
| 2010/0133583 | A1 | | 6/2010 | Mawatari et al. | |
| 2010/0237800 | A1 | * | 9/2010 | Kang | H05B 33/0809 315/294 |
| 2010/0289422 | A1 | * | 11/2010 | Wei | H05B 41/282 315/239 |
| 2011/0043121 | A1 | | 2/2011 | Matsuda et al. | |
| 2011/0062456 | A1 | * | 3/2011 | Chen | H01L 27/156 257/88 |
| 2011/0155575 | A1 | * | 6/2011 | Dorairaj | G01N 27/447 204/453 |
| 2011/0210678 | A1 | * | 9/2011 | Grajcar | H05B 33/0809 315/192 |
| 2011/0298424 | A1 | | 12/2011 | Yamauchi et al. | |
| 2012/0069560 | A1 | * | 3/2012 | Miskin | H05B 33/0821 362/227 |
| 2012/0160297 | A1 | * | 6/2012 | Yamakawa | H01L 31/02021 136/244 |
| 2012/0161651 | A1 | * | 6/2012 | Hon | H05B 33/0815 315/191 |
| 2013/0037827 | A1 | * | 2/2013 | Levermore | H01L 27/3202 257/88 |
| 2013/0043791 | A1 | * | 2/2013 | Stack | F21S 4/20 315/122 |
| 2013/0062773 | A1 | | 3/2013 | Chen et al. | |
| 2013/0138259 | A1 | * | 5/2013 | Yokoyama | G01R 21/00 700/298 |
| 2013/0295421 | A1 | * | 11/2013 | Teramoto | H01M 10/48 429/61 |
| 2013/0295727 | A1 | * | 11/2013 | Hsu | H01L 23/49827 438/130 |
| 2014/0027811 | A1 | | 1/2014 | Chen et al. | |
| 2014/0035056 | A1 | | 2/2014 | Liaw | |
| 2014/0042519 | A1 | | 2/2014 | Lee | |
| 2014/0070162 | A1 | | 3/2014 | Iwayama | |
| 2014/0110835 | A1 | | 4/2014 | Ong et al. | |
| 2014/0127835 | A1 | | 5/2014 | Wang et al. | |
| 2014/0268440 | A1 | * | 9/2014 | Chen | H01L 27/0248 361/56 |
| 2014/0339613 | A1 | | 11/2014 | Ide | |
| 2015/0016635 | A1 | * | 1/2015 | Haas-Christensen | H04R 3/00 381/121 |
| 2015/0022175 | A1 | | 1/2015 | Springett | |
| 2015/0022938 | A1 | | 1/2015 | Okada et al. | |
| 2015/0264766 | A1 | * | 9/2015 | Takatsu | H05B 33/0812 315/187 |
| 2015/0289326 | A1 | * | 10/2015 | Jacobs | H01L 25/167 315/250 |
| 2016/0095180 | A1 | * | 3/2016 | Miskin | H05B 33/0815 315/185 R |

FOREIGN PATENT DOCUMENTS

| | | |
|---|---|---|
| JP | H09-55625 A | 2/1997 |
| JP | H09-246093 A | 9/1997 |
| JP | H10-256083 A | 9/1998 |
| JP | 2001-076912 A | 3/2001 |
| JP | 2004-179572 A | 6/2004 |
| JP | 2009-059990 A | 3/2009 |
| WO | WO-2013-108555 A1 | 7/2013 |

* cited by examiner

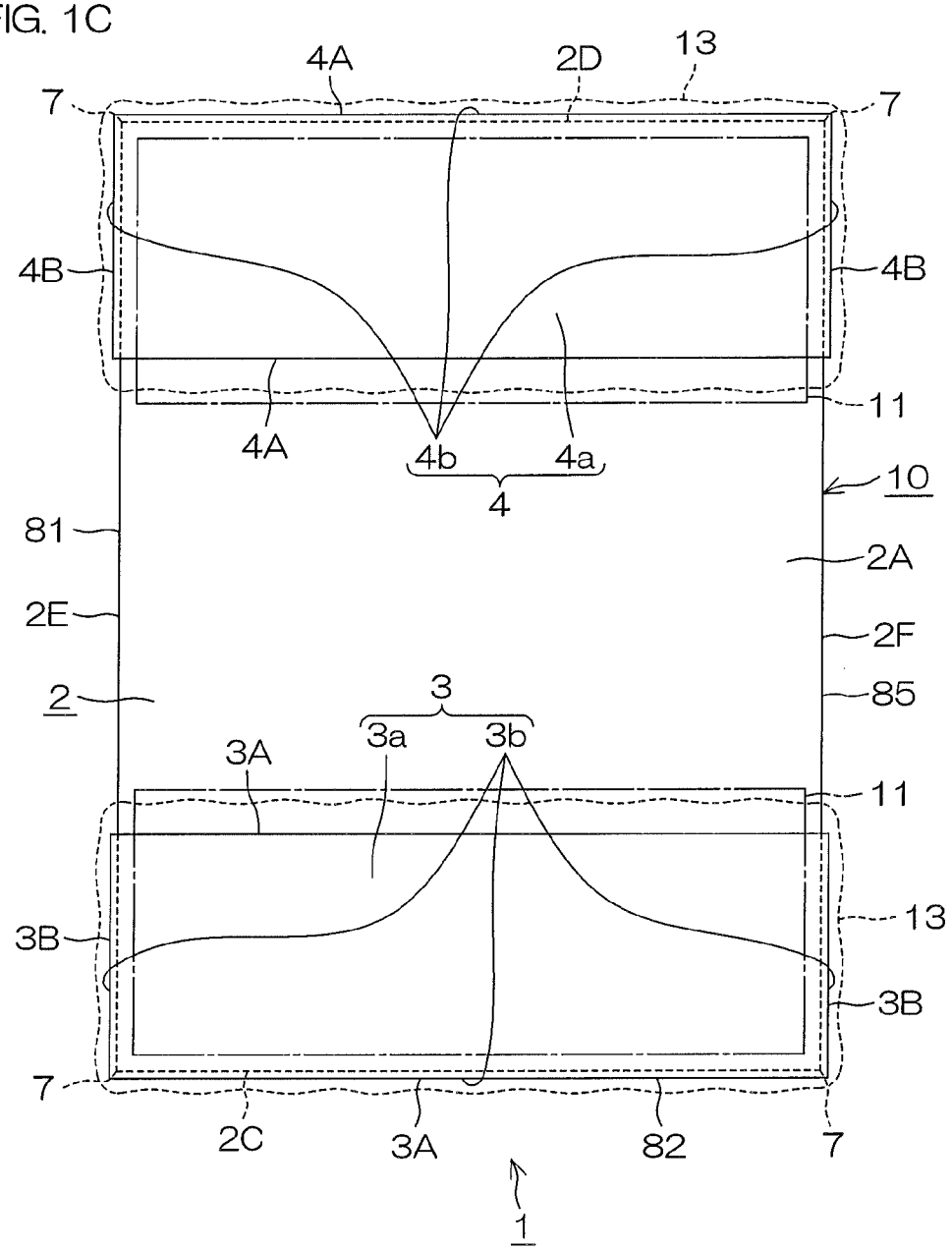

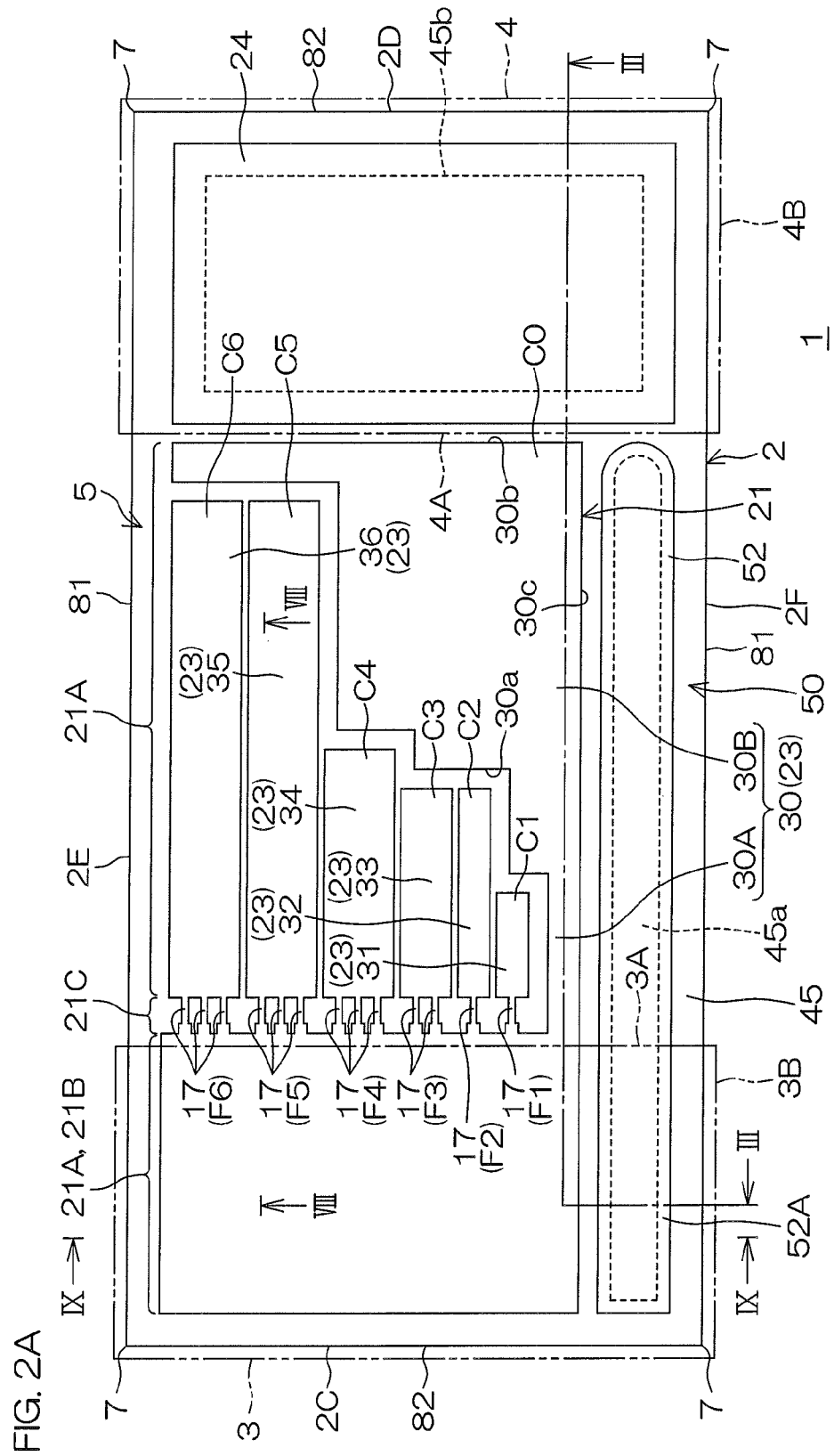

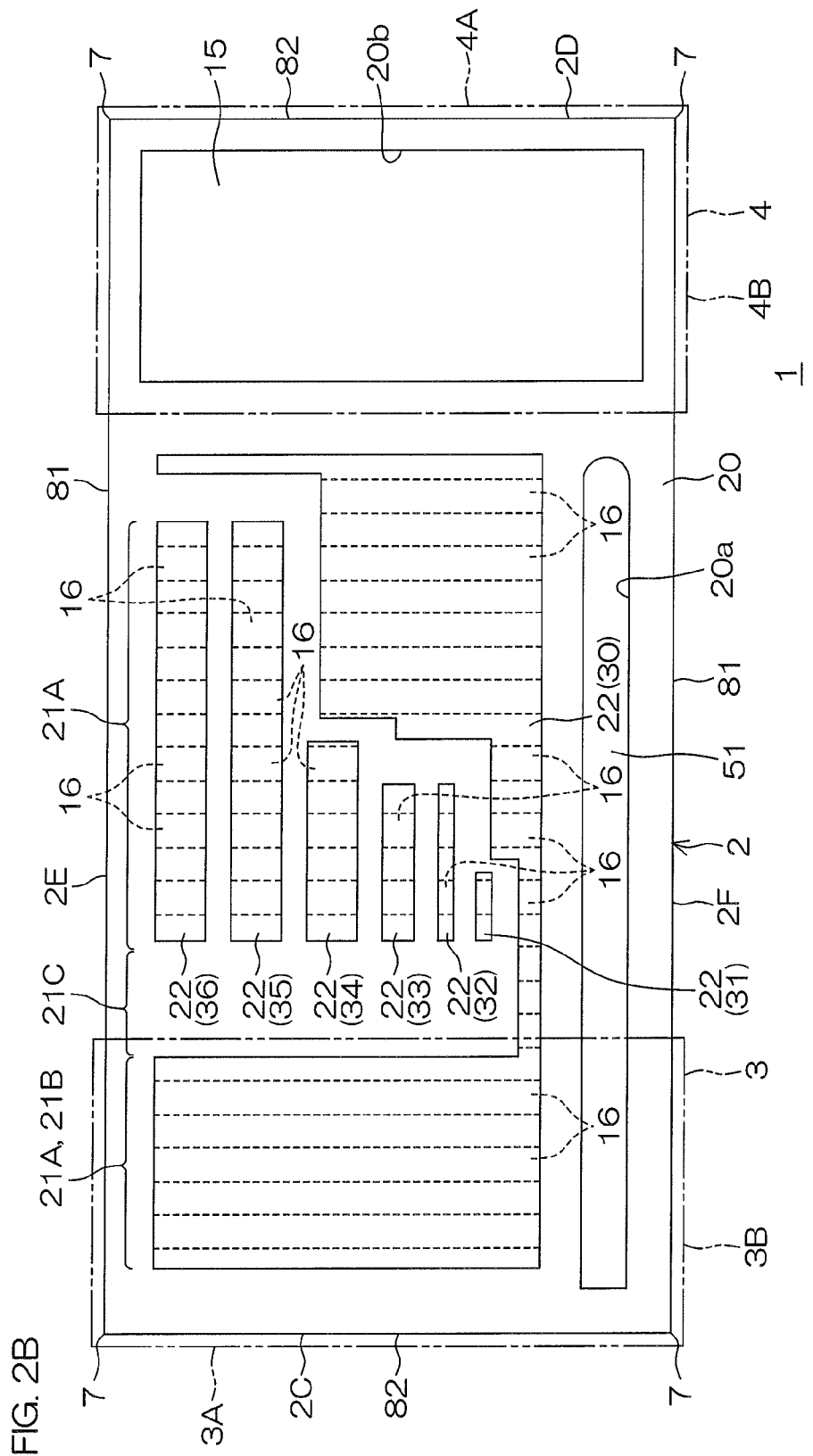

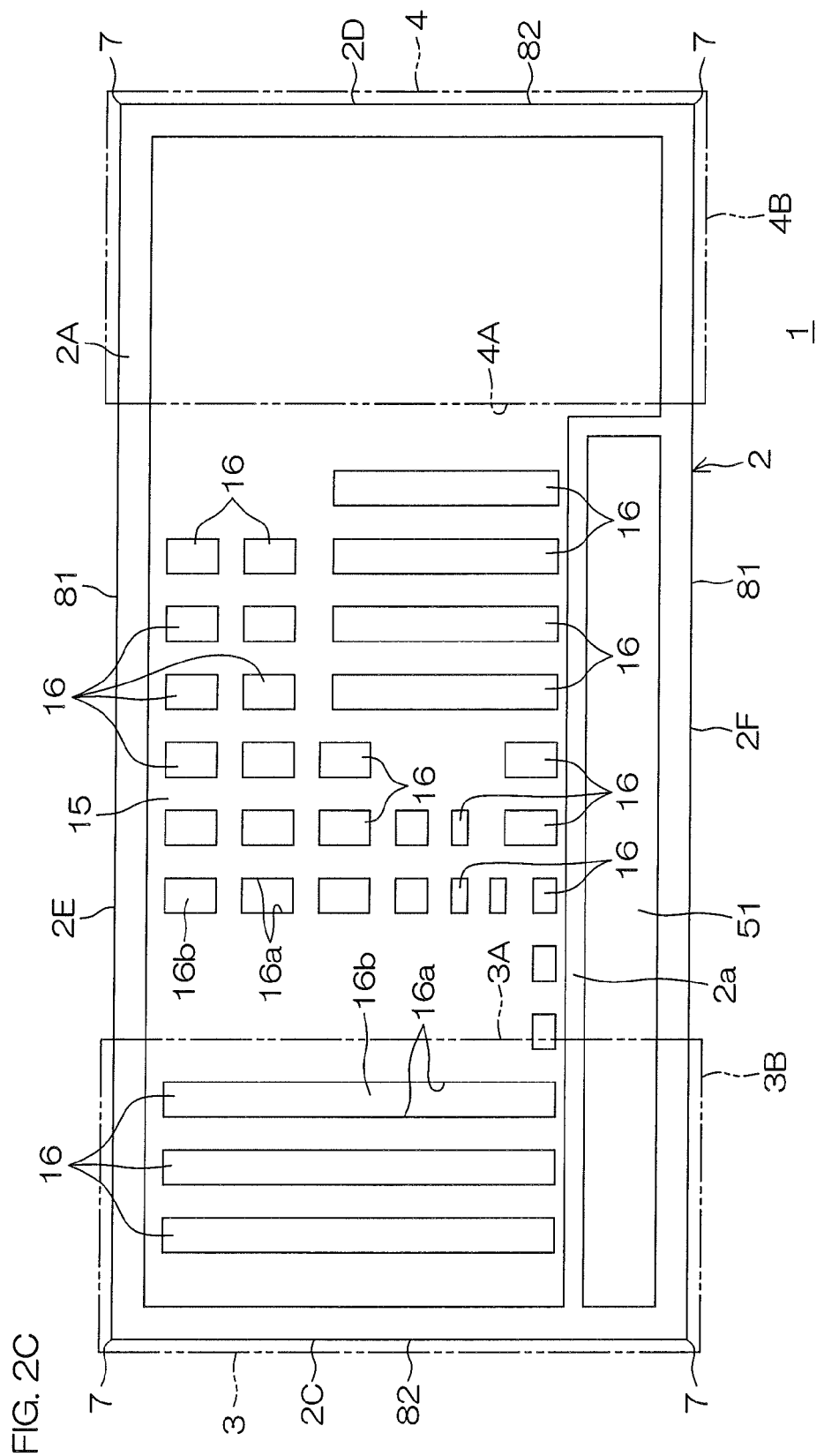

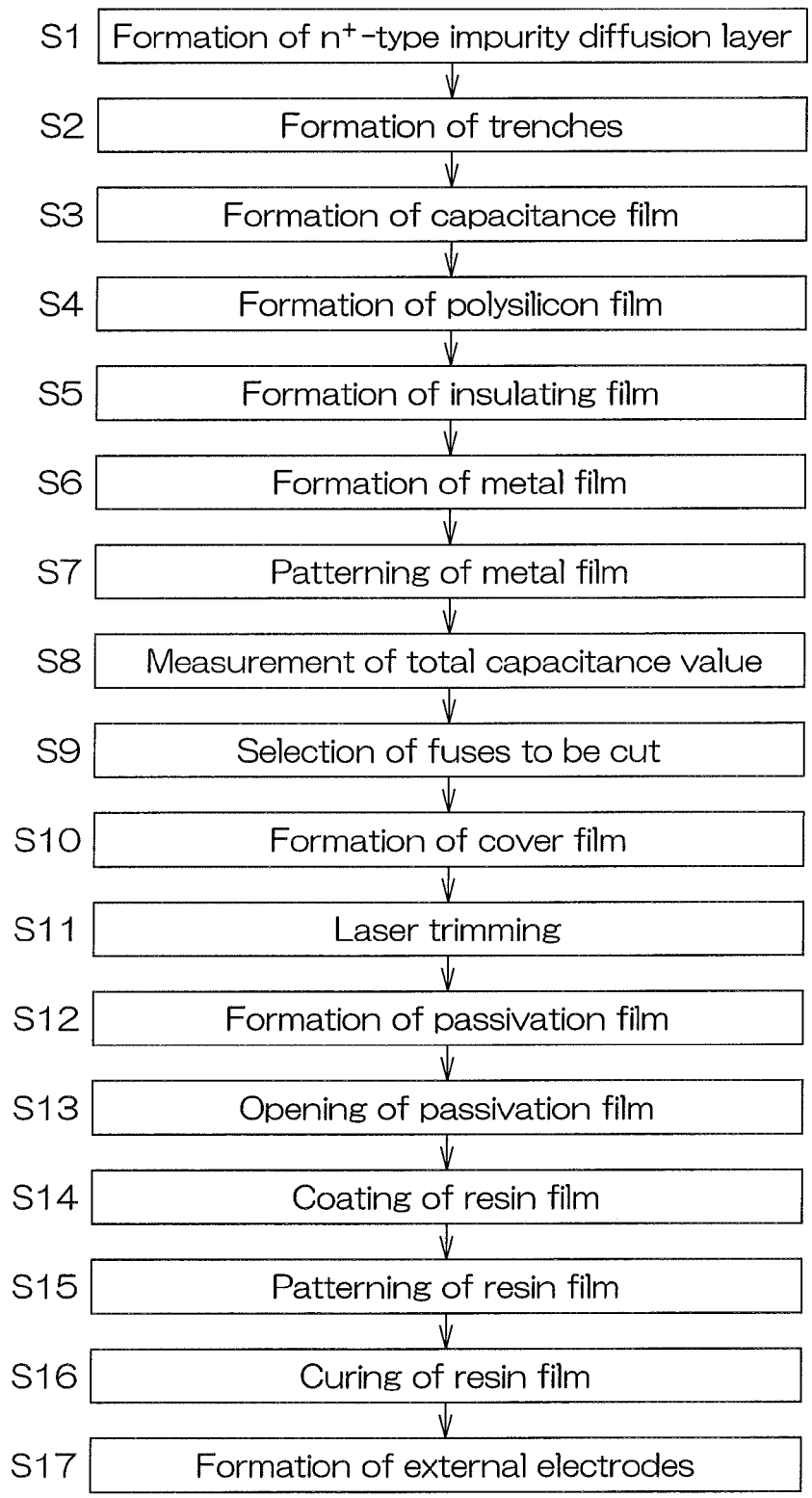

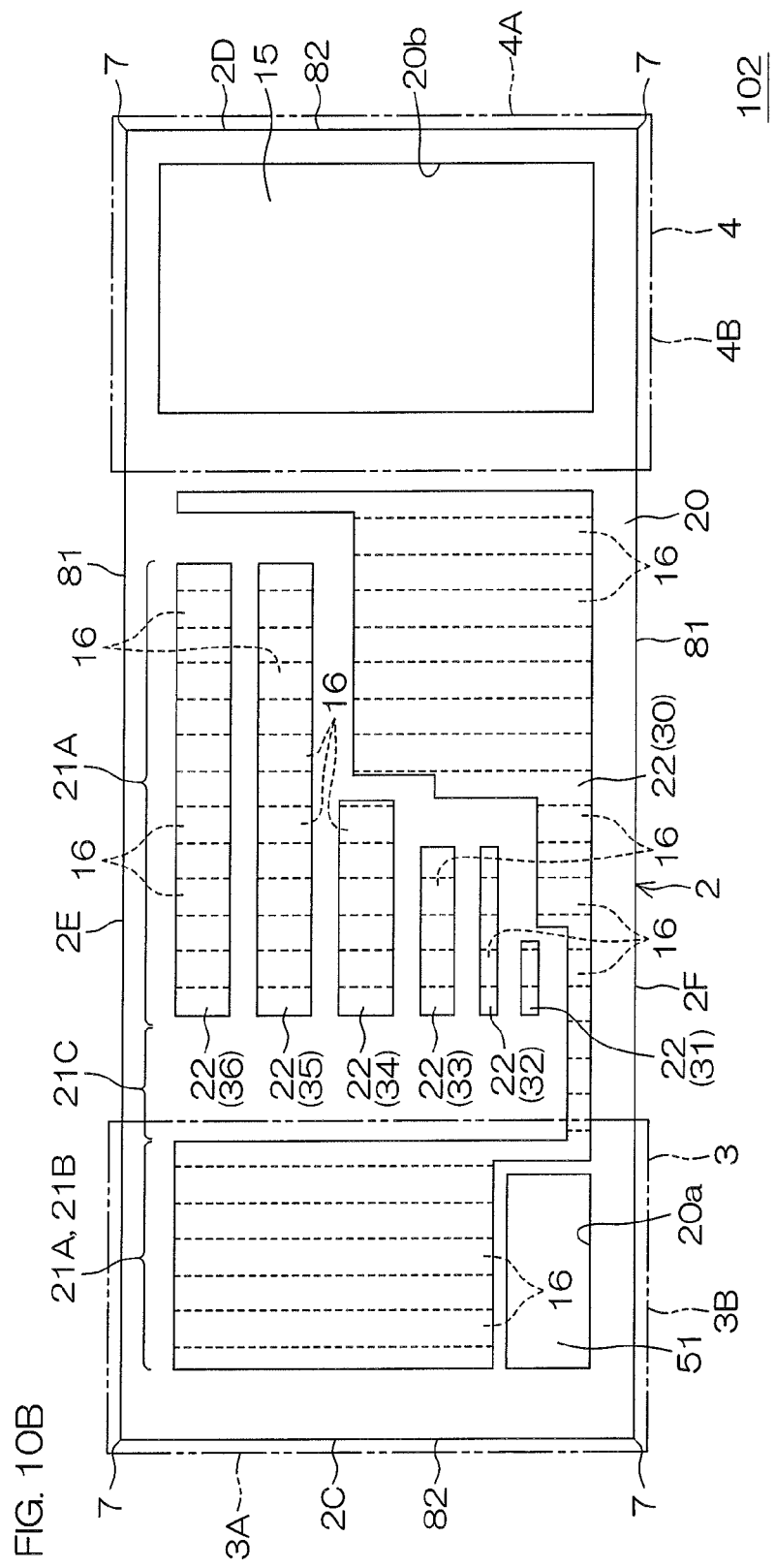

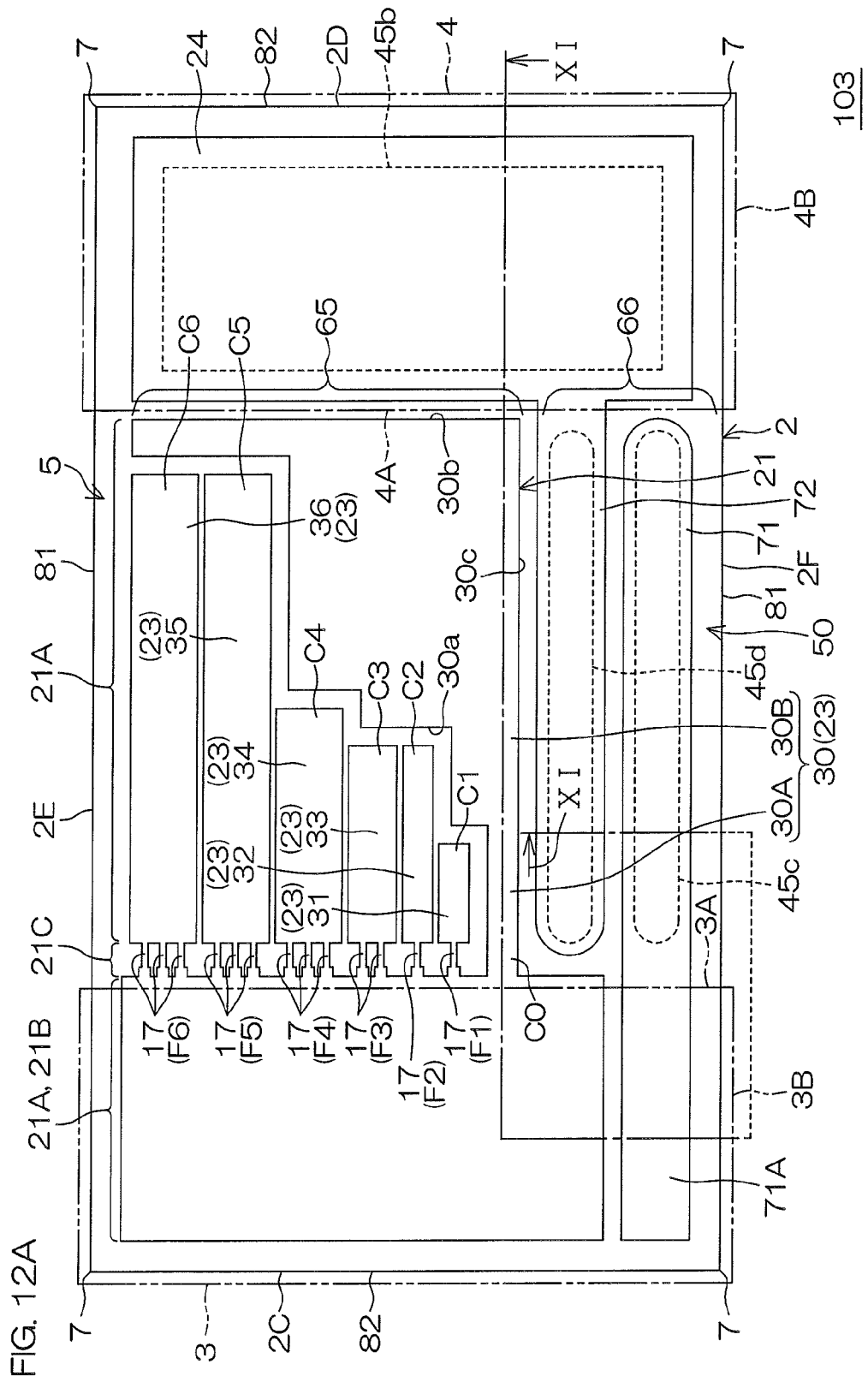

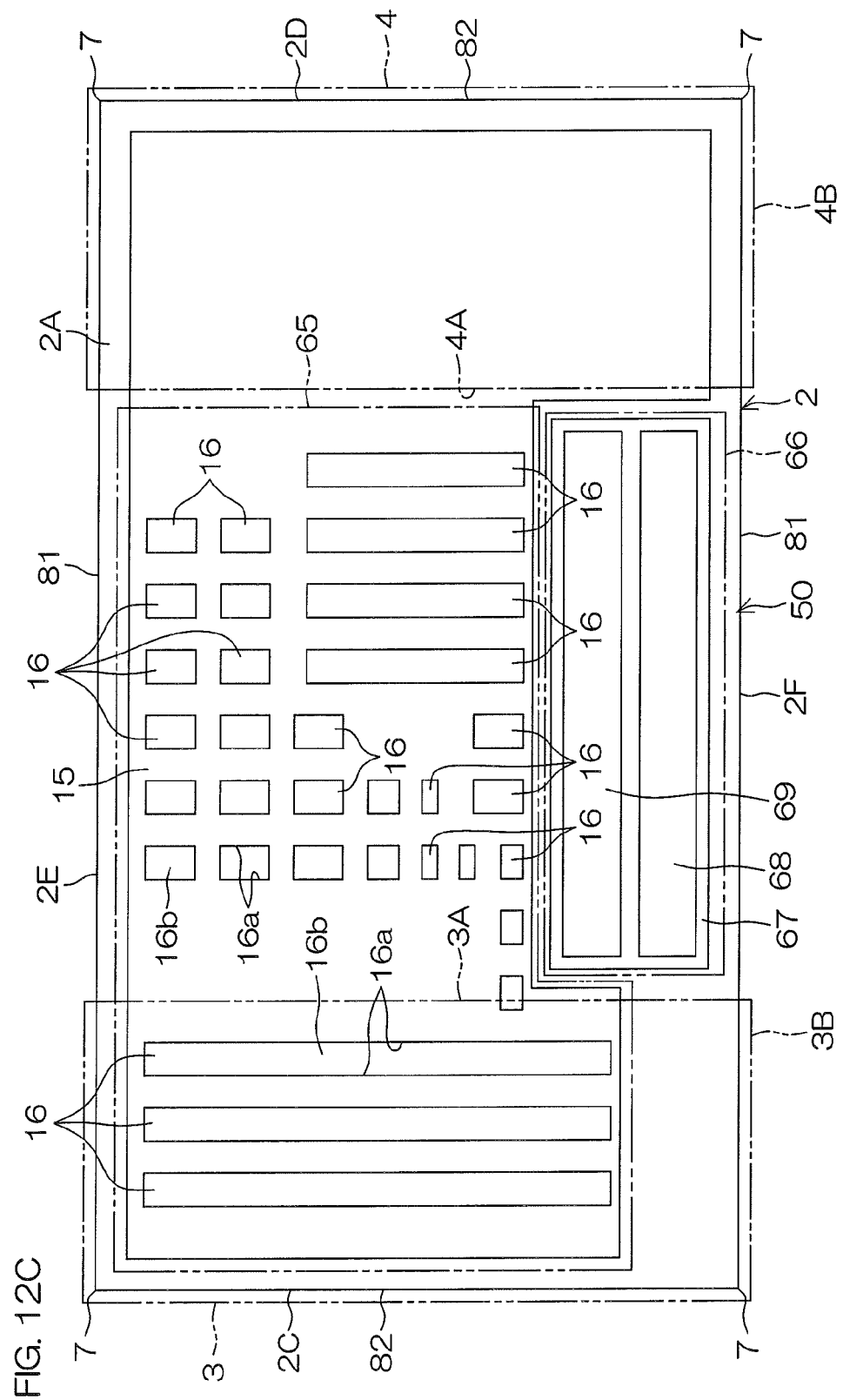

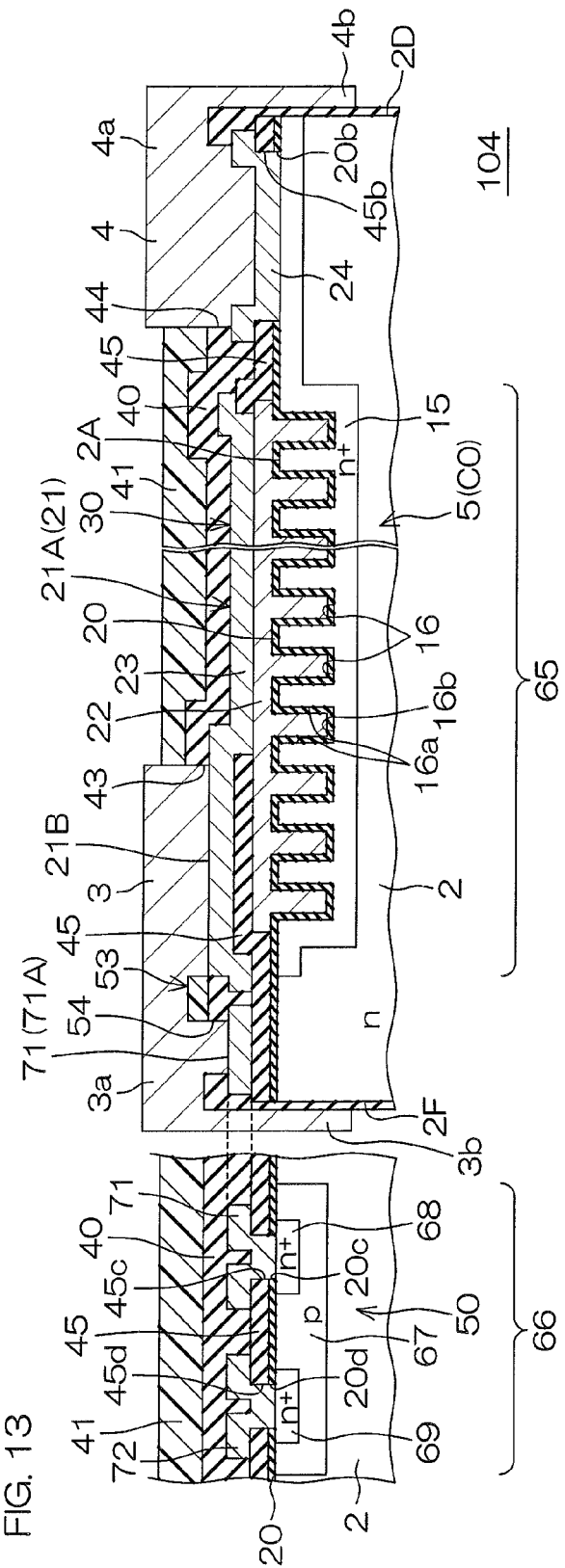

FIG. 16

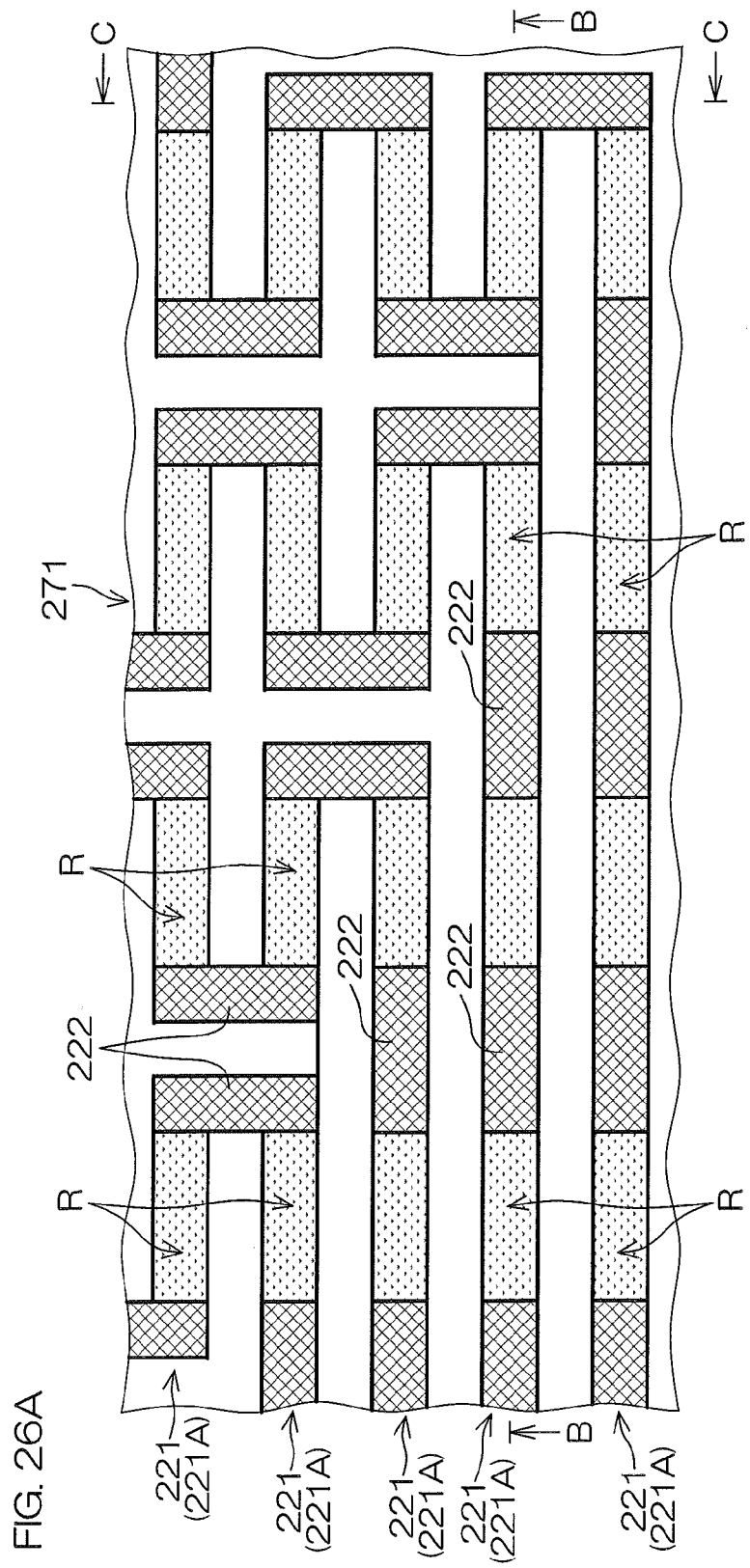

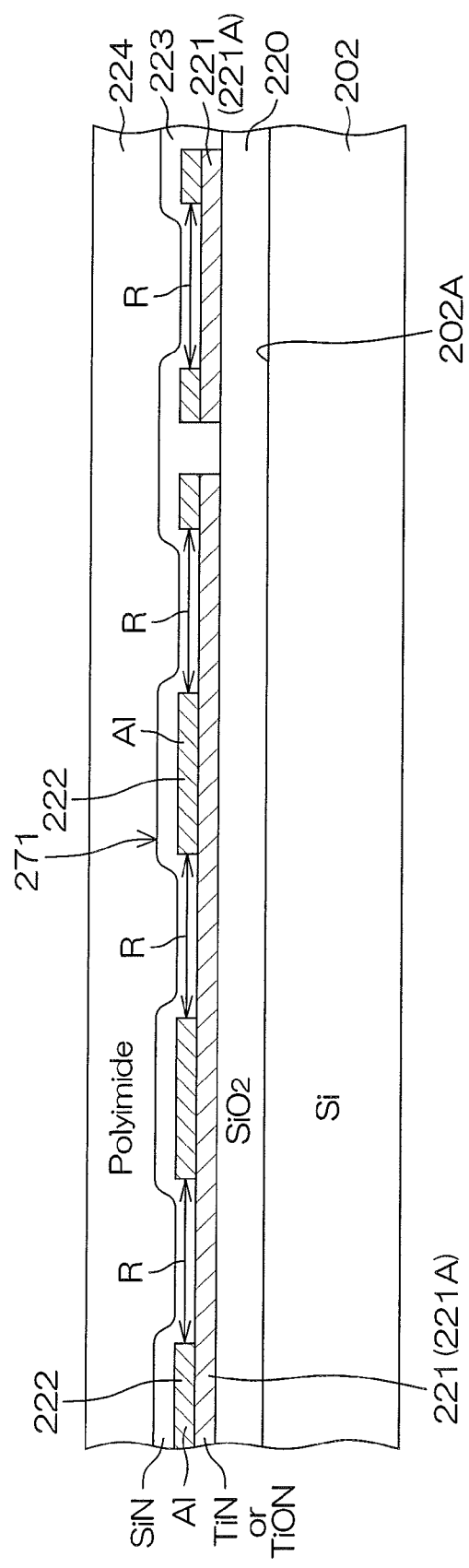

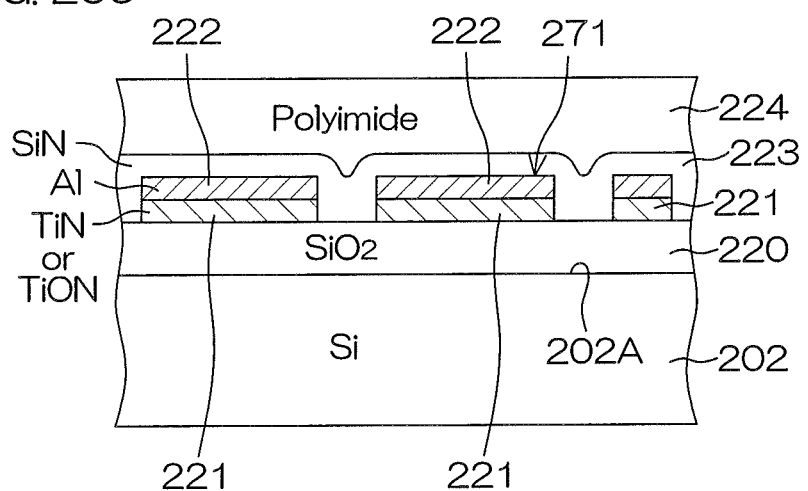

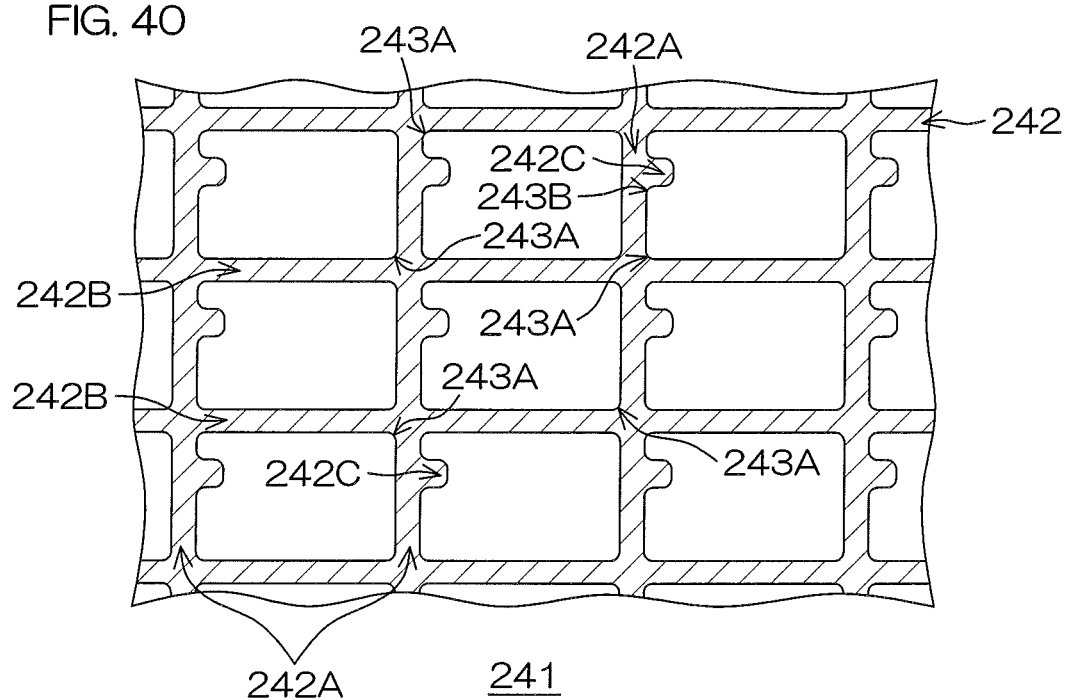

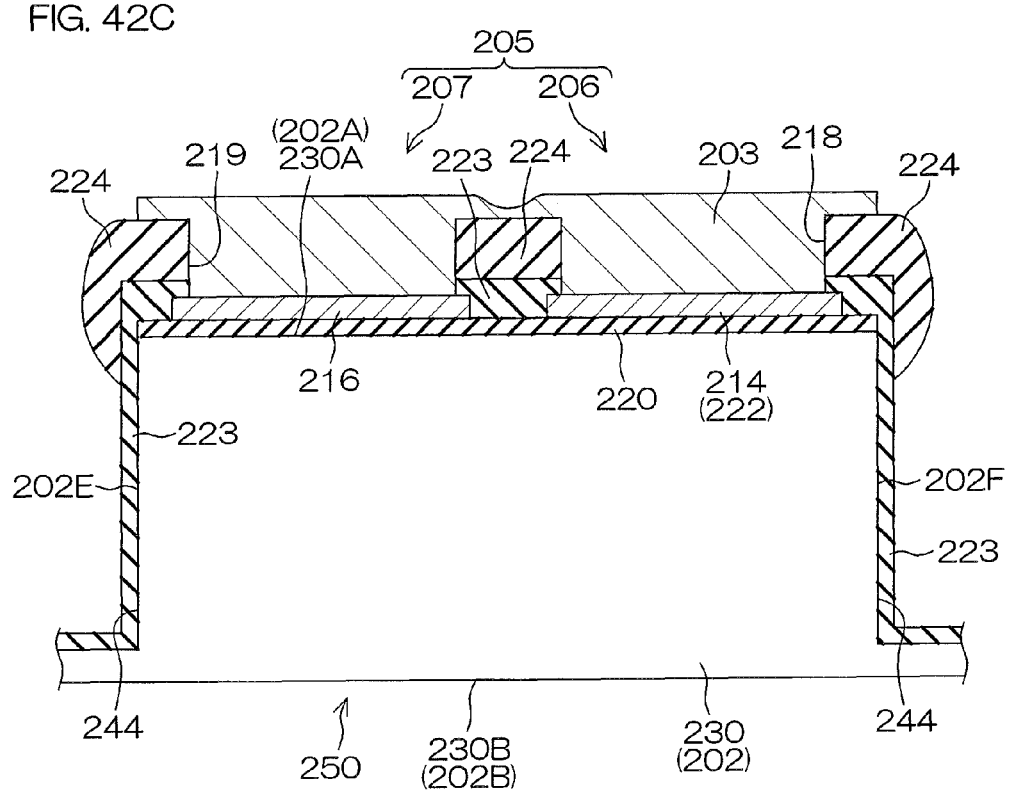

CHIP CAPACITOR, CIRCUIT ASSEMBLY, AND ELECTRONIC DEVICE

This application is a continuation of U.S. application Ser. No. 14/440,016 filed on Apr. 30, 2015, and allowed on Nov. 6, 2015, which was a National Stage Application of PCT/JP2013/078969 filed on Oct. 25, 2013, and claims the benefit of the following Japanese Patent applications, Application No. 2012-242834 filed on Nov. 2, 2012, and Application No. 2013-183157 filed on Sep. 4, 2013, the subject matters of which are incorporated herein by reference:

FIELD OF THE ART

The present invention relates to a chip capacitor. The present invention also relates to a circuit assembly that includes the chip capacitor. The present invention further relates to an electronic device having the circuit assembly that includes the chip capacitor.

BACKGROUND ART

Patent Document 1 discloses a chip capacitor including a substrate, a pair of external electrodes disposed on the substrate, a plurality of capacitor components formed on the substrate and connected between the pair of external electrodes, and a plurality of fuses respectively interposed between the plurality of capacitor components and an external electrode.

PRIOR ART DOCUMENT

Patent Document

Patent Document 1: International Publication No. 2013-108555

SUMMARY OF THE INVENTION

Problem to be Solved by the Invention

A preferred embodiment of the present invention provides a chip capacitor including a substrate, a pair of external electrodes formed on the substrate, a capacitor element connected between the pair of external electrodes, and a bidirectional diode connected between the pair of external electrodes and in parallel to the capacitor element.

With this arrangement, the chip capacitor includes a bidirectional diode in addition to the capacitor element within the chip. The capacitor element is connected between the pair of external electrodes. The bidirectional diode is connected between the pair of external electrodes and in parallel to the capacitor element. When a surge current due to an electrostatic discharge, etc., is input into an external electrode, the bidirectional diode becomes conductive. The surge current is thereby made to bypass the capacitor element and flow through the bidirectional diode to enable the capacitor element to be protected from electrostatic breakdown. A chip capacitor of high electrostatic breakdown tolerance can thereby be provided.

With the preferred embodiment of the present invention, the substrate is a semiconductor substrate and the bidirectional diode includes an impurity diffusion layer formed in the semiconductor substrate. With this arrangement, the bidirectional diode can be formed inside the substrate of the chip capacitor to enable the capacitor element and the bidirectional diode to be included within a single chip and the electrostatic breakdown tolerance to be improved.

With the preferred embodiment of the present invention, the capacitor element includes a lower electrode constituted of an impurity diffusion layer formed inside the semiconductor substrate. With this arrangement, the impurity diffusion layer inside the semiconductor substrate can be used as the lower electrode to arrange a chip capacitor that is improved in electrostatic breakdown tolerance.

With the preferred embodiment of the present invention, the substrate is a semiconductor substrate, the capacitor element includes a lower electrode constituted of an impurity diffusion layer formed inside the semiconductor substrate, and the bidirectional diode includes an impurity diffusion layer continuous to the impurity diffusion layer constituting the lower electrode.

With this arrangement, both the capacitor element and the bidirectional diode are arranged using impurity diffusion layers inside the semiconductor substrate. The impurity diffusion layers for the capacitor element and the bidirectional diode can thus be prepared by a process in common and a manufacturing process can thereby be simplified. Also, the impurity diffusion layer continuous to the impurity diffusion layer constituting the lower electrode of the capacitor element constitutes the bidirectional diode and therefore there is no need to provide a separate wiring for connecting the bidirectional diode and the lower electrode. The manufacturing process can be simplified by this aspect as well. Moreover, wiring space can be omitted to enable the chip capacitor to be made compact in size and the capacitor element to be increased in capacitance. A chip capacitor of improved electrostatic breakdown tolerance can thus be provided while relaxing restrictions related to the manufacturing process, size, capacitance, etc.

For example, when a pair of impurity diffusion layers of a second conductivity type are formed across an interval in a semiconductor substrate of a first conductivity type, pn junction diodes are formed at the respective boundary portions of the pair of impurity diffusion layers and these are serially connected in opposite directions via the semiconductor substrate to constitute a bidirectional diode.

By using one of the pair of impurity diffusion layers as a lower electrode of a capacitor element, wiring for connecting the bidirectional diode and the lower electrode can be omitted.

With the preferred embodiment of the present invention, the bidirectional diode includes a portion formed in a region directly below the external electrodes. With this arrangement, the region directly below the external electrodes can be used to arrange the bidirectional diode and therefore effective use can be made of the region on the substrate. A chip capacitor of high electrostatic breakdown tolerance that is advantageous for realizing compact size and high capacitance can thereby be provided.

With the preferred embodiment of the present invention, the entirety of the bidirectional diode is formed in a region directly below the external electrodes. With this arrangement, the entirety of the bidirectional diode is formed in the region directly below the external electrodes and therefore a chip capacitor of high electrostatic breakdown tolerance that is advantageous for realizing compact size and high capacitance can thereby be provided.

With the preferred embodiment of the present invention, the bidirectional diode includes a polysilicon film formed on the substrate. With this arrangement, the bidirectional diode is arranged using the polysilicon film formed on the substrate. Therefore there is no need for the material of the substrate to be a semiconductor. That is, a chip capacitor using a substrate of a material besides a semiconductor can also be improved in electrostatic breakdown tolerance.

The preferred embodiment of the present invention further includes a first pad portion connected to the capacitor element and a second pad portion connected to the bidirectional diode, and one of the pair of external electrodes is formed to extend across the first pad portion and the second pad portion to electrically connect the first pad portion and the second pad portion.

With this arrangement, the first and second pad portions respectively connected to the capacitor element and the bidirectional diode are provided and the external electrode is formed to extend across the two pad portions. That is, the first and second pad portions are electrically connected to each other by the external electrode. The first and second pad portions are separated from each other and, before the external electrode is formed, are electrically disconnected. Therefore in the manufacturing process, the capacitance of the capacitor element can be measured using the first pad portion before the external electrode is formed. At this point, the bidirectional diode is not electrically connected to the first pad portion and the capacitance of the capacitor element can thus be measured with the exclusion of influences of the bidirectional diode. A chip capacitor of high electrostatic breakdown tolerance can thus be provided without inhibiting accurate measurement of the capacitor element capacitance in the manufacturing process.

The preferred embodiment of the present invention further includes an insulating layer disposed between the first pad portion and the second pad portion and separating the first pad portion and the second pad portion, and the external electrode extends across the insulating layer to be joined to both the first pad portion and the second pad portion. With this arrangement, the external electrode extends across the insulating layer, which separates the first pad portion and the second pad portion, and is joined to both pad portions and therefore a structure in which the capacitor element and the bidirectional diode are connected in parallel to the external electrode can be formed reliably.

With the preferred embodiment of the present invention, each external electrode is formed to extend across a front surface and a side surface of the substrate and integrally has a front surface portion covering the front surface and a side surface portion covering the side surface.

Also, a preferred embodiment of the present invention provides a chip capacitor including a substrate, a pair of external electrodes formed on the substrate, and a capacitor element connected between the pair of external electrodes, where each external electrode is formed to extend across a front surface and a side surface of the substrate and integrally has a front surface portion covering the front surface and a side surface portion covering the side surface.

With these arrangements, each external electrode not only has a front surface portion that covers the front surface of the substrate but also has a side surface portion covering the side surface (at least one side surface) of the substrate and is formed integrally so as to extend across the front surface and the side surface of the substrate. An adhesion area across which the external electrode contacts solder when the chip capacitor is soldered onto a mounting substrate can thereby be increased. The solder can thereby be increased in adsorption amount to improve adhesion strength. Also, the solder is adsorbed so as to extend from the front surface of the chip capacitor (front surface of the substrate) to the side surface and the chip capacitor can thus be held from the respective directions of the front surface and the side surface of the substrate in a mounted state. The mounted state of the chip capacitor can thus be stabilized.

If the substrate is a semiconductor substrate, an insulating film is preferably interposed between the external electrode and the side surface of the substrate. The state of insulation of the external electrode and the substrate can thereby be maintained.

With the preferred embodiment of the present invention, the substrate is rectangular in a plan view and each external electrode is formed so as to cover front surface edge portions of three side surfaces of the substrate. With this arrangement, the chip capacitor can be held from the three directions of the side surfaces of the substrate in the state where the chip capacitor is mounted on the mounting substrate. The mounted state of the chip capacitor can thereby be stabilized further.

With the preferred embodiment of the present invention, the capacitor element includes a lower electrode that is formed on the substrate or inside the substrate and connected to one of the pair of external electrodes, a capacitance film that is laminated on the lower electrode, and an upper electrode that is laminated on the capacitance film, faces the lower electrode across the capacitance film, and connected to the other of the pair of external electrodes.

With this arrangement, the capacitor element is arranged from the lower electrode formed on the substrate or inside the substrate, the capacitance film laminated thereon, and the upper electrode laminated thereon and facing the lower electrode. The chip capacitor is arranged by respectively connecting the lower electrode and the upper electrode to the pair of external electrodes.

With the preferred embodiment of the present invention, a trench having a side wall surface intersecting a major surface of the substrate is formed on the substrate and the capacitance film is formed along the side wall surface of the trench. With this arrangement, the trench having the side wall surface that intersects the major surface of the substrate is formed and the capacitance film is formed along the substrate. A facing area over which the upper electrode and the lower electrode face each other across the capacitance film can thereby be increased to enable the capacitor element to be made high in capacitance. The chip capacitor can thereby be made compact in size or high in capacitance.

The trench may have a bottom wall surface continuous to a bottom portion of the side wall surface. Also preferably, a plurality of the trenches are formed (for example, formed periodically) on the substrate and the capacitor element can thereby be made even higher in capacitance.

Obviously, the major surface of the substrate can be made a flat surface to arrange a chip capacitor having a planar type capacitor element having a flat capacitance film.

With the preferred embodiment of the present invention, the upper electrode includes a polysilicon film embedded in the trench. With this arrangement, the upper electrode includes the polysilicon film and the polysilicon film is embedded inside the trench. Polysilicon can be embedded with good embedding property inside a fine trench. Therefore multiple fine trenches of large aspect ratio (ratio of trench opening width to trench depth) can be formed on the major surface of the substrate and the polysilicon film can be adhered closely to the capacitance film. The capacitor element can thereby be made even higher in capacitance.

The polysilicon film is preferably a polysilicon film that has been subject to a conductivity rendering treatment and, for example, is preferably a polysilicon layer that has been made low in resistance by diffusion of an impurity.

Preferably, the upper electrode further includes a metal film that is laminated on the polysilicon film. The entire upper electrode can thereby be made low in resistivity to enable reduction of the equivalent series resistance of the chip capacitor and improvement of the characteristics.

With the preferred embodiment of the present invention, the capacitor element includes a plurality of capacitor components and further includes a plurality of fuses provided on the substrate and disconnectably connecting each of the plurality of the capacitor components to the external electrode. With this arrangement, one or a plurality of the capacitor components can be disconnected selectively from the external electrode by selectively cutting one or a plurality of the fuses. A plurality of types of capacitance values can thereby be accommodated easily and rapidly. In other words, chip capacitors of various capacitance values can be realized with a common design by combining a plurality of capacitor components.

The plurality of capacitor components preferably include a plurality of capacitor components that differ in capacitance value. Even more capacitance values can thereby be obtained by selective cutting of the fuses and even more types of capacitance values can be realized with chip capacitors with a common design.

The fuses may be interposed between the lower electrode and the corresponding external electrode or may be interposed between the upper electrode and the corresponding external electrode. If the upper electrode is constituted of the laminated film that includes the polysilicon film and the metal film, the fuses may be formed at the same layer as the metal film.

With the preferred embodiment of the present invention, the capacitor element includes a plurality of capacitor components connected in parallel between the pair of external electrodes, the plurality of capacitor components include a basic capacitance element and a plurality of adjusting capacitance elements, and the plurality of adjusting capacitance elements are respectively connected to the external electrodes via a plurality of fuses.

With this arrangement, the plurality of adjusting capacitance elements are respectively connected to the external electrodes via the plurality of fuses and therefore one or a plurality of the adjusting capacitance elements can be disconnected selectively from the external electrode by selectively cutting the fuses. The overall capacitance of the chip capacitor is thereby determined by the capacitance of the basic capacitance element and the capacitances of the adjusting capacitance elements connected via the fuses to the external electrode. The basic capacitance element may be connected to the external electrode without being connected via a fuse.

For example, the capacitance value across the upper electrode and the lower electrode may be measured in a state where none of the fuses is cut and the fuses to be cut (that is, the adjusting capacitance element to be disconnected) may be selected to adjust to a desired capacitance value in accordance with the measurement result. By then cutting the selected fuses, a chip capacitor that is adjusted to the desired capacitance value at high precision can be obtained.

With the preferred embodiment of the present invention, the plurality of adjusting capacitance elements have mutually parallel strip shapes, have one ends thereof aligned at a side of one of the pair of external electrodes, and are lined up in order of length, and the basic capacitance element includes a connection portion, disposed adjacent to an adjusting capacitance element of shortest length among the plurality of adjusting capacitance elements and connected to the one external electrode, and a main portion, formed integral to the connection portion and so as to avoid the plurality of adjusting capacitance elements and widening as the other of the pair of external electrodes is approached.

With this arrangement, the strip-shaped adjusting capacitance elements that are mutually parallel are lined up in the order of length with one ends thereof aligned at the side of one of the pair of external electrodes. On the other hand, the basic capacitance element has the connection portion to the external electrode disposed adjacent to the shortest adjusting capacitance element and the main portion disposed in a space in which the adjusting capacitance elements are not disposed. In accordance with the shape of the space in which the adjusting capacitance elements are not disposed, the main portion widens with distance away from the connection portion. The adjusting capacitance elements and the basic capacitance element can thereby be disposed while making efficient use of a limited region on the substrate. A chip capacitor of compact size and high capacitance can thereby be realized.

An arrangement in which the connection portion is disposed adjacent to the longest adjusting capacitance element may also be considered. However, with this arrangement, the connection portion must extend around the long adjusting capacitance element to reach the main portion disposed in the available space in which the plurality of adjusting capacitance elements are not disposed. The connection portion is thus made long in length and the equivalent series resistance of the chip capacitor may thus increase. By disposing the connection portion adjacent to the shortest adjusting capacitance element, this problem can be avoided to provide a chip capacitor with excellent characteristics.

With the arrangement that includes the bidirectional diode, a wiring pattern, disposed adjacent to the basic capacitor element and connecting the bidirectional diode to the external electrode at the opposite side with respect to the adjusting capacitance elements may be formed on the substrate.

Also, the chip capacitor may include a resistor element connected between the pair of external electrodes and in parallel to the capacitor element.

A preferred embodiment of the present invention provides a circuit assembly including the chip capacitor with the characteristics described above and a mounting substrate having lands, soldered to the external electrodes, on a mounting surface facing a front surface of the substrate.

With the preferred embodiment of the present invention, the chip capacitor has the external electrodes, each having the front surface portion and the side surface portion integrally, and the solder is formed to cover the front surface portion and the side surface portion of each external electrode. A circuit assembly of high reliability can thereby be provided.

A preferred embodiment of the present invention provides an electronic device including the circuit assembly described above and a casing that houses the circuit assembly.

BRIEF DESCRIPTION OF THE DRAWINGS

FIG. 1C is a schematic plan view (bottom view of the arrangement of FIG. 1B) of the chip capacitor in the state of being mounted on the mounting substrate as viewed from the element forming surface side.

FIG. 2A is a plan view for describing the internal arrangement of the chip capacitor.

FIG. 2B is a plan view for describing the internal arrangement of the chip capacitor.

FIG. 2C is a plan view for describing the internal arrangement of the chip capacitor.

FIG. 7 is a flow diagram for describing an example of a manufacturing process of the chip capacitor.

FIG. 10B is a plan view for describing the internal arrangement of the chip capacitor according to the second preferred embodiment.

FIG. 12A, FIG. 12B, and FIG. 12C are plan views for describing the internal arrangement of the chip capacitor according to the third preferred embodiment.

FIG. 12B is a plan view for describing the internal arrangement of the chip capacitor according to the third preferred embodiment.

FIG. 12C is a plan view for describing the internal arrangement of the chip capacitor according to the third preferred embodiment.

FIG. 13 is a sectional view for describing the arrangement of a chip capacitor according to a fourth preferred embodiment of the present invention.

FIG. 16 is a sectional view for describing the arrangement of a chip capacitor according to a seventh preferred embodiment of the present invention.

FIG. 26A is a partially enlarged plan view of the resistor portion.

FIG. 26B is a vertical sectional view in the length direction taken along B-B in FIG. 26A for describing the arrangement of resistor bodies in the resistor portion.

FIG. 26C is a vertical sectional view in the width direction taken along C-C in FIG. 26A for describing the arrangement of the resistor bodies in the resistor portion.

FIG. 40 is a schematic plan view of a portion of a resist pattern used for forming a groove in a semiconductor wafer.

FIG. 42C is a diagram of a step subsequent to that of FIG. 42B.

MODES FOR CARRYING OUT THE INVENTION

Preferred Embodiments of the Invention

Preferred embodiments of the present invention shall now be described in detail with reference to the attached drawings.

Figure 1A:
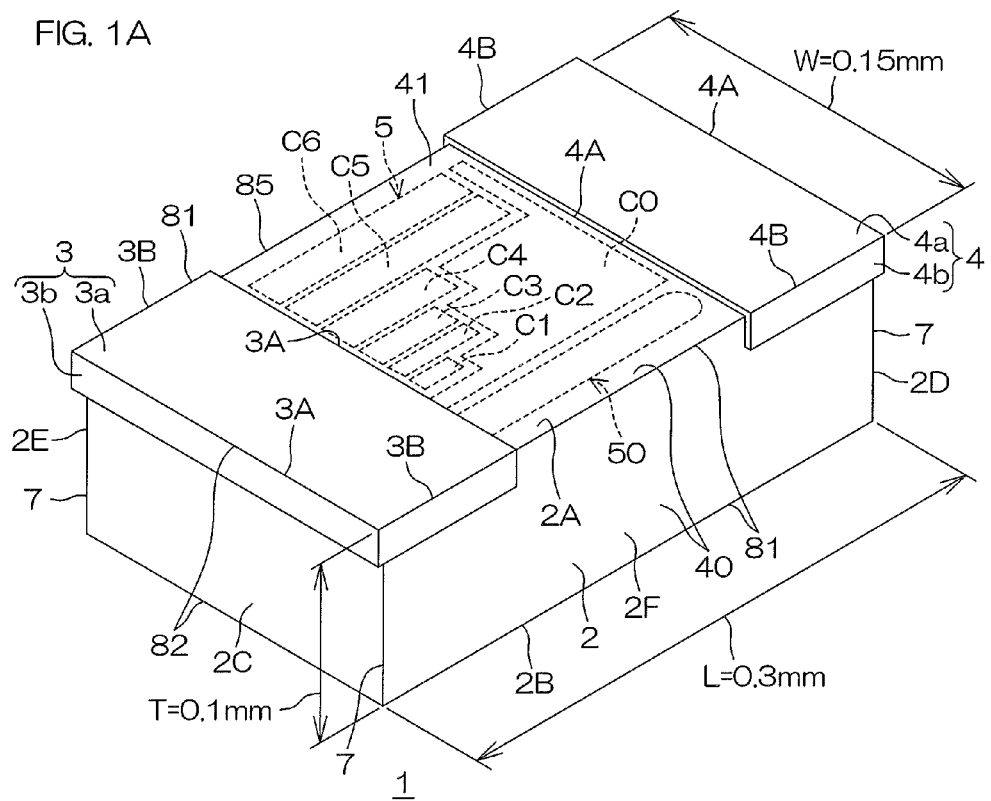
FIG. 1A is schematic perspective view of a chip capacitor according to a preferred embodiment of the present invention.

FIG. 1A is a schematic perspective view of a chip capacitor 1 according to a preferred embodiment of the present invention. The chip capacitor 1 is a minute chip part and is a rectangle with the two orthogonal sides (long side 81 and short side 82) being not more than 0.4 mm and not more than 0.2 mm, respectively. More specifically, a length L (length of the long side 81) may be approximately 0.3 mm, a width W (length of the short side 82) may be approximately 0.15 mm, and a thickness T may be approximately 0.1 mm. Obviously, these numerical values are an example and the shape in a plan view may be a rectangular shape of 0.4 mm×0.2 mm or 0.2 mm×0.1 mm, etc.

In manufacturing the chip capacitor 1, multiple chip capacitors are formed in a lattice on a semiconductor wafer (semiconductor substrate, for example, a silicon wafer) and thereafter chip splitting grooves are formed in the wafer. Further, the wafer is polished from a rear surface until the chip splitting grooves are reached. The wafer is thereby split into a plurality of the chip capacitors 1. Instead of polishing the wafer from the rear surface, bottom portions of the chip splitting grooves may be diced to perform splitting into the individual chip capacitors 1.

The chip capacitor 1 mainly includes a substrate 2 that constitutes a main body portion thereof, a first external electrode 3 and a second external electrode 4 as external connections electrodes, a capacitor element 5 connected to the exterior by the first external electrode 3 and the second external electrode 4, and a bidirectional diode 50 connected between the first external electrode 3 and the second external electrode 4 and in parallel to the capacitor element 5. In the present preferred embodiment, the substrate 2 is a semiconductor substrate, such as a silicon substrate, etc.

The substrate 2 that constitutes the main body portion of the chip capacitor 1 has a substantially rectangular parallelepiped chip shape. The surface of the substrate 2 constituting the upper surface in the orientation shown in FIG. 1A is an element forming surface 2A. The element forming surface 2A is the surface of the substrate 2 on which the capacitor element 5 is formed and has a substantially oblong shape. The surface at the opposite side of the element forming surface 2A in the thickness direction of the substrate 2 is a rear surface 2B. The element forming surface 2A and the rear surface 2B are substantially the same in dimensions and same in shape and are parallel to each other. A pair of each of long sides 81 and short sides 82 at the element forming surface 2A form a front surface peripheral edge 85 of rectangular shape.

In addition to the element forming surface 2A and the rear surface 2B, the substrate 2 has a plurality of side surfaces 2C, 2D, 2E, and 2F. The plurality of side surfaces 2C, 2D, 2E, and 2F respectively intersect (specifically, are orthogonal to) the element forming surface 2A and extend to the rear surface 2B and join the element forming surface 2A and the rear surface 2B.

The side surface 2C is formed between the short sides 82 at one side in the long direction (the front side in FIG. 1A) of the element forming surface 2A and the rear surface 2B, and the side surface 2D is formed between the short sides 82 at the other side in the long direction (the inner right side in FIG. 1A) of the element forming surface 2A and the rear surface 2B. The side surfaces 2C and 2D are the respective end surfaces of the substrate 2 in the long direction. The side surface 2E is formed between the long sides 81 at one side in the short direction (the inner left side in FIG. 1A) of the element forming surface 2A and the rear surface 2B, and the side surface 2F is formed between the long sides 81 at the other side in the short direction (the front right side in FIG. 1A) of the element forming surface 2A and the rear surface 2B. The side surfaces 2E and 2F are the respective end surfaces of the substrate 2 in the short direction. The side surfaces 2C and 2D intersect (specifically, are orthogonal to) the side surfaces 2E and 2F, and the side surfaces 2C, 2D, 2E, and 2F are all orthogonal to the element forming surface 2A and the rear surface 2B. In other words, mutually adjacent surfaces among the element forming surface 2A, rear surface 2B, and side surfaces 2C to 2F are orthogonal. However, each of ridgeline portions respectively formed by intersection of the mutually adjacent side surfaces 2C and 2F, 2F and 2D, 2D and 2E, and 2E and 2C may be chamfered by a flat surface or a curved surface.

Substantially the entireties of the respective surfaces of the element forming surface 2A and the side surfaces 2C to 2F are covered by a passivation film 40. Therefore to be exact, the element forming surface 2A and the side surfaces 2C to 2F are positioned at the inner sides of the passivation film 40 and are not exposed to the exterior. The chip capacitor 1 further has a resin film 41 that covers the passivation film 40. The resin film 41 covers the entirety (the front surface peripheral edge 85 and a region at the inner side thereof) of the passivation film 40 on the element forming surface 2A.

Each of the first external electrode 3 and the second external electrode 4 is arranged by laminating, for example, Ni (nickel), Pd (palladium), and Au (gold) in that order on the element forming surface 2A. Each of the first external electrode 3 and the second external electrode 4 is formed to extend across the element forming surface 2A and the side surfaces 2C to 2F so as to cover the front surface peripheral edge 85. More specifically, the first external electrode 3 is formed to extend integrally across the element forming surface 2A and the three side surfaces 2C, 2E, and 2F. That is, the first external electrode 3 has a front surface portion 3a covering the element forming surface 2A and a side surface portion 3b covering the three side surfaces 2C, 2E, and 2F, and these are formed continuously and integrated across the front surface peripheral edge 85. Similarly, the second external electrode 4 is formed to extend integrally across the element forming surface 2A and the three side surfaces 2D, 2E, and 2F. That is, the second external electrode 4 has a front surface portion 4a covering the element forming surface 4a and a side surface portion 4b covering the three side surfaces 2D, 2E, and 2F, and these are formed continuously and integrated across the front surface peripheral edge 85.

The front surface portions 3a and 4a of the first and second external electrodes 3 and 4 are formed to cover rectangular regions at respective end portions of the element forming surface 2A. The side surface portion 3b of the first external electrode 3 is formed in a band-shaped region of predetermined width of edge portions at the element forming surface 2A sides of the three side surfaces 2E, 2C, and 2F that is continuous across the side surfaces. At the side surfaces 2E and 2F, the side surface portion 3b is formed in end portion regions at the side surface 2C sides so as to be matched with the front surface portion 3a. Similarly, the side surface portion 4b of the second external electrode 4 is formed in a band-shaped region of predetermined width of edge portions at the element forming surface 2A sides of the three side surfaces 2E, 2D, and 2F that is continuous across the side surfaces. At the side surfaces 2E and 2F, the side surface portion 4b is formed in end portion regions at the side surface 2D sides so as to be matched with the front surface portion 4a. The side surface portion 3b of the first external electrode 3 is thus formed integrally to cover the three side surfaces 2C, 2E, and 2F along the one short side 82 (short side at the side surface 2C side) of the chip capacitor 1 and the pair of long sides 81 at the respective sides thereof. On the other hand, the side surface portion 4b of the second external electrode 4 is formed integrally to cover the three side surfaces 2D, 2E, and 2F along the other short side 82 (short side at the side surface 2D side) of the chip capacitor 1 and the pair of long sides 81 at the respective sides thereof. Respective corner portions 7 at which the side surfaces intersect each other at respective end portions in the long direction of the substrate 2 are thereby covered respectively by the first external electrode 3 and the second external electrode 4.

The first external electrode 3 and the second external electrode 4 are substantially the same in dimensions and same in shape in a plan view of looking from the direction of a normal to the element forming surface 2A. In a plan view, the first external electrode 3 has a substantially oblong shape and has a pair of mutually parallel long sides 3A and a pair of mutually parallel short sides 3B, and the long sides 3A and the short sides 3B are orthogonal. Similarly, in a plan view, the second external electrode 4 has a substantially oblong shape and has a pair of mutually parallel long sides 4A and a pair of mutually parallel short sides 4B, and the long sides 4A and the short sides 4B are orthogonal. The long sides 3A and 4A of the first external electrode 3 and the second external electrode 4 extend in parallel to the short sides 82 of the substrate 2, and the short sides 3B and 4B of the first external electrode 3 and the second external electrode 4 extend in parallel to the long sides 81 of the substrate 2. The chip capacitor 1 does not have an electrode at the rear surface 2B.

The capacitor element 5 is formed in a region of the element forming surface 2A of the substrate 2 between the first external electrode 3 and the second external electrode 4 and in a region directly below the first external electrode 3. Between the first and second external electrodes 3 and 4, the capacitor element 5 is covered by the passivation film 40 and the resin film 41.

Figure 1B:
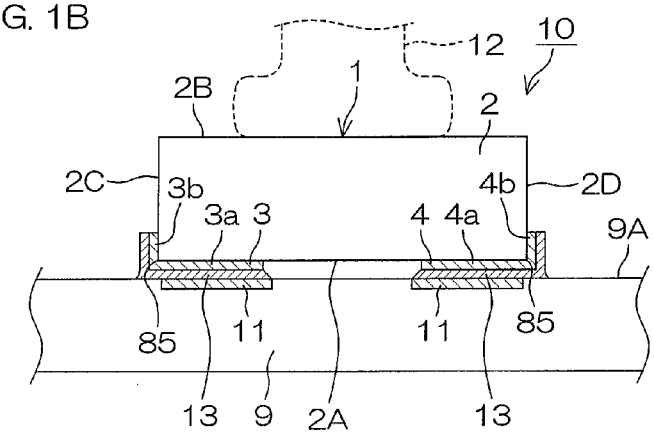
FIG. 1B is a schematic sectional view of a circuit assembly in a state where the chip capacitor is mounted on a mounting substrate.

FIG. 1B is a schematic sectional view, taken along a longitudinal direction of the chip capacitor 1, of a circuit assembly 10 in a state where the chip capacitor 1 is mounted on a mounting substrate 9, and sections of principal portions are provided with hatching. The circuit assembly 10 is constituted by the chip capacitor 1 being mounted on the mounting substrate 9. An upper surface of the mounting substrate 9 in the arrangement of FIG. 1B is a mounting surface. A pair of lands 11, connected to an internal circuit (not shown) of the mounting substrate 9, are formed on the mounting surface. Each land 11 is formed, for example, of Cu. On a front surface of each land 11, a solder 13 is provided so as to project from the front surface.

The chip capacitor 1 is mounted on the mounting substrate 9 using an automatic mounting machine. Specifically, the rear surface 2B of the chip capacitor 1 is suctioned by a suction nozzle 12 of the automatic mounting machine to hold the chip capacitor 1. In this state, the suction nozzle 12 is moved to transfer the chip capacitor 1. In this process, the suction nozzle 12 suctions a substantially central portion in the long direction of the rear surface 2B. The first and second external electrodes 3 and 4 are formed only on the element forming surface 2A and the side surfaces 2C to 2F of the chip capacitor 1, and therefore the rear surface 2B of the chip capacitor 1 is a flat surface without the unevenness due to electrodes. A large margin can thus be provided for the suction position of the suction nozzle 12. The suction nozzle 12 can thereby suction the chip capacitor 1 reliably and the chip capacitor 1 can be transferred reliably without dropping in the middle of transfer.

The suction nozzle 12 suctioning the chip capacitor 1 is then moved to a predetermined mounting position on the mounting substrate 9. At this point, the element forming surface 2A of the chip capacitor 1 and the mounting surface of the mounting substrate 9 face each other. In this state, the suction nozzle 12 is moved to press the chip capacitor 1 against the mounting substrate 9 to make the first external electrode 3 of the chip capacitor 1 contact the solder 13 on one land 11 and the second external electrode 4 contact the solder 13 on the other land 11. The solders 13 are then melted by heating and thereafter the solders 13 are solidified by cooling. The first and second external electrodes 3 and 4 are thereby bonded respectively to the corresponding lands 11 via the solders 13. The chip capacitor 1 is thereby mounted (flip-chip connected) to the mounting substrate 9, and by mounting other circuit parts to the mounting substrate as necessary, the circuit assembly 10 is completed.

To improve solder wettability and improve reliability, the first external electrode 3 and the second external electrode 4 are preferably formed of gold (Au) or has gold plating applied on the front surfaces thereof.

In the circuit assembly 10 in the completed state, the element forming surface 2A of the chip capacitor 1 and the mounting surface of the mounting substrate 9 extend in parallel while facing each other across a gap. The dimension of the gap corresponds to the total of the height of projection of the first external electrode 3 and the second external electrode 4 from the element forming surface 2A and the thickness of the solders 13.

FIG. 1C is a schematic plan view (bottom view of the arrangement of FIG. 1B) of the chip capacitor 1 in the state of being mounted on the mounting substrate as viewed from the element forming surface side. The mounted state of the chip capacitor 1 shall now be described with reference to FIG. 1B and FIG. 1C.

As shown in sectional view in FIG. 1B, each of the first external electrode 3 and the second external electrode 4 is formed to an L shape with the front surface portion 3a or 4a on the element forming surface 2A and the side surface portion 3b or 4b on the side surface 2C or 2D being made integral. Therefore, when the circuit assembly 10 (to be accurate, the portion of bonding of the chip capacitor 1 and the mounting substrate 9) is viewed from the direction of the normal to the element forming surface 2A as shown in FIG. 1C, the solder 13 bonding the first external electrode 3 and the land 11 is adsorbed not only to the front surface portion 3a but also to the side surface portion 3b of the first external electrode 3. Similarly, the solder 13 bonding the second external electrode 4 and the land 11 is adsorbed not only to the front surface portion 4a but also to the side surface portion 4b of the second external electrode 4.

The first external electrode 3 is thus formed to integrally cover the three side surfaces 2C, 2E, and 2F of the substrate 2, and the second external electrode 4 is formed to integrally cover the three side surfaces 2D, 2E, and 2F of the substrate 2. That is, the external electrodes 3 and 4 cover the side surfaces 2C to 2F in addition to the element forming surface 2A of the substrate 2 and therefore an adhesion area for soldering the chip capacitor 1 onto the mounting substrate 9 can be enlarged. The amount of solder 13 adsorbed to the first external electrode 3 and the second external electrode 4 is thus large and therefore a high adhesion strength can be obtained.

Also as shown in FIG. 1C, the solder 13 is adsorbed so as to extend from the element forming surface 2A to the side surfaces 2C to 2F of the substrate 2. Therefore in the mounted state, the first external electrode 3 can be held by the solder 13 at the three side surfaces 2C, 2E, and 2F and the second external electrode 4 can be held by the solder 13 at the three side surfaces 2D, 2E, and 2F. All of the side surfaces 2C to 2F of the rectangular chip capacitor 1 can thereby be fixed by the solder 13. The mounted state of the chip capacitor 1 can thereby be stabilized and therefore the circuit assembly 10 of high reliability can be provided.

Figure 3:
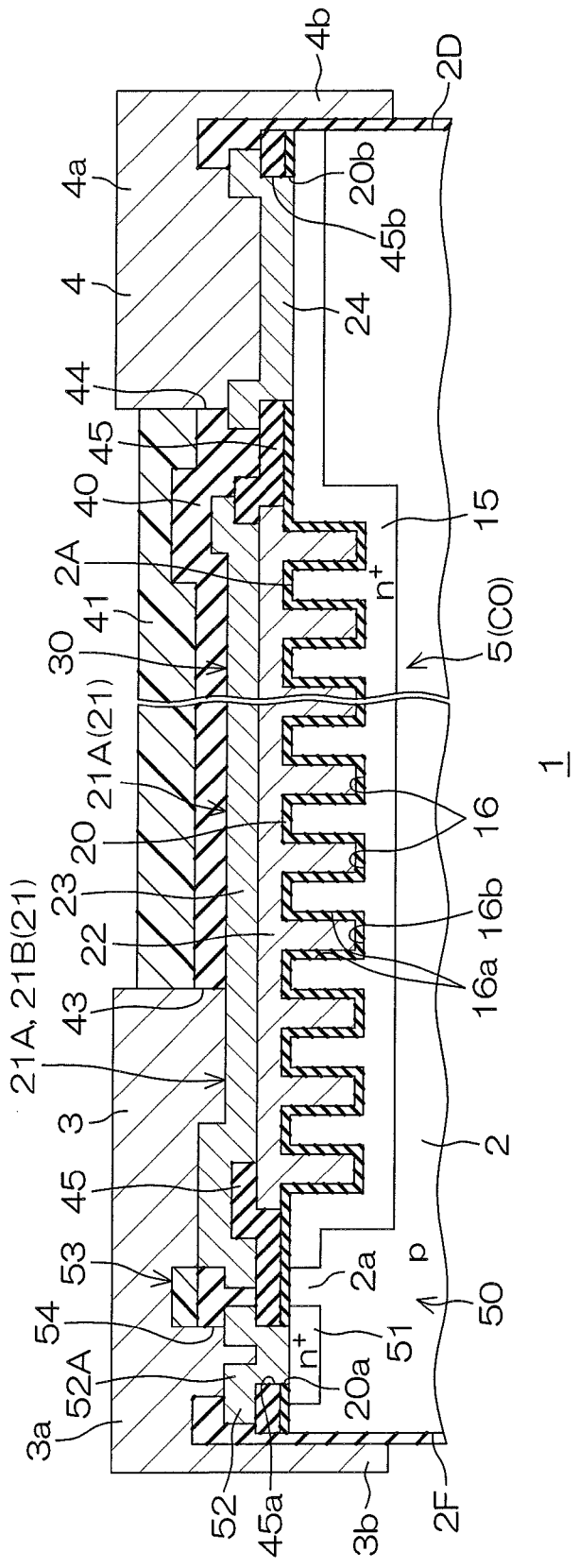
FIG. 3 is a sectional view (sectional view taken along III-III in FIG. 2A) of the internal arrangement of the chip capacitor.
Figure 4:
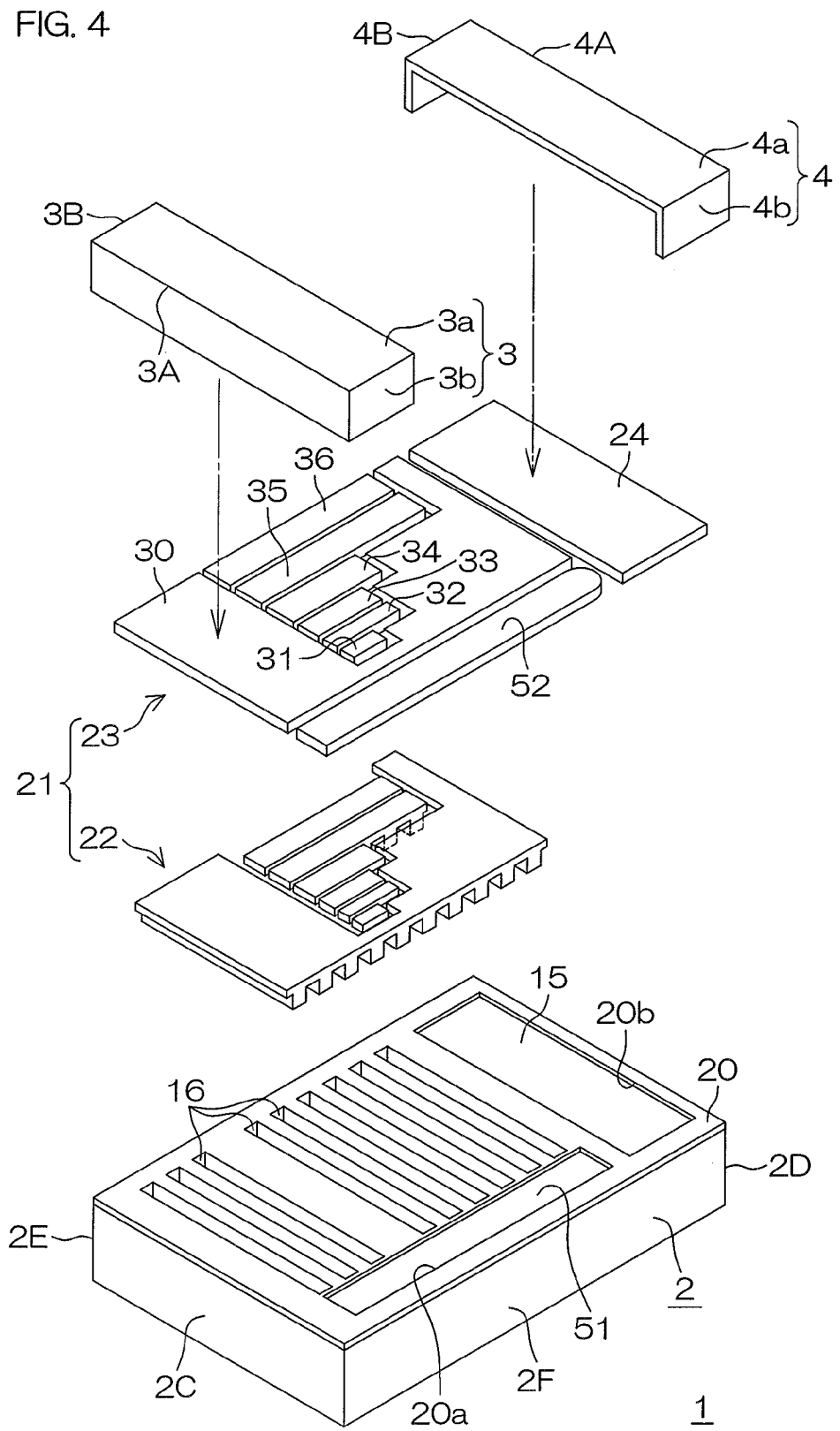
FIG. 4 is an exploded perspective view showing the arrangement of a portion of the chip capacitor in a separated state.

FIG. 2A, FIG. 2B, and FIG. 2C are plan views for describing the internal arrangement of the chip capacitor 1 and FIG. 3 is a sectional view thereof that shows a section taken along section line III-III in FIG. 2A. Further, FIG. 4 is an exploded perspective view showing the arrangement of a portion of the chip capacitor 1 in a separated state. FIG. 2A shows the layout of an upper electrode, etc., of the capacitor element 5, FIG. 2B shows the layout of a polysilicon film constituting a lower layer side of the upper electrode of the capacitor element 5, and FIG. 2C shows the layout of an $n^+$-type impurity diffusion layer, functioning as a lower electrode, etc., of the capacitor element 5. In FIG. 4, illustration of the passivation film 40 and the resin film 41 is omitted.

The capacitor element 5 is formed across a region between the first and second external electrodes 3 and 4 and a region directly below the first external electrode 3. The capacitor element 5 includes a plurality of capacitor components C0 to C6. The capacitor component C0 is a basic capacitance element that determines a minimum capacitance of the chip capacitor 1. The capacitor components C1 to C6 are adjusting capacitance elements that are used to add capacitance to the basic capacitance element to perform precise adjustment of the overall capacitance of the chip capacitor 1.

The capacitor component C0 is disposed to extend across the region directly below the first external electrode 3 and the region between the first and second external electrodes 3 and 4 and is directly connected electrically to the first external electrode 3. On the other hand, entireties of the capacitor components C1 to C6 are positioned in the region between the first external electrode 3 and the second external electrode 4 and are respectively connected electrically to the first external electrode 3 via one or a plurality of fuse units 17. The capacitor components C1 to C6 are thus adjusting capacitance elements that can be disconnected from the first external electrode 3 as necessary. A fuse unit is not provided between the capacitor component C0 and the first external electrode 3. Therefore the capacitor component C0 is a basic capacitance element that cannot be disconnected from the first external electrode 3.

As shown in FIG. 2C and FIG. 3, in the region in which the capacitor element 5 is disposed, an impurity (an n-type impurity in the present preferred embodiment) is diffused in the substrate 2 and an $n^+$-type impurity diffusion layer 15 is thereby formed at a surface layer portion of the substrate 2. The $n^+$-type impurity diffusion layer 15 functions as a lower electrode in common to the plurality of capacitor components C0 to C6. For example as shown in FIG. 3, a p-type silicon substrate is used as the substrate 2 and an n-type impurity is introduced into the surface layer portion thereof to form the $n^+$-type impurity diffusion layer 15. The $n^+$-type impurity diffusion layer 15 spreads across the entire region of the capacitor element 5 and is formed to extend to a region directly below the second external electrode 4.

The substrate 2 has a plurality of trenches 16 formed in the region in which the capacitor element 5 is formed. The plurality of trenches 16 are formed to be separated in regions corresponding to each of the individual capacitor components C0 to C6. The plurality of trenches 16 are formed inside the $n^+$-type impurity diffusion layer 15. Each trench 16 has a predetermined depth from the front surface of the substrate 2, has a pair of side wall surfaces 16a that intersect (in the present preferred embodiment, are substantially orthogonal to) the front surface of the substrate 2 and a bottom wall surface 16b joining the pair of side wall surfaces 16a, and is formed to have a substantially rectangular cross section. The pair of side wall surfaces 16a and the bottom wall surface 16b are all wall surfaces that expose the $n^+$-type impurity diffusion layer 15.

The plurality of trenches 16 are formed to stripe shapes that are mutually parallel. Each trench 16 extends along the short direction of the substrate 2. The pitch of the plurality of trenches 16 and the depth and width of each trench 16, etc., may be designed as suited in accordance with the capacitance value required of the chip capacitor 1. For the sake of clarity of drawing, the trenches 16 are drawn to be larger in width and pitch than actual in FIG. 2B, FIG. 2C, FIG. 3, etc. Specifically, in an actual product, the width and pitch of the trenches 16 may be set to be sufficiently smaller than the width of the capacitor components C1 to C6. Also, although an example in which the trenches 16 are formed in the regions corresponding to all of the capacitor components C0 to C6 is illustrated in FIG. 2B and FIG. 2C, the trenches 16 may be formed in just a portion of the capacitor component forming regions. For example, the trenches 16 may be formed just in the forming regions of the capacitor components C0 and C4 to C6 that are high in capacitance and the trenches 16 do not have to be formed in the forming regions of the capacitor components C1 to C3 that are low in capacitance.

On the front surface of the substrate 2, a capacitance film (dielectric film) 20 is formed so as to contact the front surface of the substrate 2. The capacitance film 20 may be a laminated film in which a silicon nitride film is sandwiched by a pair of silicon oxide films, that is, a so-called ONO film. For example, the silicon nitride film may be made approximately 150 Å in film thickness, the silicon oxide film at the lower electrode side may be made approximately 100 Å in film thickness, and the silicon oxide film at the upper electrode side may be made approximately 50 Å in film thickness. The capacitance film 20 may be a film formed by a plasma CVD (chemical vapor deposition) method.

The capacitance film 20 is continuous across substantially the entirety of the front surface of the $n^+$-type impurity diffusion layer 15 and its surfaces at one side and the other side are formed to conform to (follow) the front surface of the $n^+$-type impurity diffusion layer 15 (element forming surface 2A). The inner wall surfaces (including the pair of side wall surfaces 16a and the bottom wall surface 16b) of the plurality of trenches 16 are thereby covered by the capacitance film 20. Also, the capacitance film 20 has an opening 20b formed directly below the second external electrode 4. The $n^+$-type impurity diffusion layer 15 is exposed from the opening 20b. In the opening 20b, a pad metal film 24 for the second external electrode 4 contacts the $n^+$-type impurity diffusion layer 15. The second external electrode 4 is joined to the front surface of the pad metal film 24.

An upper electrode film 21 is formed on the capacitance film 20. The upper electrode film 21 has its front surface formed flatly. As shown in FIG. 2A, the upper electrode film 21 includes a capacitor electrode region 21A functioning as an upper electrode of the plurality of capacitor components C0 to C6, a pad region 21B arranged to be joined to the first external electrode 3, and a fuse region 21C disposed between the pad region 21B and the capacitor electrode region 21A corresponding to the capacitor components C1 to C6. The capacitor electrode region 21A constitutes the upper electrode of the capacitor components C0 to C6. A portion of the capacitor component C0 is positioned directly below the first external electrode 3 and therefore the capacitor electrode region 21A corresponding to the capacitor component C0 has a portion redundant with the pad region 21B directly below the first external electrode 3. The fuse region 21C constitutes the plurality of fuse units 17.

In the capacitor electrode region 21A, the upper electrode film 21 is divided into a plurality of electrode film portions 30 to 36, respectively corresponding to the capacitor components C0 to C6.

The electrode film portion 30 corresponding to the capacitor component C0 includes the portion redundant with the pad region 21B and occupies the largest area in the capacitor electrode region 21A. The other electrode film portions 31 to 36 are formed to strip shapes (elongate rectangular shapes) in a plan view and extend in the form of bands from the fuse region 21C toward the second external electrode 4. The plurality of trenches 16 are formed in regions that are separated in accordance with the plurality of electrode film portions 30 to 36. In the present preferred embodiment, each trench 16 extends in a direction orthogonal to the long direction of each of the electrode film portions 31 to 36. In regard to the capacitor components C1 to C6, a trench 16 is not formed in the fuse region 21C.

The plurality of electrode film portions 30 to 36 face the $n^+$-type impurity diffusion layer 15 (lower electrode) across the capacitance film 20 over a plurality of types of facing areas. More specifically, the electrode film portion 30 faces the $n^+$-type impurity diffusion layer 15 over a greater facing area than any of the other electrode film portions. The facing areas of the other electrode film portions 31 to 36 with respect to the $n^+$-type impurity diffusion layer 15 may be set to be 1:2:4:8:16:16. The facing area is the area of the portion of each of the electrode film portions 30 to 36 (upper electrode) that faces the $n^+$-type impurity diffusion layer 15 (lower electrode) across the capacitance film 20 and includes the area of the portions disposed along the side wall surfaces 16a and the bottom wall surface 16b of the trenches 16. The plurality of electrode film portions 31 to 36 include the plurality of electrode film portions differing in facing area and more specifically include the plurality of electrode film portions 31 to 35 having facing areas that are set to form a geometric progression with a common ratio of 2. If the ratio of the facing areas of the electrode film portions 31 to 36 is as mentioned above, the ratio of the capacitance values of the capacitor components C1 to C6 is equal to the ratio of the facing areas and is 1:2:4:8:16:16. The plurality of capacitor components C1 to C6 thus include the plurality of capacitor components C1 to C5 with capacitance values set to form the geometric progression with the common ratio of 2.

In the present preferred embodiment, the electrode film portions 31 and 32 are formed to bands that are equal in width and have lengths with the ratio thereof being set to 1:2. "Length" refers to the length measured along the front surface of the substrate 2 and at a portion at which a trench 16 is formed, the length is measured along the side wall surfaces 16a and the bottom wall surface 16b of the trench 16. Also, the electrode film portions 32 to 33 are formed to bands that are equal in length and have widths with the ratio thereof being set to 1:2. The electrode film portions 33 and 34 differ in length and width and are formed to bands such that the ratio of the facing areas is 1:2. The electrode film portions 34 and 35 are formed to bands that are equal in width and have lengths with the ratio thereof being set to 1:2. In the present preferred embodiment, the electrode film portions 35 and 36 are formed to bands that are equal in length and width and have equal facing areas.

The strip-shaped electrode film portions 31 to 36 are lined up with end portions at the first external electrode 3 side being aligned along a long side 3A of the first external electrode 3. The electrode film portions 31 to 36 are lined up from the one long side 81 to the other long side 81 of the substrate 2 in the order of apparent length in a plan view.

The electrode film portion 30 for the capacitor component C0 that constitutes the basic capacitance element includes a portion used in common as the capacitor electrode region 21A and the pad region 21B, a connection portion 30A connected integrally to the portion used in common, and a main portion 30B formed integral to the connection portion 30A. The connection portion 30A is formed to extend along the long direction of the chip capacitor 1 from the first external electrode 3 toward the second external electrode 4. The connection portion 30A is disposed adjacent to the electrode film portion 31, which is the shortest in apparent length among the strip-shaped electrode film portions 31 to 36, at the opposite side with respect to the second shortest electrode film portion 32. The connection portion 30A is formed to a band shape parallel to the electrode film portion 31. The main portion 30B is formed so as to avoid the electrode film portions 31 to 36 and is formed to a shape that widens as the second external electrode film 4 is approached. More specifically, the main portion 30B includes a stepped edge portion 30a formed so as to border tip edges of the strip-shaped electrode film portions 31 to 36 across an interval, a first rectilinear edge portion 30b facing the second external electrode 4, and a second rectilinear edge portion 30C connected, at the opposite side with respect to the electrode film portions 31 to 36, to an edge portion of the connection portion 30A at the same side. The first rectilinear edge portion 30b extends along a long side 4A at the inner side of the second external electrode 4 and extends in a direction orthogonal to the strip-shaped electrode film portions 31 to 36. The second rectilinear edge portion 30c extends rectilinearly from the first external electrode 3 to the second external electrode 4. The main portion 30B is thereby formed to a stepped fan shape so as to match the shape of a region in which the electrode film portions 31 to 36 are not formed.

The pad region 21B is substantially redundant with the first external electrode 3 in a plan view and has a substantially rectangular planar shape. As shown in FIG. 3, the upper electrode film 21 is in contact with the first external electrode 3 in the pad region 21B. The pad region 21B of the upper electrode film 21 serves in common as the electrode film portion 30 of the capacitor component C0. Therefore, not only are capacitor structures (the capacitor components C0 to C6) formed in the region between the first external electrode 3 and the second external electrode 4 but a capacitor structure (a portion of the capacitor component C0) is also formed in a region directly below the first external electrode 3. The capacitance value is thus increased by the use of the region directly below the first external electrode 3 as well.

In the present preferred embodiment, the upper electrode film 21 is constituted of a laminated electrode film in which a polysilicon film 22 and a metal film 23 are laminated. The polysilicon film 22 is a low-resistance polysilicon film that has been made low in resistance by introduction of an impurity (for example, an n-type impurity). As shown most clearly in FIG. 2B, the polysilicon film 22 is separated in correspondence to the electrode film portions 30 to 36. The portion of the polysilicon film 22 corresponding to the electrode film portion 30 is formed in the pad region 21B as well. In other words, the portion of the polysilicon film 22 for the capacitor component C0 serves in common as a pad region portion. On the other hand, the polysilicon film 22 of the electrode film portions 31 to 36 for the capacitor components C1 to C6 and the polysilicon film 22 of the pad region 21B are separated by the fuse region 21C. In regions in which the trenches 16 are formed, the polysilicon film 22 is embedded inside the trenches 16. The polysilicon film 22 is formed to be flat on the front surface. The metal film 23 is laminated on the front surface of the polysilicon film 22.

The metal film 23 is made, for example, of Al, Al—Si, Al—Si—Cu, etc. The metal film 23 is separated into the electrode film portions 30 to 36. The portion of the metal film 23 corresponding to the electrode film portion 30 is formed in the pad region 21B as well. In other words, the portion of the metal film 23 for the capacitor component C0 serves in common as a pad region portion. The metal film 23 constituting the electrode film portions 31 to 36 for the capacitor components C1 to C6 and the metal film 23 of the pad region 21B are connected via the fuse region 21C. That is, in the fuse region 21C, the upper electrode film 21 does not have the polysilicon film 22 and is constituted only of the metal film 23.

The fuse region 21C includes the plurality of fuse units 17 that are aligned along the long side 3A at the inner side of the first external electrode 3. The fuse units 17 are constituted of portions of the metal film 23 of the upper electrode film 21 and are therefore formed integral to the upper electrode of the capacitor element 5. In other words, the fuse units 17 are constituted of the same metal material as the metal film 23. The plurality of electrode film portions 31 to 36 are each formed integral to one or a plurality of the fuse units 17, are connected to the pad region 21B via the fuse units 17, and are electrically connected to the first external electrode 73 via the pad region 21B. Each of the electrode film portions 31 and 32 of comparatively small area is connected to the pad region 21B via a single fuse unit 17, and each of the electrode film portions 33 to 36 of comparatively large area is connected to the pad region 21B via a plurality of fuse units 17.

The fuse units 17 are arranged to be capable of being cut (fused) by irradiation with laser light. Unnecessary electrode film portions among the electrode film portions 31 to 36 can thus be electrically disconnected from the first external electrode 3 by cutting the fuse units 17. That is, the unnecessary capacitor components among the capacitor components C1 to C6 can be disconnected from the first external electrode 3.

Although omitted from illustration in FIG. 2A to FIG. 2C and FIG. 4, the front surface of the chip capacitor 1 that includes the front surface of the upper electrode film 21 is covered by the passivation film 40 as shown in FIG. 3. The passivation film 40 is constituted, for example, of a nitride film and may be formed, for example, by a plasma CVD method. The film thickness thereof may be approximately 8000 Å. The passivation film 40 is formed not only to cover the upper surface of the chip capacitor 1 but also to extend to side surfaces 2C to 2F of the substrate 2 and cover the side surfaces 2C to 2F. Further, the resin film 41, made of a polyimide resin, etc., is formed on the passivation film 40. The resin film 41 is formed to cover the upper surface of the chip capacitor 1.

The passivation film 40 and the resin film 41 are protective films that protect the front surface of the chip capacitor 1. In these films, pad openings 43 and 44 are respectively formed in regions corresponding to the first external electrode 3 and the second external electrode 4. The pad openings 43 and 44 penetrate through the passivation film 40 and the resin film 41 so as to respectively expose a region of a portion of the pad region 21B of the upper electrode film 21 and a region of a portion of the pad metal film 24. The pad metal film 24 is preferably constituted of the same material as the metal film 23 that constitutes the upper electrode film 21.

The first external electrode 3 and the second external electrode 4 are respectively embedded in the pad openings 43 and 44. The first external electrode 3 is thereby bonded to the pad region 21B of the upper electrode film 21 and the second external electrode 4 is bonded to the pad metal film 24. The first and second external electrodes 3 and 4 are formed to project from the front surface of the resin film 41. The chip capacitor 1 can thereby be flip-chip bonded to the mounting substrate 9.

As shown in FIG. 2C and FIG. 3, an $n^+$-type impurity diffusion layer 51 that constitutes the bidirectional diode 50 is formed inside the substrate 2. The $n^+$-type impurity diffusion layer 51 is formed across a predetermined interval from the $n^+$-type impurity diffusion layer 15 that constitutes the lower electrode of the capacitor element 5. This interval is occupied by a p-type region 2a, which is a portion of the substrate 2 (p-type semiconductor substrate). The pair of n$^+$-type impurity diffusion layers 15 and 51 thus face each other across the p-type region 2a and the bidirectional diode 50, constituted of the pair of pn junction diodes that are serially connected in opposite directions, is thereby arranged.

As shown most clearly in FIG. 2C, the n$^+$-type impurity diffusion layer 51 is formed along one of the long sides 81 of the chip capacitor 1 in the present preferred embodiment. More specifically, in a vicinity of the one long side 81 of the chip capacitor 1, the n$^+$-type impurity diffusion layer 51 extends in band form from a region directly below the first external electrode 3 to front of the second external electrode 4.

As shown in FIG. 3, an insulating film 45 (unillustrated in FIG. 4) is formed on the front surface of the substrate 2 (more accurately, the front surface of the capacitance film 20). The insulating film 45 is constituted, for example, of a silicon oxide film. In a region in a periphery of the capacitor components C0 to C6, the insulating film 45 is formed between the upper electrode film 21 and the capacitance film 20. Directly below the first external electrode 3, a portion of the upper electrode film 21 is formed on the insulating film 45.

Further, a wiring film 52 for the bidirectional diode 50 is formed above the n$^+$-type impurity diffusion layer 51. The wiring film 52 is preferably constituted of the same metal material as the metal film 23 of the upper electrode film 21. As shown in FIG. 2B, the polysilicon film 22 is not formed directly above the n$^+$-type impurity diffusion layer 51 for constituting the bidirectional diode 50. The wiring film 52 is constituted only of the metal film. As shown in FIG. 2A, the wiring film 52 is formed to overlap with the n$^+$-type impurity diffusion layer 51 in a plan view so as to be matched with the n$^+$-type impurity diffusion layer 51. The wiring film 52 is formed on the insulating film 45 and is joined to the n$^+$-type impurity diffusion layer 51 via an opening 45a formed in the insulating film 45 and an opening 20a formed in the capacitance film 20. The wiring film 52 has a pad region 52A directly below the first external electrode 3. The first external electrode 3 is joined to the pad region 52A via a pad opening 54 penetrating through the passivation film 40. The n$^+$-type impurity diffusion layer 51 is thereby connected directly to the first external electrode 3 via the wiring film 52 and one side of the bidirectional diode 50 is thus connected to the first external electrode 3.

On the other hand, an opening 45b is formed in the insulating film 45 in a region directly below the second external electrode 4, and the n$^+$-type impurity diffusion layer 15, which constitutes the lower electrode of the capacitor element 5, is exposed via the opening 45b and the opening 20b in the capacitance film 20. The pad metal film 24 is formed on the insulating film 45 and is joined to the n$^+$-type impurity diffusion layer 15 via the openings 45b and 20a. The second external electrode 4 is joined to the pad metal film 24. The second external electrode 4 is thus connected directly to the n$^+$-type impurity diffusion layer 15 via the pad metal film 24. The n$^+$-type impurity diffusion layer 15 functions as the lower electrode of the capacitor element 5 and also constitutes the bidirectional diode 50. In other words, the n$^+$-type impurity diffusion layer for the lower electrode of the capacitor element 5 and one of the n$^+$-type impurity diffusion layers for the bidirectional diode 50 are formed continuously and integrally. The second external electrode 4 is thereby connected to the other side of the bidirectional diode 50.

By such an arrangement, the bidirectional diode 50 is connected serially between the first external electrode 3 and the second external electrode 4. The bidirectional diode 50 is connected between the first and second external electrodes 3 and 4 and in parallel to the capacitor element 5.

Directly below the first external electrode 3, the pad region 21B of the upper electrode film 21 and the pad region 52A of the wiring film 52 are separated. More specifically, the pad region 21B that is a first pad portion connected to the first external electrode 3 and the pad region 52A that is a second pad portion similarly connected to the first external electrode 3 are formed across an interval and are separated electrically. An insulating layer 53 constituted of a laminated film of the passivation film 40 and the resin film 41 is formed in between. The first external electrode 3 is formed to extend across the insulating layer 53 and is joined to both the pad region 21B (first pad portion) and the pad region 52A (second pad portion). That is, the first external electrode 3 electrically connects the first pad portion and the second pad portion.

Figure 5:
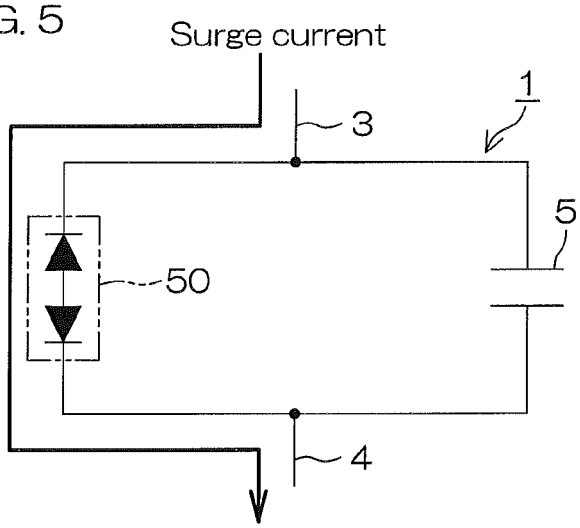
FIG. 5 is an electric circuit diagram for describing a function of the bidirectional diode incorporated in the chip capacitor.

FIG. 5 is an electric circuit diagram for describing a function of the bidirectional diode 50. The capacitor element 5 and the bidirectional diode 50 are connected in parallel between the first and second external electrode 3 and 4. That is, one of the terminals of the bidirectional diode 50 is connected to the first external electrode 3 and the other terminal of the bidirectional diode 50 is connected to the second external electrode 4. When a surge current caused by an electrostatic discharge, etc., is input from the first or second external electrode 3 or 4, the bidirectional diode 50 becomes conductive and allows the surge current to pass through while bypassing the capacitor element 5. The capacitor element 5 can thereby be protected from electrostatic breakdown. Specifically, whereas an ESD (electrostatic discharge) tolerance with respect to a human body model is, for example, approximately 60V with an arrangement without the bidirectional diode 50, the tolerance is improved, for example, to not less than 4000V with an arrangement provided with the bidirectional diode 50. Also, whereas the ESD tolerance with respect to a machine model is, for example, approximately 20V with an arrangement without the bidirectional diode 50, the tolerance is improved, for example, to not less than 600V with an arrangement provided with the bidirectional diode 50.

Figure 6:
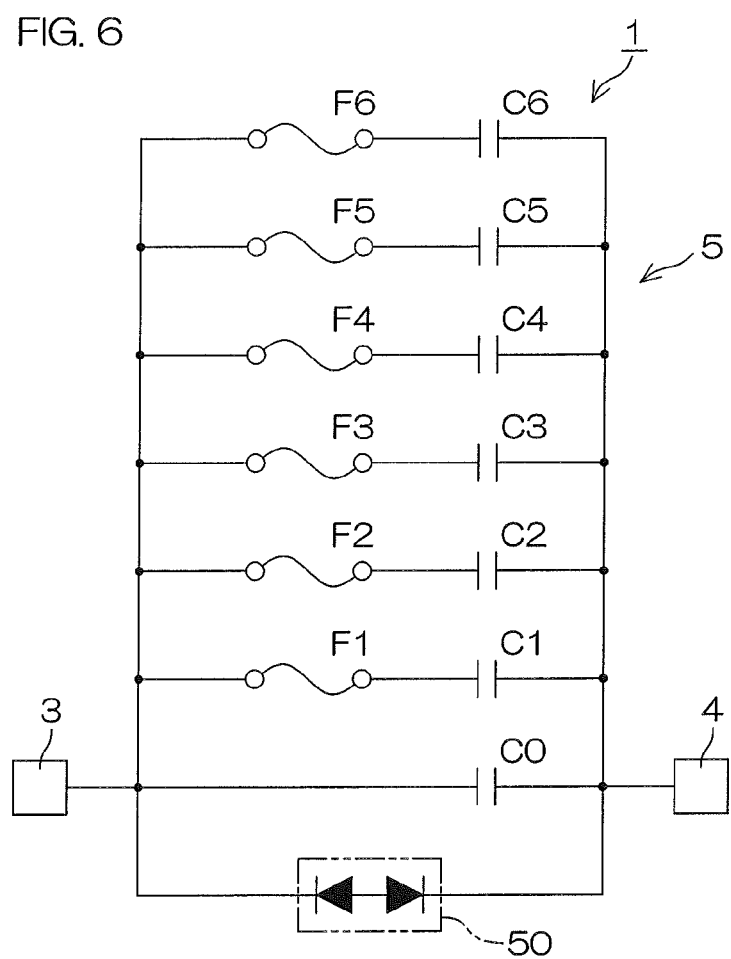
FIG. 6 is a circuit diagram of the electrical arrangement of the interior of the chip capacitor.

FIG. 6 is a circuit diagram of the electrical arrangement of the interior of the chip capacitor 1. The plurality of capacitor components C0 to C6 are connected in parallel between the first external electrode 3 and the second external electrode 4 to constitute the capacitor element 5. The bidirectional diode 50 is connected between the first and second external electrodes 3 and 4 and in parallel to the capacitor element 5. Fuses F1 to F6, each arranged from one or a plurality of the fuse units 17, are respectively interposed in series between the capacitor components C1 to C6, among the plurality of capacitor components C0 to C6, and the first external electrode 3. On the other hand, a fuse is not interposed between the capacitor component C0 and the first external electrode 3, and the capacitor component C0 is directly connected to the first external electrode 3.

When all of the fuses F1 to F6 are connected, the capacitance value of the chip capacitor 1 is equal to the total of the capacitance values of the capacitor components C0 to C6. When one or two or more fuses selected from among the plurality of fuses F1 to F6 is or are cut, each capacitor component corresponding to a cut fuse is disconnected and the capacitance value of the chip capacitor 1 decreases by just the capacitance value of the disconnected capacitor component or components. When all of the fuses F1 to F6 are cut, the capacitance value of the chip capacitor 1 is the capacitance value of the capacitor component C0.

Thus to measure the total capacitance value of the capacitance components C0 to C6 first, the capacitance value across the lower electrode film ($n^+$-type impurity diffusion layer 15) and the upper electrode (upper electrode film 21), that is, the capacitance value across the pad metal film 24 and the pad region 21B is measured. Thereafter, based on the measurement result and in accordance with a desired capacitance value, one or a plurality of fuses selected appropriately from among the fuses F1 to F6 is or are fused by laser light. Adjustment (laser trimming) to the desired capacitance value can thereby be performed. In particular, if the capacitance values of at least a portion of the capacitor components C1 to C6 are set to form a geometric progression with a common ratio of 2, fine adjustment of adjusting to the targeted capacitance value at a precision corresponding to the capacitance value of the capacitor component C1, which is the smallest capacitance value (value of the first term in the geometric progression), is made possible. By forming the first and second external electrodes 3 and 4 after the fine adjustment of the capacitance value, the chip capacitor 1 that is highly precisely adjusted in capacitance value can be provided.

FIG. 7 is a flow diagram for describing an example of a process for manufacturing the chip capacitor 1.

The $n^+$-type impurity diffusion layers 15 and 51 are formed on the surface layer portion of the substrate 2 (step S1). Specifically, in forming the $n^+$-type impurity diffusion layers 15 and 51, a mask film having openings corresponding to forming regions of the $n^+$-type impurity diffusion layers 15 and 51 is formed on the front surface of the substrate 2 and thereafter, n-type impurity ions are implanted. Further, after peeling off the mask film, a heat treatment is applied to activate the implanted n-type impurity ions. The $n^+$-type impurity diffusion layers 15 and 51 for the lower electrode of the capacitor element 5 and the bidirectional diode 50 are thereby formed at the respective predetermined regions.

Thereafter, the trenches 16 are formed by selectively etching the substrate 2 from the front surface (step S2). Thereafter, the capacitance film 20 is formed on the substrate 2, for example, by the plasma CVD method (step S3). The capacitance film 20 is formed so that its surface at one side and surface at the other side conform to the front surface of the substrate 2. After forming the capacitance film 20, the polysilicon film 22 that constitutes the upper electrode film 21 is formed on all surfaces. The polysilicon film 22 is embedded inside the trenches 16 and are further deposited to a predetermined thickness on the capacitance film 20 outside the trenches 16. The polysilicon film 22 is formed, for example, by the CVD method. The film thickness of the polysilicon film 22 may be approximately 6000 Å. Thereafter, an n-type impurity is diffused inside the polysilicon film to obtain the low-resistance polysilicon film. Thereafter, the polysilicon film 22 is patterned by photolithography. The polysilicon film 22 of the pattern corresponding to the capacitor components C0 to C6 is thereby obtained (step S4). Specifically, the polysilicon film 22 after patterning is separated into the six portions corresponding to the capacitor components C0 to C6.

Thereafter, the insulating film 45 is formed on all exposed surfaces (step S5). The insulating film 45 is constituted, for example, of a silicon oxide film and may be formed by the plasma CVD method, etc. The film thickness of the insulating film 45 may be approximately 9000 Å. Thereafter, the insulating film 45 is patterned by photolithography. Specifically, openings for exposing the front surfaces of respective portions of the separated polysilicon film 22, the opening 45a for exposing the $n^+$-type impurity diffusion layer 51 for the bidirectional diode 50, and the opening 45b for exposing the $n^+$-type impurity diffusion layer 15 directly below the second external electrode 4 are formed in the insulating film 45. Further in the region in which the polysilicon film 22 is not formed, the capacitance film 20 is etched in the same pattern. Openings for respectively exposing the $n^+$-type impurity diffusion layers 15 and 51 are thereby formed in the capacitance film 20 so as to match the openings 45a and 45b of the insulating film 45.

Thereafter, the material of the metal film, constituted of an Al—Si—Cu film, etc., is formed on the entire front surface of the capacitance film 20, for example, by the sputtering method (step S6). The film thickness of the metal film may be approximately 10000 Å. The metal film contacts the polysilicon film 22 in regions in which the polysilicon film 22 is exposed and contacts the $n^+$-type impurity diffusion layers 15 and 51 respectively in regions in which the $n^+$-type impurity diffusion layers 15 and 51 are exposed.

Thereafter, a resist pattern corresponding to the final shape of the metal film is formed on the front surface of the metal film by photolithography. By the metal film being etched with the resist pattern as a mask, the metal films of the patterns shown in FIG. 2A, etc., are obtained at the same time (step S7). That is, the metal film 23 constituting the upper electrode film 21 (capacitor electrode region 21A, pad region 21B, and fuse region 21C) of the capacitor element 5, the pad metal film 24, and the wiring film 52 are formed at the same time. The manufacturing process is simplified because the metal film 23 constituting the upper electrode film 21, the fuse units 17, and the pad metal film 24 can be formed at the same time by patterning the metal film in common. The metal film 23 has the plurality of electrode film portions 30 to 36 in the capacitor electrode region 21A and the plurality of fuse units 17 in the fuse region 21C. A portion of the electrode film portion 30 constitutes the pad region 21B directly below the first external electrode 3. The etching for patterning the metal film may be performed by wet etching using an etching liquid, such as phosphoric acid, etc., or may be performed by reactive ion etching.

Thereafter, inspection probes are contacted against the pad region 21B of the metal film 23, constituting the upper electrode of the capacitor element 5, and the pad electrode film 24, connected to the $n^+$-type impurity diffusion layer 15 as the lower electrode of the capacitor element 5, to measure the total capacitance value of the plurality of capacitor components C0 to C6 (step S8). Based on the measured total capacitance value, the capacitor components to be disconnected, that is, the fuses to be cut are selected in accordance with the targeted capacitance value of the chip capacitor 1 (step S9).

Figure 8A:
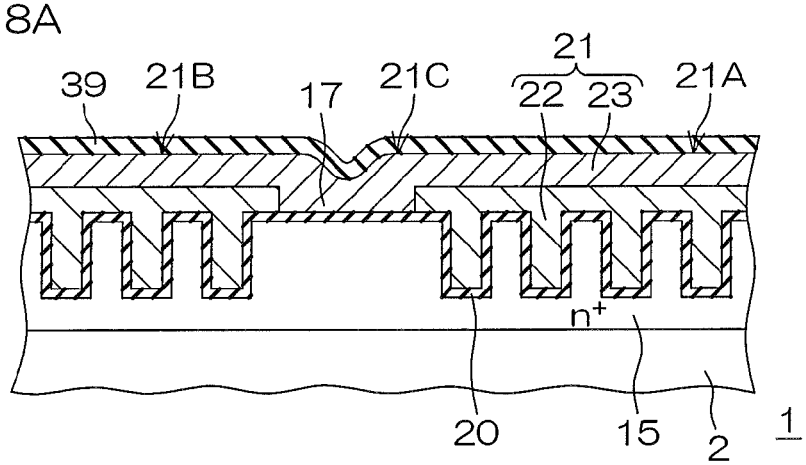
FIG. 8A to FIG. 8C are sectional views for describing a process of cutting a fuse included in the chip capacitor.

Thereafter as shown in FIG. 8A (section taken along section line VIII-VIII in FIG. 2A), a cover film 39, constituted, for example, of a nitride film, is formed on all surfaces on the substrate 2 (step S10). The forming of the cover film 39 may be performed by the plasma CVD method and, for example, a silicon nitride film with a film thickness of approximately 3000 Å may be formed. The cover film 39 covers the metal film 23, the pad metal film 24, and the wiring film 52 and covers the insulating film 45 in regions in which the metal films 23 and 24 and the wiring film 52 are not formed (refer also to FIG. 3). The cover film 39 covers the fuse units 17 in the fuse region 21C.

Figure 8B:
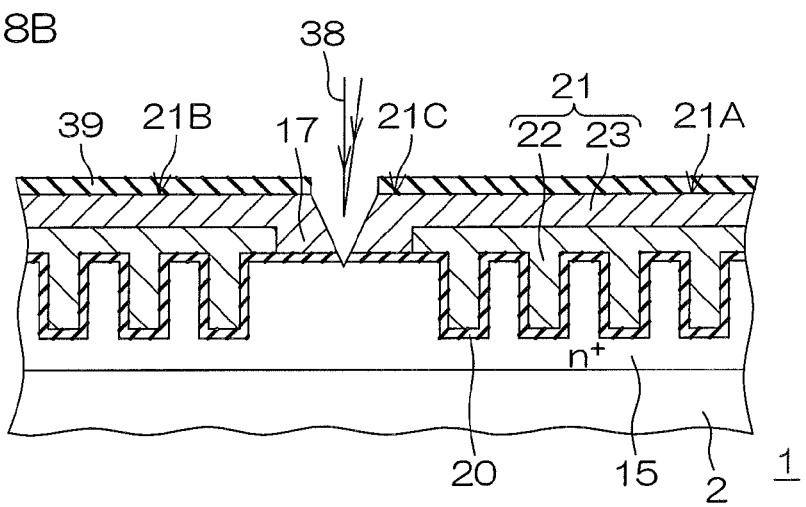

From this state, the laser trimming for fusing the fuse units 17 is performed (step S11). That is, as shown in FIG. 8B, each fuse unit 17 constituting a fuse selected in accordance with the measurement result of the total capacitance value is irradiated with laser light 38 to fuse the fuse unit 17. The corresponding capacitor component is thereby disconnected from the pad region 21B. When the laser light 38 is irradiated on the fuse unit 17, the energy of the laser light 38 is accumulated at a vicinity of the fuse unit 17 by the action of the cover film 39 and the fuse unit 17 is thereby fused reliably. The capacitance value of the chip capacitor 1 can thereby be adjusted to the targeted capacitance value reliably.

Figure 8C:
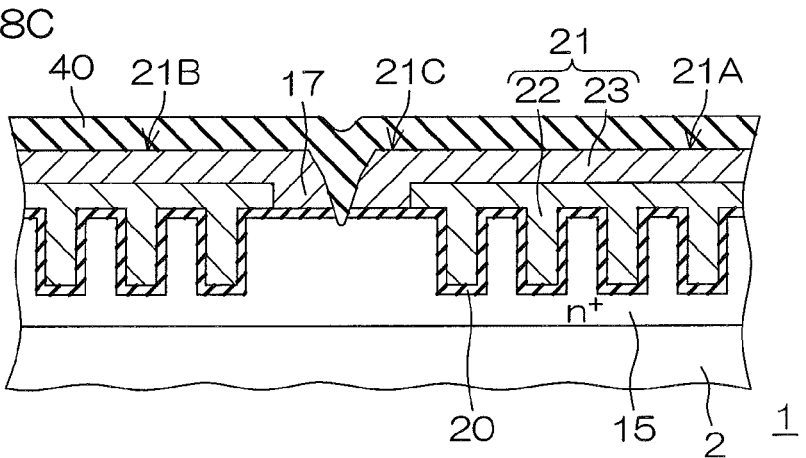

Thereafter as shown in FIG. 8C, a silicon nitride film is deposited on the cover film 39, for example, by the plasma CVD method to form the passivation film 40 (step S12). In the final form, the cover film 39 is made integral with the passivation film 40 to constitute a portion of the passivation film 40. The passivation film 40 that is formed after the cutting of the fuses enters into openings in the cover film 39, destroyed at the same time as the fusing of the fuse units 17, to protect the cut surfaces of the fuse units 17. The passivation film 40 thus prevents entry of foreign matter and entry of moisture into the cut locations of the fuse units 17. The passivation film 40 may be formed to have a film thickness, for example, of approximately 12000 Å as a whole.

By patterning of the metal film using the photolithography process, the electrode film portions 30 to 36 of minute areas can be formed with high precision and the fuse units 17 of even finer pattern can be formed. After the metal film 23 of the upper electrode film 21 has been patterned, the total capacitance value is measured and then the fuses to be cut are determined. By cutting the determined fuses, the chip capacitor 1 that is adjusted accurately to the desired capacitance value can be obtained.

Thereafter, a resist pattern, having penetrating holes at positions at which the first and second external electrodes 3 and 4 are to be formed, is formed on the passivation film 40 and etching of the passivation film 40 is performed using the resist pattern as a mask. The pad opening 43 exposing the pad region 21B of the upper electrode film 21, the pad opening 44 exposing the pad metal film 24 connected to the $n^+$-type impurity diffusion layer 15, and the pad opening 54 exposing the pad region 52A of the wiring film 52 are thereby formed (step S13). The etching of the passivation film 40 may be performed by reactive ion etching.

Thereafter, the resin film 41 is coated on all surfaces (step S14). As the resin film 41, for example, a coating film of a photosensitive polyimide is used. Patterning of the resin film 41 by photolithography may be performed by performing, on the resin film 41, an exposure step and a subsequent developing step for regions corresponding to the pad openings 43, 44, 54 (step S15). The pad openings 43, 44, and 54 penetrating through the resin film 41 and the passivation film 40 are thereby formed. Thereafter, heat treatment (curing) for hardening the resin film is performed (step S16).

Further, the first external electrode 3 and the second external electrode 4 are grown inside the pad openings 43, 44, and 54, for example, by the electroless plating method (step S17). The chip capacitor 1 of the structure shown in FIG. 1, etc., is thereby obtained.

Figure 9A:
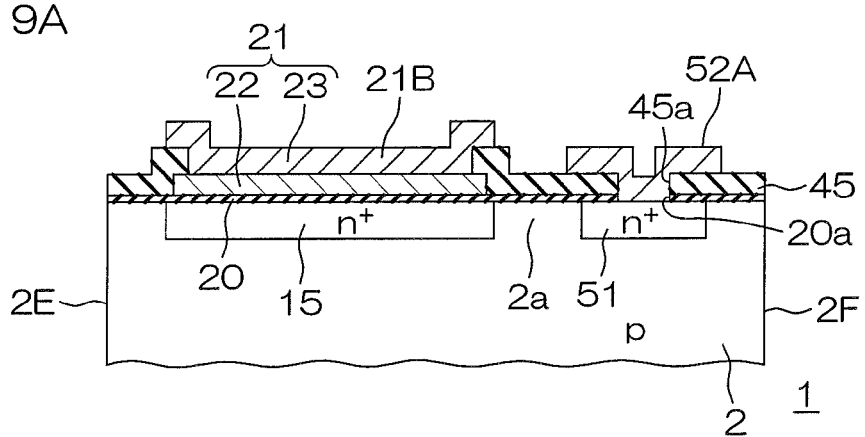
FIG. 9A to FIG. 9C are sectional views for describing the measurement of a total capacitance of the chip capacitor and the forming of an external electrode.
Figure 9B:
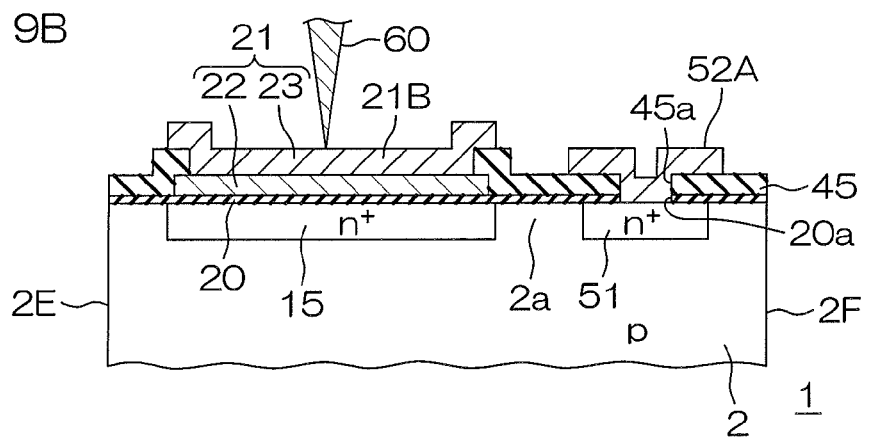
Figure 9C:
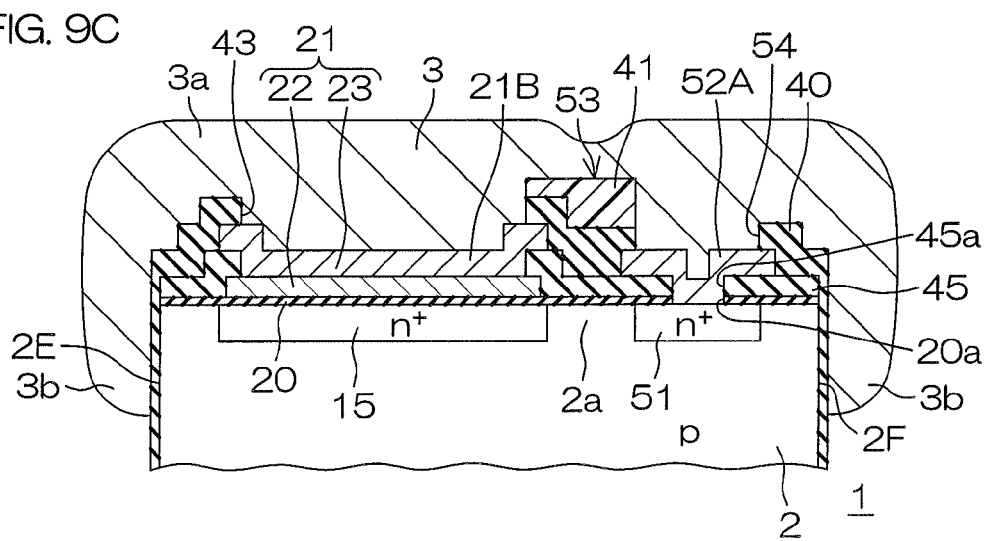

FIG. 9A, FIG. 9B, and FIG. 9C are sectional views (sections taken along section line IX-IX in FIG. 2A) for describing the measurement of the capacitance value and the forming of the first external electrode 3 in more detail. Directly below the first external electrode 3, the pad region 21B (first pad portion) of the upper electrode film 21 and the pad region 52A (second pad portion) of the wiring film 52 connected to the bidirectional diode 50 are separated from each other.

Before the first external electrode 3 is formed, the pad region 21B (first pad portion) and the pad region 52A (second pad portion) are electrically insulated as shown in FIG. 9A. That is, the capacitor element 5 and the bidirectional diode 50 are electrically disconnected. In this state, an inspection probe 60 is contacted against the pad region 21B (first pad portion) as shown in FIG. 9B to measure the total capacitance value of the capacitor element 5 (step S8 of FIG. 7). The total capacitance value can thus be measured accurately without being influenced by the bidirectional diode 50. After the measurement of the total capacitance value, the laser trimming (step S11 of FIG. 7) described above is performed and further, the passivation film 40 and the resin film 41 are formed (steps S12 to S16 of FIG. 7). The insulating layer 53, in which the passivation film 40 and the resin film 41 are laminated, is thereby formed between the pad region 21B (first pad portion) and the pad region 52A (second pad portion). The first external electrode 3 is formed thereafter (step S17 of FIG. 7).

The first external electrode 3 is formed by electrolytic plating or electroless plating. As shown in FIG. 9C, the first external electrode 3 grows from the pad region 21B (first pad portion) and the pad region 52A (second pad portion) respectively exposed from the pad openings 43 and 54 the portions growing from the respective pad portions become integral upon growing over the insulating layer 53. The pad region 21B (first pad portion) and the pad region 52A (second pad portion) are thereby connected electrically. The chip capacitor 1, with the arrangement in which, with respect to the first external electrode 3, the capacitor element 5 and the bidirectional diode 50 are connected in parallel is thereby obtained.

Each of the first and second external electrodes 3 and 4 may, for example, be constituted of a laminated structure film in which a nickel (Ni) layer in contact with the upper electrode film 21, the wiring film 52, or the pad metal film 24, a palladium (Pd) layer laminated on the nickel layer, and a gold (Au) layer laminated on the palladium layer are laminated, and may be formed, for example, by a plating method (or more specifically, the electroless plating method). The nickel layer contributes to improvement of adhesion with the upper electrode film 21, etc., and the palladium layer functions as a diffusion preventing layer that suppresses mutual diffusion of the material of the upper electrode film 21, etc., and the gold layer of the uppermost layer of each of the first and second connection electrodes 3 and 4.

As described above, the chip capacitor 1 according to the present preferred embodiment includes the bidirectional diode 50 in addition to the capacitor element 5 within the chip. The capacitor element 5 is connected between the first and second external electrodes 3 and 4. The bidirectional diode 50 is connected between the first and second external electrodes 3 and 4 and in parallel to the capacitor element 5. When a surge current due to an electrostatic discharge, etc., is input into the external electrode 3 or 4, the bidirectional diode 50 becomes conductive. The surge current is thereby made to bypass the capacitor element 5 and flow through the bidirectional diode 50 to enable the capacitor element 5 to be protected from electrostatic breakdown. The chip capacitor 1 of high electrostatic breakdown tolerance can thereby be provided.

Also with the present preferred embodiment, the substrate 2 is a semiconductor substrate and the bidirectional diode 50 includes the n+-type impurity diffusion layers 51 and 15 formed in the semiconductor substrate 2. With this arrangement, the bidirectional diode 50 can be formed inside the substrate 2 of the chip capacitor 1 to enable the capacitor element 5 and the bidirectional diode 50 to be included within a single chip and the electrostatic breakdown tolerance to be improved.

Also with the present preferred embodiment, the capacitor element 5 includes the lower electrode constituted of the n+-type impurity diffusion layer 15 formed inside the semiconductor substrate 2. With this arrangement, the n+-type impurity diffusion layer 15 inside the semiconductor substrate 2 can be used as the lower electrode to arrange the chip capacitor 1 that is improved in electrostatic breakdown tolerance.

Also with the present preferred embodiment, the n+-type impurity diffusion layer 15 functions as the lower electrode of the capacitor element 5 and also constitutes the bidirectional diode 50. In other words, the capacitor element 5 includes the lower electrode constituted of the impurity diffusion layer formed inside the semiconductor substrate 2 and the bidirectional diode 50 includes the impurity diffusion layer that is continuous to the impurity diffusion layer constituting the lower electrode.

With this arrangement, both the capacitor element 5 and the bidirectional diode 50 are arranged using the n+-type impurity diffusion layer 15 inside the semiconductor substrate 2. The impurity diffusion layer for the capacitor element 5 and the bidirectional diode 50 can thus be prepared by a process in common and the manufacturing process can thereby be simplified. Also, the impurity diffusion layer continuous to the impurity diffusion layer constituting the lower electrode of the capacitor element 5 constitutes the bidirectional diode and therefore there is no need to provide a separate wiring for connecting the bidirectional diode 50 and the lower electrode. The manufacturing process can be simplified by this aspect as well. Moreover, wiring space can be omitted to enable the chip capacitor 1 to be made compact in size and the capacitor element 5 to be increased in capacitance. The chip capacitor 1 of improved electrostatic breakdown tolerance can thus be provided while relaxing restrictions related to the manufacturing process, size, capacitance, etc.

Also with the present preferred embodiment, the bidirectional diode 50 includes a portion formed in the region directly below the first external electrode 3. With this arrangement, the region directly below the first external electrode 3 can be used to arrange the bidirectional diode 50 and therefore effective use can be made of the region on the substrate 2. The chip capacitor 1 of high electrostatic breakdown tolerance that is advantageous for realizing compact size and high capacitance can thereby be provided.

Also with the present preferred embodiment, the first external electrode 3 is formed to extend across the first pad portion (pad region 21B) and the second pad portion (pad region 52A) that are respectively connected to the capacitor element 5 and the bidirectional diode 50. That is, the first and second pad portions are electrically connected to each other by the first external electrode 3. The first and second pad portions are separated from each other and, before the first external electrode 3 is formed, are electrically disconnected. Therefore in the manufacturing process, the capacitance of the capacitor element 5 can be measured using the first pad portion before the first external electrode 3 is formed. At this point, the bidirectional diode 50 is not electrically connected to the first pad portion and the capacitance of the capacitor element 5 can thus be measured with the exclusion of influences of the bidirectional diode 50. The chip capacitor 1 of high electrostatic breakdown tolerance can thus be provided without inhibiting accurate measurement of the capacitor element capacitance in the manufacturing process.

The first external electrode 3 is disposed between the first pad portion (pad region 21B) and the second pad portion (pad region 52A) and extends across the insulating layer 53, which separates the pad portions, to be joined to both pad portions and therefore the structure in which the capacitor element 5 and the bidirectional diode 50 are connected in parallel to the first external electrode 3 can be formed reliably.

Also with the present preferred embodiment, the respective external electrodes 3 and 4 are formed to extend across the element forming surface 2A and the side surfaces 2C to 2F of the substrate 2 and integrally have the front surface portions 3a and 4a covering the element forming surface 2A and the side surface portions 3b and 4b covering the side surfaces 2C, 2E, and 2F and side surfaces 2D, 2E, and 2F. That is, the first and second external electrodes 3 and 4 not only have the front surface portions 3a and 4a that cover the front surface of the substrate 2 but also integrally have the side surface portions 3b and 4b covering the side surfaces of the substrate 2 and are formed integrally so as to extend across the front surface and the side surfaces of the substrate 2. The adhesion area across which the external electrodes 3 and 4 contact the solder 13 when the chip capacitor 1 is soldered onto the mounting substrate 9 can thereby be increased. The solder 13 can thereby be increased in adsorption amount to improve adhesion strength. Also, the solder 13 is adsorbed so as to extend from the front surface of the chip capacitor 1 (front surface of the substrate 2) to the side surfaces and the chip capacitor 1 can thus be held from the respective directions of the front surface and the side surfaces of the substrate 2 in the mounted state. The mounted state of the chip capacitor 1 can thus be stabilized.

The passivation film 40, which is an insulating film, is interposed between the external electrodes 3 and 4 and the side surfaces of the substrate 2. The state of insulation of the external electrodes 3 and 4 and the substrate 2 can thereby be maintained.

Also with the present preferred embodiment, the substrate 2 is rectangular in a plan view and each of the first and second external electrodes 3 and 4 is formed so as to cover the element forming surface 2A edge portions of the three side surfaces 2C, 2E, and 2F or the three side surfaces 2D, 2E, and 2F of the substrate 2. With this arrangement, each of the first and second external electrodes 3 and 4 hold the chip capacitor 1 from the three directions of the side surfaces of the substrate 2 in the state where the chip capacitor 1 is mounted on the mounting substrate 9. The mounted state of the chip capacitor 1 can thereby be stabilized further.

Also with the present preferred embodiment, the trenches 16 having the side wall surfaces 16a intersecting the major surface (element forming surface 2A) of the substrate 2 is formed on the substrate 2 and the capacitance film 20 is formed along the side wall surfaces 16a of the trenches 16. The facing area over which the upper electrode film 21 and the n+-type impurity diffusion layer 15 (lower electrode) face each other across the capacitance film 10 can thereby be increased to enable the capacitor element 5 to be made high in capacitance. The chip capacitor 1 can thereby be made compact in size or high in capacitance.

With the present preferred embodiment, each trench 16 has the bottom wall surface 16b that is continuous to the bottom portions of the side wall surfaces 16a and the plurality of the trenches 16 are formed periodically on the substrate 2. The capacitor element 5 is thereby made even higher in capacitance.

Also with the present preferred embodiment, the upper electrode film 21 includes the polysilicon film 22 that is embedded in the trenches 16. Polysilicon can be embedded with good embedding property inside the fine trenches. Therefore multiple fine trenches of large aspect ratio (ratio of trench opening width to trench depth) can be formed on the major surface (element forming surface 2A) of the substrate 2 and the polysilicon film 22 can be adhered closely to the capacitance film. The capacitor element 5 can thereby be made even higher in capacitance.

Also with the present preferred embodiment, the upper electrode film 21 further includes the metal film 23 that is laminated on the polysilicon film 22. The upper electrode film 21 can thereby be made low in resistivity to enable reduction of the equivalent series resistance of the chip capacitor 1 and improvement of the characteristics.

Also with the present preferred embodiment, the capacitor element 5 includes the plurality of capacitor components C0 to C6. Further the plurality of fuses F1 to F6, which disconnectably connect each of the plurality of the capacitor components C1 to C6 to the first external electrode 3, are provided on the substrate 2. One or a plurality of the capacitor components C1 to C6 can thus be disconnected selectively from the external electrode by selectively cutting one or a plurality of the fuses F1 to F6. A plurality of types of capacitance values can thereby be accommodated easily and rapidly. In other words, chip capacitors 1 of various capacitance values can be realized with a common design by combining the plurality of capacitor components C0 to C6. Also, the plurality of capacitor components C0 to C6 include a plurality of capacitor components that differ in capacitance value and therefore even more capacitance values can be obtained by selective cutting of the fuses F1 to F6 and even more types of capacitance values can be realized with chip capacitors 1 with a common design.

The fuses F1 to F6 are formed at the same layer as the upper electrode film 21 and can therefore be formed by the same process as the upper electrode film 21.

Also with the present preferred embodiment, the plurality of capacitor components C0 to C6 include the basic capacitance element C0 and the plurality of adjusting capacitance elements C1 to C6, and the plurality of adjusting capacitance elements C1 to C6 are respectively connected to the first external electrode 3 via the plurality of fuses F1 to F6. Therefore one or a plurality of the adjusting capacitance elements C1 to C6 can be disconnected selectively from the first external electrode 3 by selectively cutting the fuses F1 to F6. The overall capacitance value of the chip capacitor 1 is thereby determined by the capacitance of the basic capacitance element C0 and the capacitances of the adjusting capacitance elements C1 to C6 connected via the fuses F1 to F6 to the external electrode 3.

Also with the present preferred embodiment, the adjusting capacitance elements C1 to C6, having mutually parallel strip shapes, have one ends thereof aligned at the side of the first external electrode 3 and are lined up in order of length. On the other hand, the basic capacitance element C0 has the connection portion 30A to the first external electrode 3 disposed adjacent to the shortest adjusting capacitance element C1 and has the main portion 30B disposed in the space in which the plurality of adjusting capacitance elements C1 to C6 are not disposed. In accordance with the space in which the adjusting capacitance elements C1 to C6 are not disposed, the main portion 30B widens with distance away from the connection portion 30A and as the second external electrode 4 is approached. The adjusting capacitance elements C1 to C6 and the basic capacitance element C0 can thereby be disposed while making efficient use of the limited region on the substrate 2. The chip capacitor 1 of compact size and high capacitance can thereby be realized.

An arrangement in which the connection portion 30A is disposed adjacent to the longest adjusting capacitance element C6 may also be considered. However, with this arrangement, the connection portion 30A must extend around the long adjusting capacitance element C6 to reach the main portion 30B disposed in the available space in which the plurality of adjusting capacitance elements C1 to C6 are not disposed. The connection portion 30A is thus made long in length and the electrical resistance of the connection portion 30A may increase, and the equivalent series resistance of the chip capacitor 1 may thus increase. In the present preferred embodiment, by disposing the connection portion 30A adjacent to the shortest adjusting capacitance element C1, this problem can be avoided to provide the chip capacitor 1 with excellent characteristics.

Figure 10A:
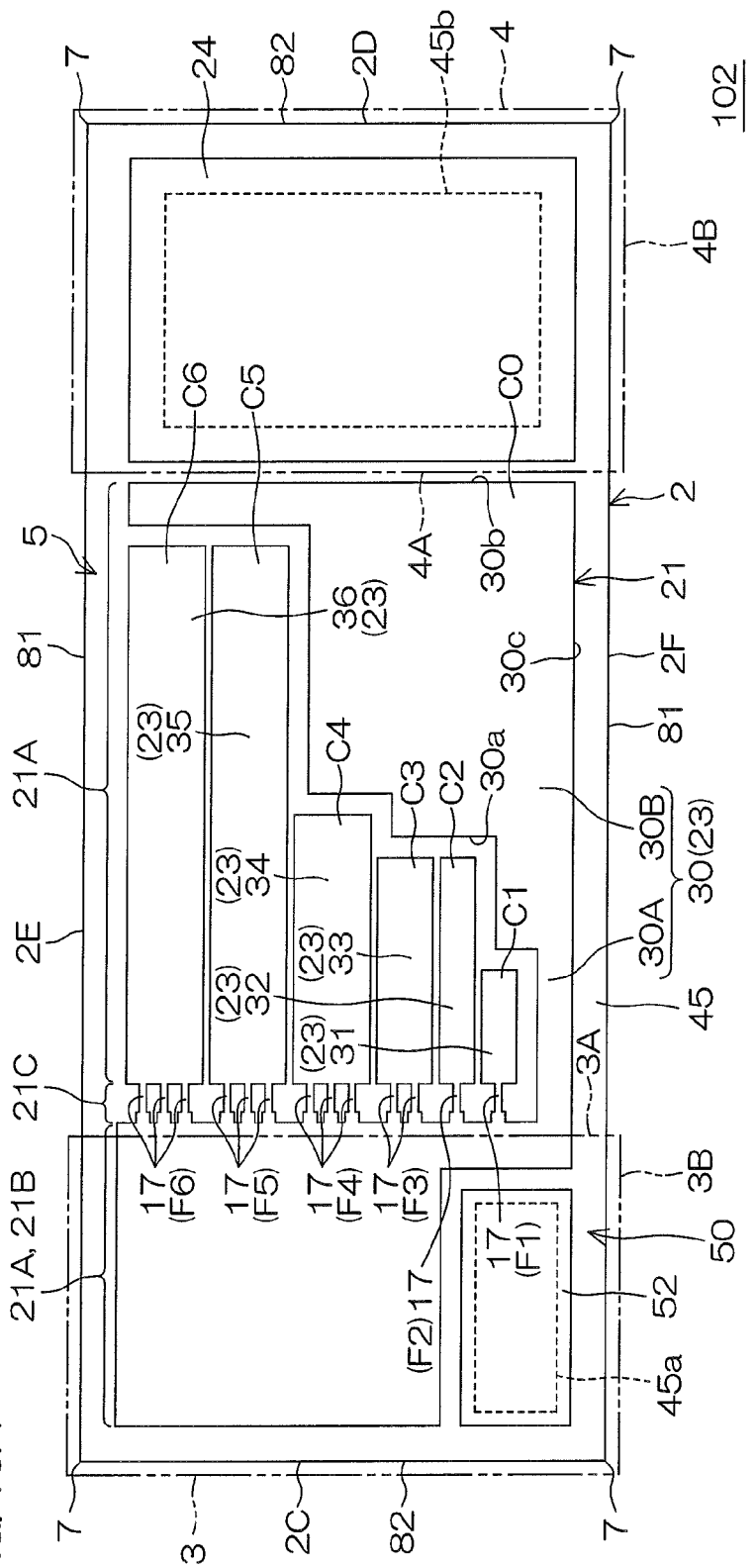
FIG. 10A is a plan view for describing the internal arrangement of a chip capacitor according to a second preferred embodiment of the present invention.
Figure 10C:
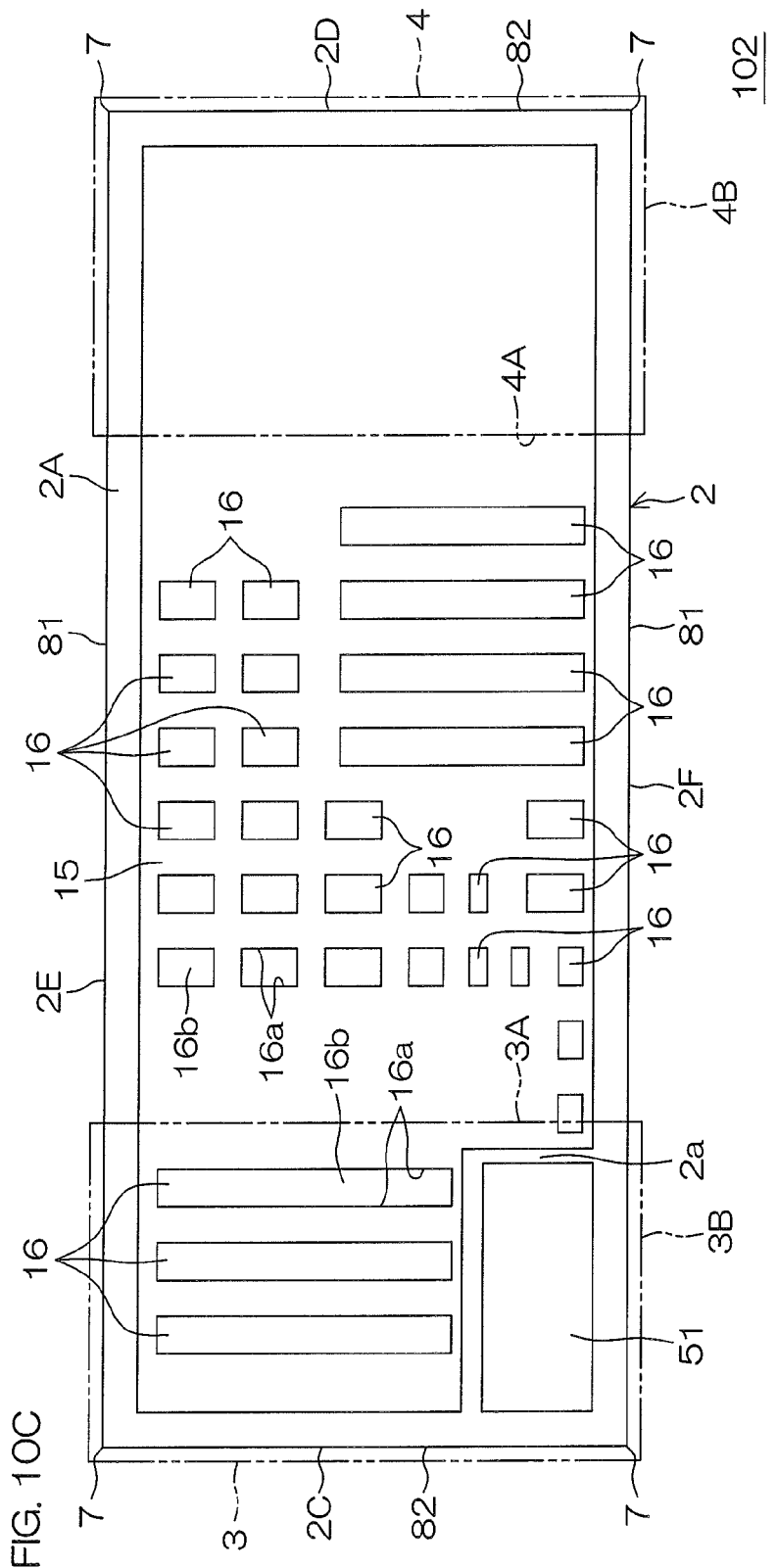
FIG. 10C is a plan view for describing the internal arrangement of the chip capacitor according to the second preferred embodiment.

FIG. 10A, FIG. 10B, and FIG. 10C are plan views for describing the arrangement of a chip capacitor 102 according to a second preferred embodiment of the present invention. In FIG. 10A, FIG. 10B, and FIG. 10C, portions corresponding to respective portions of the chip capacitor 1 according to the first preferred embodiment described above are indicated using the same reference symbols. FIG. 10A shows the layout of the upper electrode, etc., of the capacitor element 5, FIG. 10B shows the layout of the polysilicon film constituting a lower layer side of the upper electrode of the capacitor element 5, and FIG. 10C shows the layout of the $n^+$-type impurity diffusion layer, functioning as the lower electrode, etc., of the capacitor element 5.

In the present preferred embodiment, as shown in FIG. 10C, the entirety of the $n^+$-type impurity diffusion layer 51 for the bidirectional diode 50 is disposed in a region directly below the first external electrode 3. Further, in the $n^+$-type impurity diffusion layer 15 functioning as the lower electrode of the capacitor element 5, the entirety of the edge portion facing the $n^+$-type impurity diffusion layer 51 is disposed in the region directly below the first external electrode 3. The entirety of the p-type region 2a positioned between the $n^+$-type impurity diffusion layers 51 and 15 is also formed directly below the first external electrode 3. The entirety of the bidirectional diode 50 is thereby disposed directly below the first external electrode 3.

In the present preferred embodiment, the $n^+$-type impurity diffusion layer 51 has a rectangular shape with two parallel sides being parallel to the long sides 3A of the first external electrode 3 and the other two parallel sides being parallel to the short sides 3B of the first external electrode 3. The $n^+$-type impurity diffusion layer 51 is disposed near one of the corner portions 7 of the substrate 2. On the other hand, the $n^+$-type impurity diffusion layer 15 has a rectangular notched portion formed so as to border the $n^+$-type impurity diffusion layer 51 across an interval in a region directly below the first external electrode 3, and the $n^+$-type impurity diffusion layer 51 is disposed in the notched portion. The p-type region 2a sandwiched by the $n^+$-type impurity diffusion layers 51 and 15 is thus formed to a hook shape (L shape) that is bent at a right angle along two sides of the rectangular $n^+$-type impurity diffusion layer 51. However, the shape of the $n^+$-type impurity diffusion layer 51 shown in FIG. 10C is but one example and, for example, a comb-shaped $n^+$-type impurity diffusion layer 51 may be formed in the region directly below the first external electrode 3 in order to make the n⁺-type impurity diffusion layer 51 long in peripheral length.

As shown in FIG. 10B, the polysilicon film 22 constituting the upper electrode film 21 of the capacitor element 5 is formed so as to avoid the n⁺-type impurity diffusion layer 51 and match the shape of the n⁺-type impurity diffusion layer 15. Specifically, the polysilicon film 22 has, in the region directly below the first external electrode 3, a notched portion (a rectangular notched portion in the present preferred embodiment) corresponding to the n⁺-type impurity diffusion layer 51. Directly above the n⁺-type impurity diffusion layer 51, an opening 20a is formed in capacitance film 20.

As shown in FIG. 10A, the metal film 23 constituting the upper electrode film 21 of the capacitor element 5 is formed so as to avoid a region directly above the n⁺-type impurity diffusion layer 51 and match the shape of the n⁺-type impurity diffusion layer 15. Specifically, the metal film 23 has, in the region directly below the first external electrode 3, a notched portion (a rectangular notched portion in the present preferred embodiment) corresponding to the n⁺-type impurity diffusion layer 51. The wiring film 52 is formed directly above the n⁺-type impurity diffusion layer 51. In the present preferred embodiment, the wiring film 52 is positioned entirely in the region directly below the first external electrode 3 and has a rectangular shape matching the shape of the n⁺-type impurity diffusion layer 51. The wiring film 52 is joined to the n⁺-type impurity diffusion layer 51 via the opening 20a of the capacitance film 20.

As described above, with the first preferred embodiment, a portion of the n⁺-type impurity diffusion layer 51 that constitutes the bidirectional diode 50 is disposed in the region directly below the first external electrode 3 and another portion is disposed in the region between the first external electrode 3 and the second external electrode 4. On the other hand, with the present preferred embodiment, the entirety of the n⁺-type impurity diffusion layer 51 that constitutes the bidirectional diode 50 is disposed in the region directly below the first external electrode 3 and the entirety of the bidirectional diode 50 is positioned directly below the first external electrode 3. The bidirectional diode 50 connected in parallel to the capacitor element 5 can thereby be incorporated inside the chip without using the region between the first and second external electrodes 3 and 4. The region between the first and second external electrodes 3 and 4 can thus be used mainly for the capacitor element 5 to enable the electrostatic breakdown tolerance to be improved while making the chip capacitor 102 small in size and/or high in capacitance.

Figure 11:
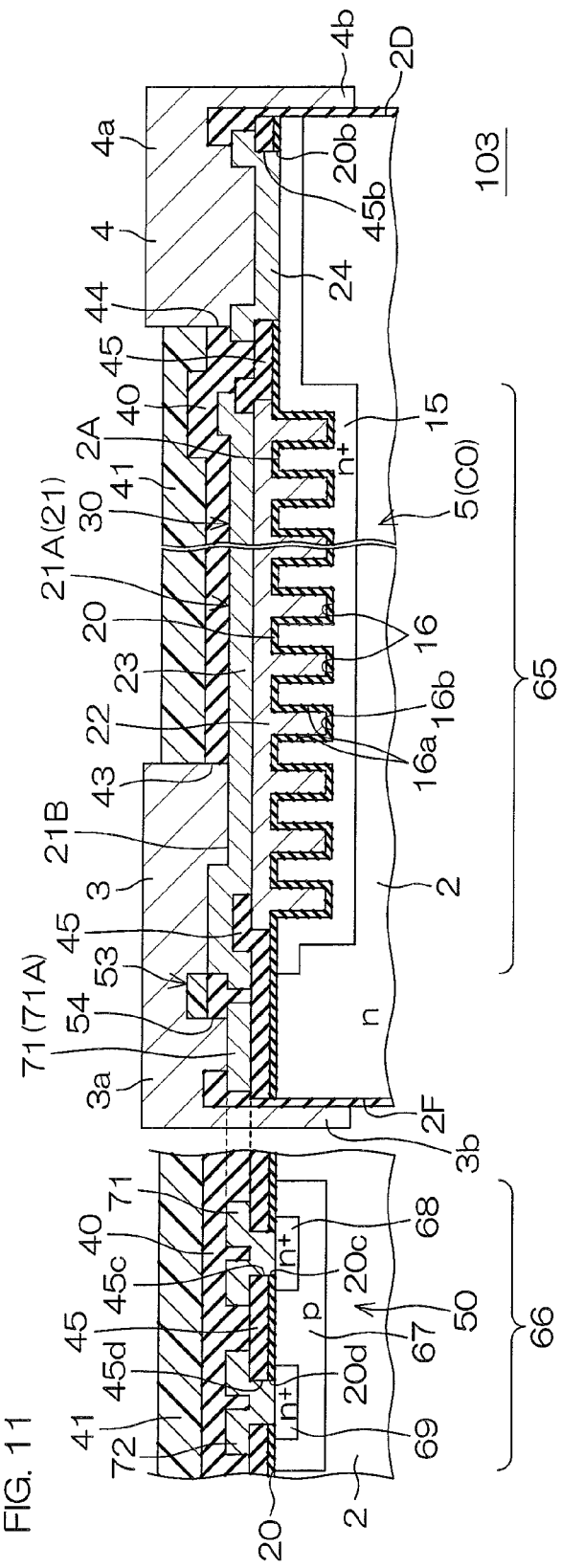
FIG. 11 is a sectional view (sectional view taken along XI-XI in FIG. 12) for describing the arrangement of a chip capacitor according to a third preferred embodiment of the present invention.
Figure 12B:
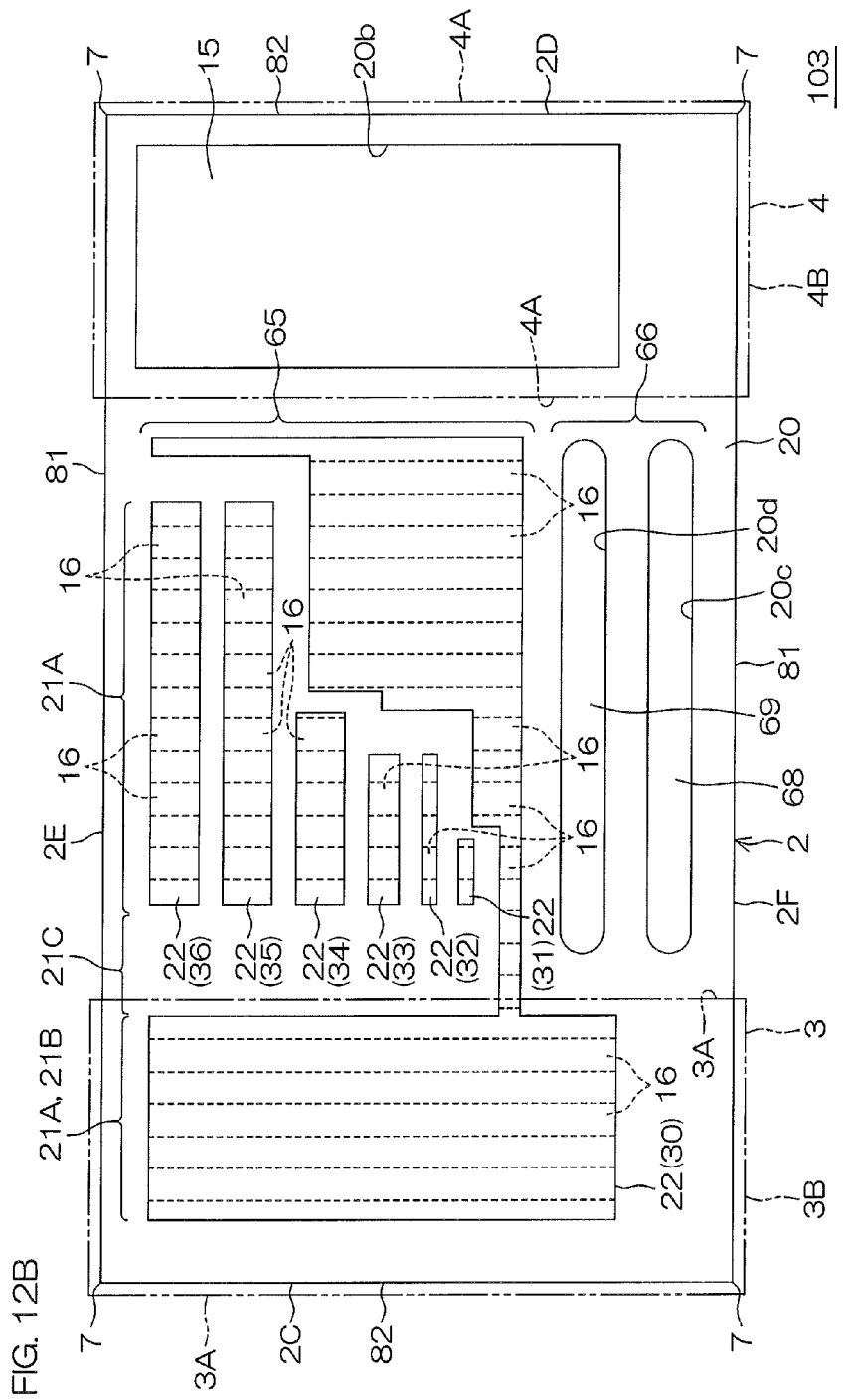

FIG. 11 is a sectional view for describing the arrangement of a chip capacitor 103 according to a third preferred embodiment of the present invention. Also, FIG. 12A, FIG. 12B, and FIG. 12C are plan views for describing the layout of the wiring, etc. A section taken along section line XI-XI in FIG. 12A is shown in FIG. 11. In FIG. 11 and FIG. 12, portions corresponding to respective portions shown in FIG. 2A, FIG. 2B, FIG. 2C, and FIG. 3 are provided with the same reference symbols. FIG. 12A shows the layout of the upper electrode, etc., of the capacitor element 5, FIG. 12B shows the layout of the polysilicon film constituting a lower layer side of the upper electrode of the capacitor element 5, and FIG. 12C shows the layout of the n⁺-type impurity diffusion layer, functioning as the lower electrode, etc., of the capacitor element 5.

In the present preferred embodiment, the bidirectional diode 50 is formed in a region besides the region directly below the first external electrode 3. Specifically, a capacitor region 65 and a diode region 66 are set in a region between the first and second external electrodes 3 and 4. The capacitor region 65 extends from the region between the first and second external electrodes 3 and 4 to the region directly below the first external electrode 3. The capacitor element 5 is formed in the capacitor region 65. The diode region 66 is disposed inside the region between the first and second external electrodes 3 and 4. Specifically, the diode region 66 may be a rectangular region set at an edge portion in a vicinity of one long side 81 of the substrate 2. The bidirectional diode 50 is formed in the diode region 66.

In the present preferred embodiment, the substrate 2 is an n-type semiconductor substrate (more specifically, an n-type silicon substrate). In the diode region 66, a p-type impurity diffusion layer 67 is formed at a surface layer portion of the substrate 2. Inside the p-type impurity diffusion layer 67, a pair of n⁺-type impurity diffusion layers 68 and 69 are formed across an interval. The p-type impurity diffusion layer 67 is thereby sandwiched between the pair of n⁺-type impurity diffusion layers 68 and 69 to form a pair of pn junctions. The bidirectional diode 50 of the arrangement where the pair of pn junction diodes are serially connected in opposite directions is thus arranged. The pair of n⁺-type impurity diffusion layers 68 and 69 are formed to band shapes extending along the direction in which the first external electrode 3 and the second external electrode 4 face each other.

The capacitance film 20 and the insulating film 45 are formed so as to cover front surfaces of the p-type impurity diffusion layer 67 and the pair of n⁺-type impurity diffusion layers 68 and 69. Openings 20c and 45c and openings 20d and 45d, respectively exposing the pair of n⁺-type impurity diffusion layers 68 and 69, are formed in the capacitance film 20 and the insulating film 45. The openings 20c and 45c extend in band shapes along the n⁺-type impurity diffusion layer 68. Similarly, the openings 20d and 45d extend in band shapes along the n⁺-type impurity diffusion layer 69. A wiring film 71 is formed so as to contact the n⁺-type impurity diffusion layer 68 via the openings 20c and 45c, and another wiring film 72 is formed so as to contact the other n⁺-type impurity diffusion layer 69 via the other openings 20d and 45d. The wiring films 71 and 72 are preferably formed of the same metal material and at the same layer as the metal film 23 of the upper electrode film 21. The wiring films 71 and 72 can thereby be formed in the same process as the metal film 23.

The wiring film 71 extends in a band shape along the n⁺-type impurity diffusion layer 68 and enters the region directly below the first external electrode 3. In the wiring film 71, the region directly below the first external electrode 3 is a pad region 71A. Directly above the pad region 71A, the pad opening 54 is formed in the passivation film 40 and the resin film 41. The first external electrode 3 is joined to the pad region 71A of the wiring film 71 via the pad opening 54. The wiring film 71 is insulated from the pad region 21B of the upper electrode film 21 and the insulating layer 53 is positioned between the pad regions 71A and 21B.

The wiring film 72 extends in a band shape along the n⁺-type impurity diffusion layer 69 and is made integral to the pad metal film 24. The wiring film 72 is thus connected to the second external electrode 4.

The bidirectional diode 50 is thus connected between the first and second external electrodes 3 and 4 via the wiring films 71 and 72. The chip capacitor 103 with the structure in which the capacitor element 5 and the bidirectional diode 50 are connected in parallel between the first and second external electrodes 3 and 4 is thus arranged. The chip capacitor 103 exhibits the same actions and effects as the chip capacitor 1 according to the first preferred embodiment. In addition, each of the pair of n$^+$-type impurity diffusion layers 68 and 69 has a long peripheral length to enable improvement of durability against a large current. The chip capacitor 103 with an even higher electrostatic breakdown tolerance can thereby be provided.

FIG. 13 is a sectional view for describing the arrangement of a chip capacitor 104 according to a fourth preferred embodiment of the present invention. In FIG. 13, portions corresponding to respective portions shown in FIG. 11 are provided with the same reference symbols. In the present preferred embodiment, the insulating film 45 extends broadly in the region directly below the first external electrode 3 and, in particular, is formed directly below the pad region 21B (first pad portion).

With this arrangement, even when the inspection probe 60 (see FIG. 9B) penetrates through the metal film 23 when the inspection probe 60 is put in contact with the metal film 23 of the pad region 21B to measure the capacitance value, flawing of the polysilicon film 22 and the capacitance film 20 will not occur. A malfunction due to measurement of the capacitance value can thus be avoided.

However, with the arrangement shown in FIG. 11, the metal film 23 contacts the polysilicon film 22 over a wider area and the electrical resistance of the upper electrode film 21 is therefore low, enabling the capacitor element 5 to be made low in equivalent series resistance and have satisfactory characteristics (especially, high frequency characteristics).

The arrangement shown in FIG. 3 may also be modified in the same manner as in the arrangement of FIG. 13 with the insulating film 45 being disposed in the region directly below the first external electrode 3 and especially directly below the pad region 21B.

Figure 14:
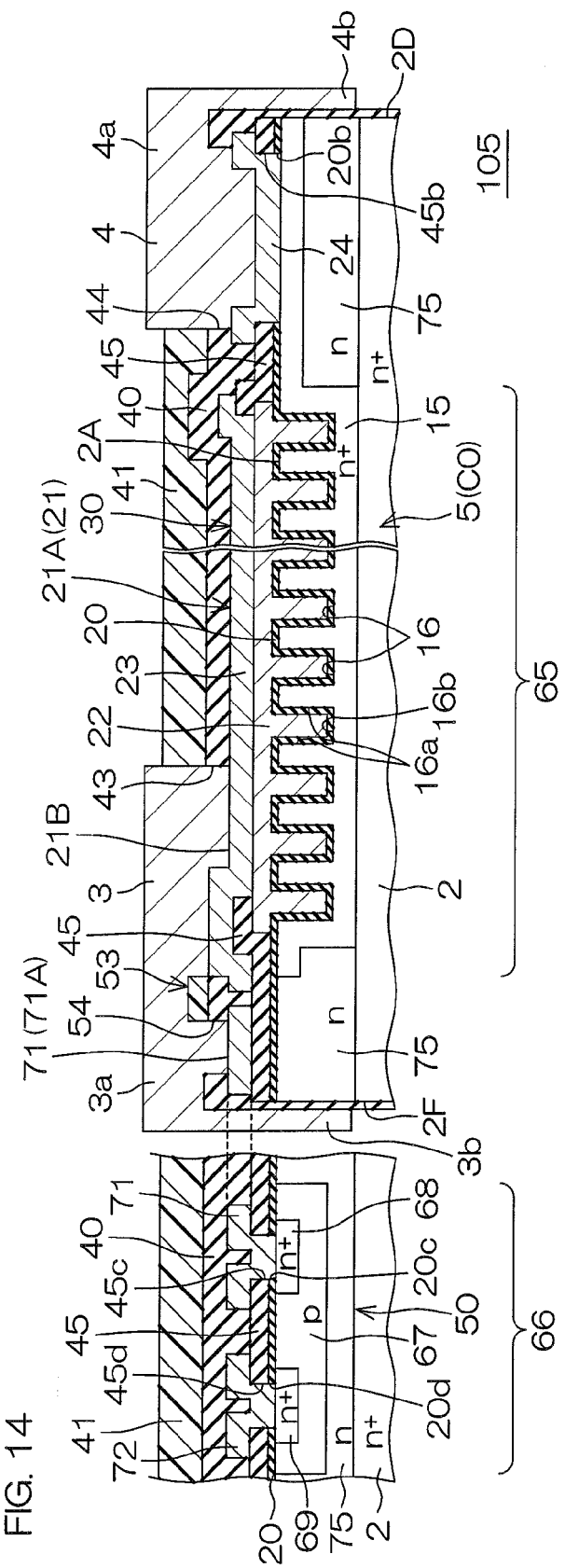
FIG. 14 is a sectional view for describing the arrangement of a chip capacitor according to a fifth preferred embodiment of the present invention.

FIG. 14 is a sectional view for describing the arrangement of a chip capacitor 105 according to a fifth preferred embodiment of the present invention. In FIG. 14, portions corresponding to respective portions shown in FIG. 11 are provided with the same reference symbols.

In the present preferred embodiment, an n$^+$-type silicon substrate, which is a semiconductor substrate that has been made low in resistance, is used as the substrate 2. An n-type silicon epitaxial layer 75 is formed on the n$^+$-type silicon substrate 2. The n$^+$-type impurity diffusion layer 15 is formed in the n-type silicon epitaxial layer 75 and made to function as the lower electrode of the capacitor element 5. The n$^+$-type impurity diffusion layer 15 contacts the n$^+$-type silicon substrate 2. Further, the p-type impurity diffusion layer 67 is formed at a surface layer portion of the n-type silicon epitaxial layer 75. The pair of n$^+$-type impurity diffusion layers 68 and 69 are formed across an interval inside the p-type impurity diffusion layer 67 to constitute the bidirectional diode 50.

With this arrangement, the resistance value of the lower electrode of the capacitor element 5 is made low by the n$^+$-type impurity diffusion layer 15 being in contact with the n$^+$-type silicon substrate 2. Consequently, the equivalent series resistance of the chip capacitor 105 can be reduced significantly to enable the chip capacitor 105 of even better characteristics to be provided.

The same modifications are possible with the first, second, and fourth preferred embodiments.

Figure 15:
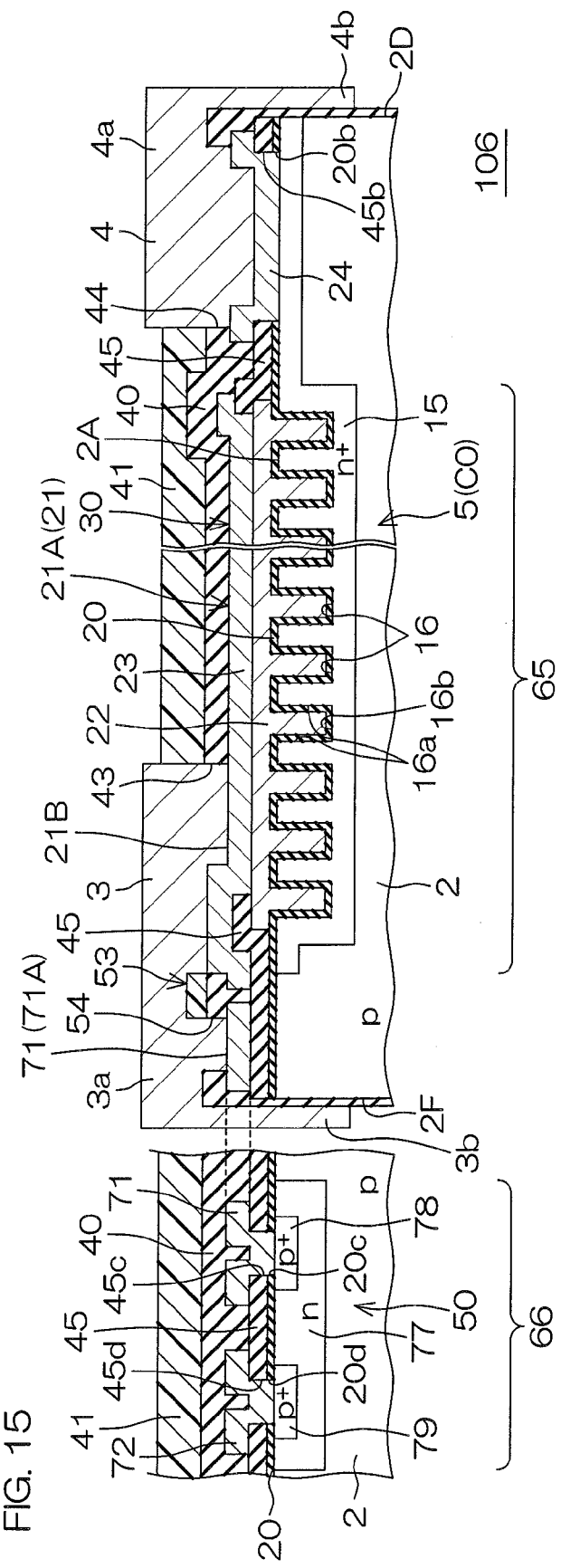
FIG. 15 is a sectional view for describing the arrangement of a chip capacitor according to a sixth preferred embodiment of the present invention.

FIG. 15 is a sectional view for describing the arrangement of a chip capacitor 106 according to a sixth preferred embodiment of the present invention. In FIG. 15, portions corresponding to respective portions shown in FIG. 11 are provided with the same reference symbols.

In the present preferred embodiment, the substrate 2 is constituted of a p-type semiconductor substrate (specifically, a p-type silicon substrate). The n$^+$-type impurity diffusion layer 15 that constitutes the lower electrode of the capacitor element 5 is formed at a surface layer portion of the p-type semiconductor substrate 2. Further, in the diode region 66, an n-type impurity diffusion layer 77 is formed at a surface layer portion of the p-type semiconductor substrate 2. A pair of p$^+$-type impurity diffusion layers 78 and 79 are formed across an interval inside the n-type impurity diffusion layer 77. An n-type region (a portion of the n-type impurity diffusion layer 77) is thus interposed between the pair of p$^+$-type impurity diffusion layers 78 and 79 to constitute the bidirectional diode 50. That is, pn junctions are formed respectively between the pair of p$^+$-type impurity diffusion layers 78 and 79 and the n-type region and the bidirectional diode 50 of the form where the pair of pn junction diodes are serially connected in opposite directions is thereby arranged.

A substrate having a p-type silicon epitaxial layer formed on the front surface of a silicon substrate may be used in place of the p-type semiconductor substrate. The n$^+$-type impurity diffusion layer 15 and the bidirectional diode 50 may be formed on the p-type silicon epitaxial layer.

Figure 16:
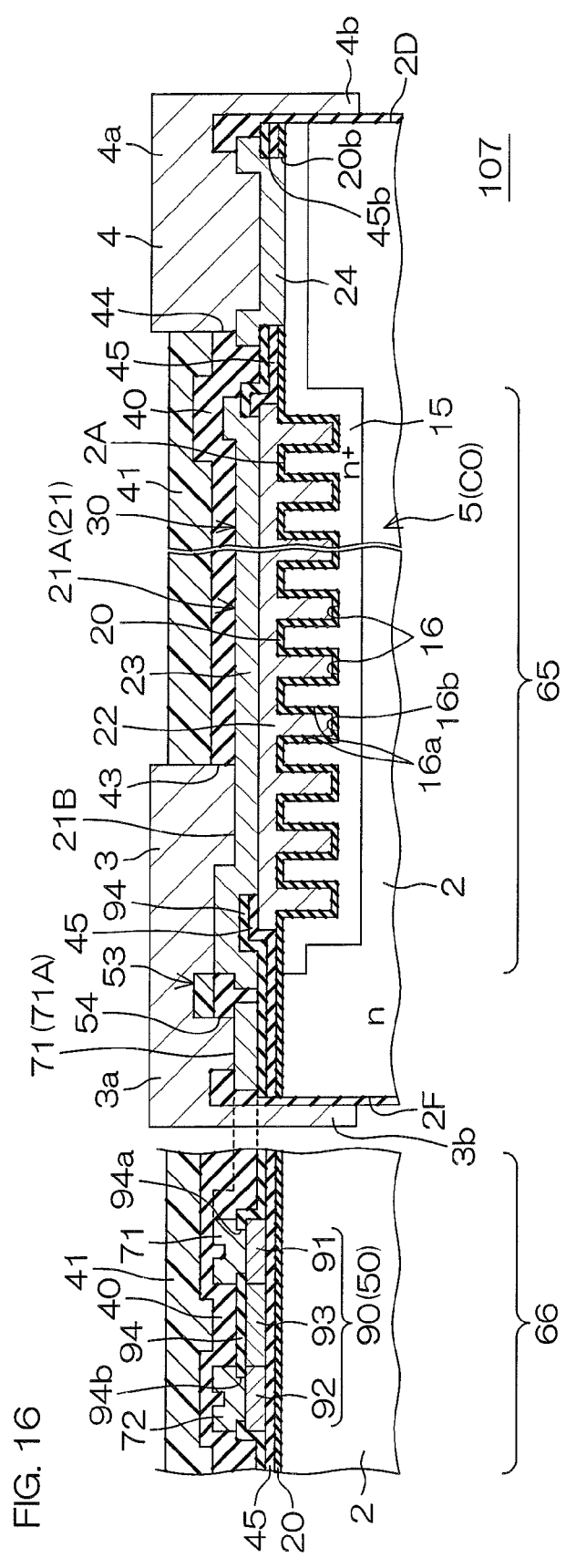

FIG. 16 is a sectional view for describing the arrangement of a chip capacitor 107 according to a seventh preferred embodiment of the present invention. In FIG. 16, portions corresponding to respective portions shown in FIG. 11 are provided with the same reference symbols.

In the present preferred embodiment, the bidirectional diode 50 is constituted of a polysilicon film 90 formed on the insulating film 45. Specifically, in the diode region 66, the polysilicon film 90 is formed on the insulating film 45. The polysilicon film 90 has a pair of n-type polysilicon regions 91 and 92, in which an n-type impurity is diffused, and a p-type polysilicon region 93, disposed between the pair of n-type polysilicon regions 91 and 92 and in which a p-type impurity is diffused. pn junctions are thus formed respectively between the p-type polysilicon region 93 and the pair of n-type polysilicon regions 91 and 92. The bidirectional diode 50 in which the pair of pn junction diodes are serially connected in opposite directions is thereby arranged. The bidirectional diode 50 is thus arranged outside the substrate 2 by using the polysilicon film 90 in the present preferred embodiment.

An interlayer insulating film 94 is formed so as to cover the polysilicon film 90. A pair of openings 94a and 94b respectively exposing the pair of n-type polysilicon regions 91 and 92 are formed in the insulating film 94. The wiring film 71 having the pad region 71A directly below the first external electrode 3 enters into the one opening 94a and is bonded to the n-type polysilicon region 91. The wiring film 72 continuous to the pad metal film 24 directly below the second external electrode 4 enters into the other opening 94b and is bonded to the n-type polysilicon region 92. The passivation film 40 is formed so as to cover the interlayer insulating film 94.

The substrate 2 may be an n-type silicon substrate or a p-type silicon substrate or may be a substrate with which an n-type or p-type silicon epitaxial layer is formed on the front surface of a silicon substrate.

Figure 17:
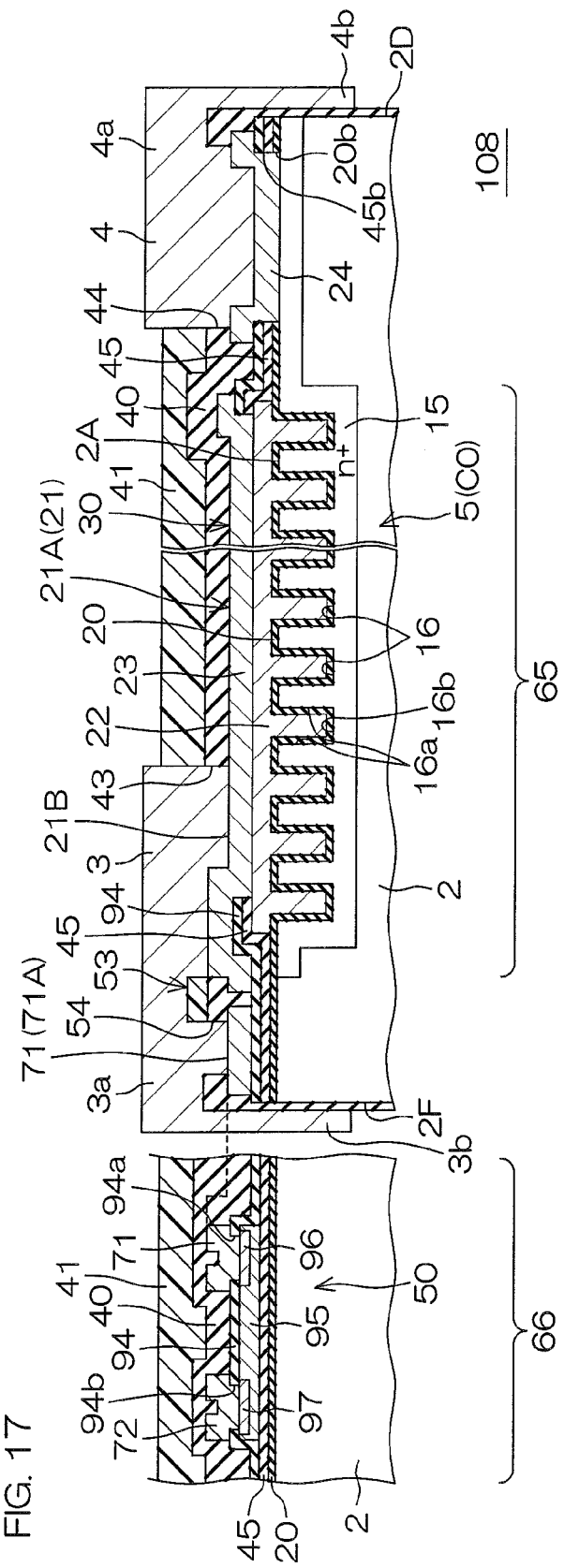
FIG. 17 is a sectional view for describing the arrangement of a chip capacitor according to an eighth preferred embodiment of the present invention.

FIG. 17 is a sectional view for describing the arrangement of a chip capacitor 108 according to an eighth preferred embodiment of the present invention. In FIG. 17, portions corresponding to respective portions shown in FIG. 16 are provided with the same reference symbols.

In the present preferred embodiment, a p-type polysilicon film 95 is formed in the diode region 66 and a pair of n-type diffusion regions 96 and 97 are formed across an interval at a surface layer portion thereof. A p-type region (the p-type polysilicon film 95) is thus interposed between the pair of n-type diffusion regions 96 and 97 to form a pair of pn junctions. The bidirectional diode 50 in which the pair of pn junction diodes are serially connected in opposite directions is thereby arranged.

Figure 18:
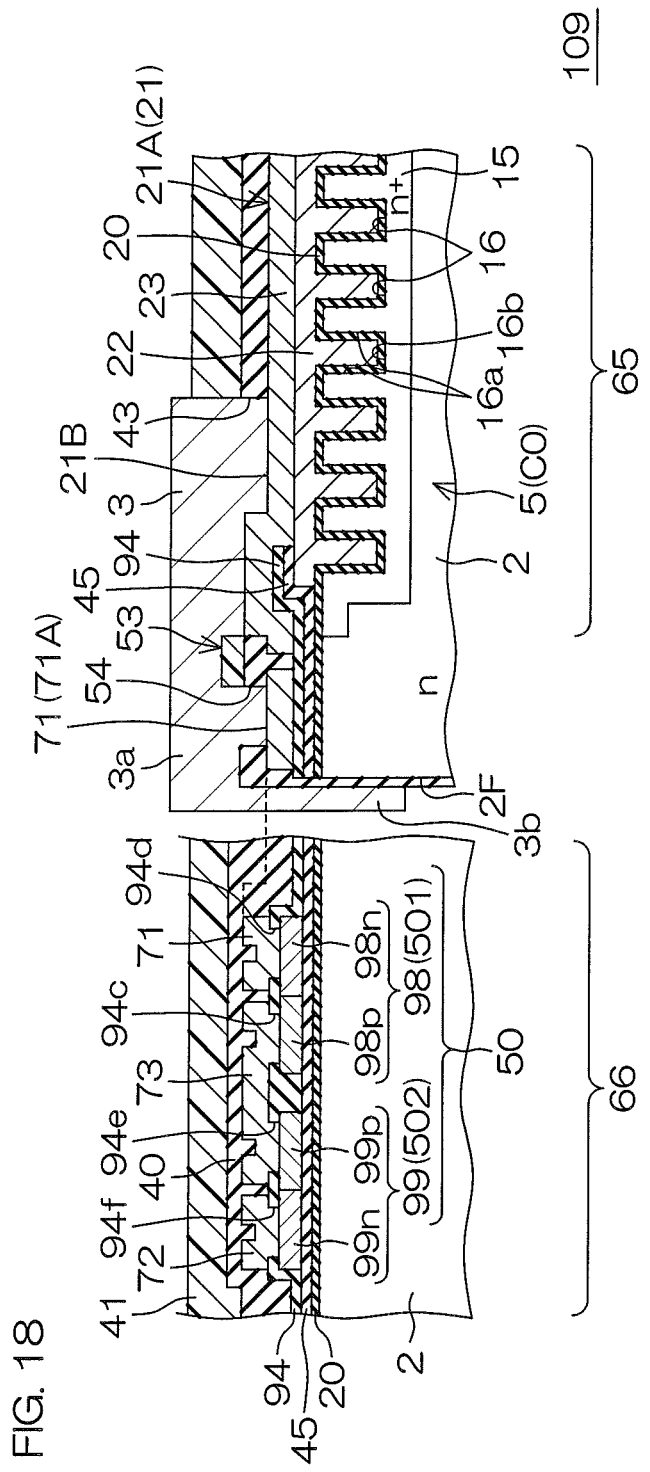
FIG. 18 is a sectional view for describing the arrangement of a chip capacitor according to a ninth preferred embodiment of the present invention.

FIG. 18 is a sectional view for describing the arrangement of a chip capacitor 109 according to a ninth preferred embodiment of the present invention. In FIG. 18, portions corresponding to respective portions shown in FIG. 16 are provided with the same reference symbols.

The present preferred embodiment includes a first diode 501 and a second diode 502 respectively constituted of a first polysilicon film 98 and a second polysilicon film 99 formed so as to be separated inside the diode region 66. The first polysilicon film 98 has a p-type region 98p, in which a p-type impurity is diffused, and an n-type region 98n, in which an n-type impurity is diffused, and these are in contact with each other to form the first diode 501 that is constituted of a pn junction diode. Similarly, the second polysilicon film 99 also has a p-type region 99p, in which a p-type impurity is diffused, and an n-type region 99n, in which an n-type impurity is diffused, and these are in contact with each other to form the second diode 502 that is constituted of a pn junction diode.

The first and second diodes 501 and 502 are covered by the interlayer insulating film 94. Openings 94c and 94d, respectively exposing the p-type region 98p and the n-type region 98n of the first diode 501, and openings 94e and 94f, respectively exposing the p-type region 99p and the n-type region 99n of the second diode 502, are formed across an interval in the interlayer insulating film 94. The wiring film 71 having the pad region 71A directly below the first external electrode 3 is formed on the interlayer insulating film 94, and the wiring film 71 enters into the opening 94d and is bonded to the n-type region 98n of the first diode 501. Further, the wiring film 72 continuous to the pad metal film 24 directly below the second external electrode 4 is formed on the interlayer insulating film 94, and the wiring film 72 enters into the opening 94f and is bonded to the n-type region 99n of the second diode 502. Further, a wiring film 73, formed on the interlayer insulating film 94 and insulated from the wiring films 71 and 72, enters into the openings 94c and 94e and is bonded to the p-type region 98p of the first diode 501 and the p-type region 99p of the second diode 502.

The first and second diodes 501 and 502 thus constitute the bidirectional diode 50 serially connected in opposite directions by the wiring film 73. The bidirectional diode 50 is connected between the first and second external electrodes 3 and 4 via the wiring films 71 and 72.

Figure 19:
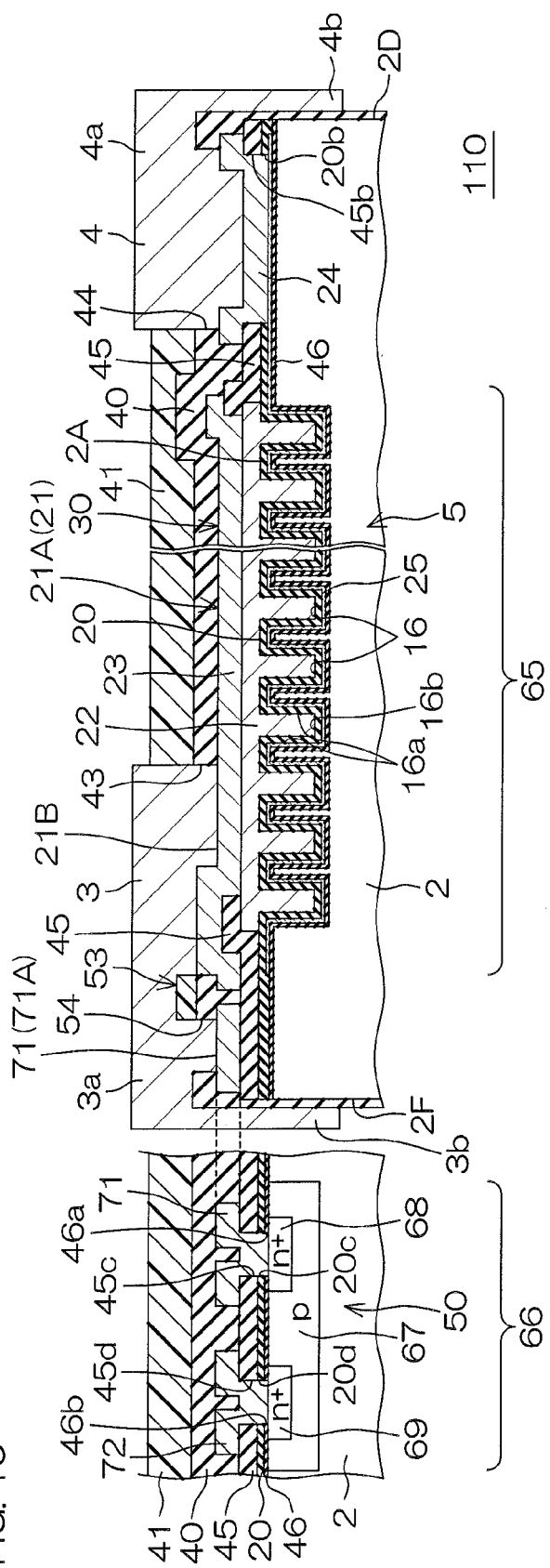
FIG. 19 is a sectional view for describing the arrangement of a chip capacitor according to a tenth preferred embodiment of the present invention.

FIG. 19 is a sectional view for describing the arrangement of a chip capacitor 110 according to a tenth preferred embodiment of the present invention. In FIG. 19, portions corresponding to respective portions shown in FIG. 11 are provided with the same reference symbols. In the present preferred embodiment, an insulating film 46 is formed on the element forming surface 2A of the substrate 2 that is constituted of a semiconductor substrate. Besides having openings 46a and 46b that expose the $n^+$-type impurity diffusion layers 68 and 69 of the diode region 66, the insulating film 46 covers substantially the entirety of the element forming surface 2A and the insulating film 46 is also formed in a region directly below the second external electrode 4. The insulating film 46 is formed so that its surface at one side and surface at the other side conform to the element forming surface 2A of the substrate 2, and in a region in which a trench 16 is formed, conforms to the side wall surfaces 16a and bottom wall surface 16b. The insulating film 46 may, for example, be constituted of an oxide film, such as a silicon oxide film, etc. The film thickness thereof may be approximately 500 to 2000 Å.

A lower electrode film 25 that constitutes the lower electrode of the capacitor components C0 to C6 is formed on a front surface of the insulating film 46. The lower electrode film 25 is constituted of a film of a metal, such as aluminum, etc. (or more specifically, Al, Al—Si, Al—Si—Cu, W, TiN, etc.). The lower electrode film 25 is formed so that its surface at one side and surface at the other side conform to the front surface of the substrate 2. The lower electrode film 25 is continuous across all regions in which the capacitor components C0 to C6 are formed and is further connected to the pad metal film 24 directly below the second external electrode 4. The capacitance film 20 is laminated on the front surface of the lower electrode film 25. By such an arrangement, a chip capacitor that is substantially equivalent electrically to the arrangement of FIG. 11 can be provided.

Figure 20:
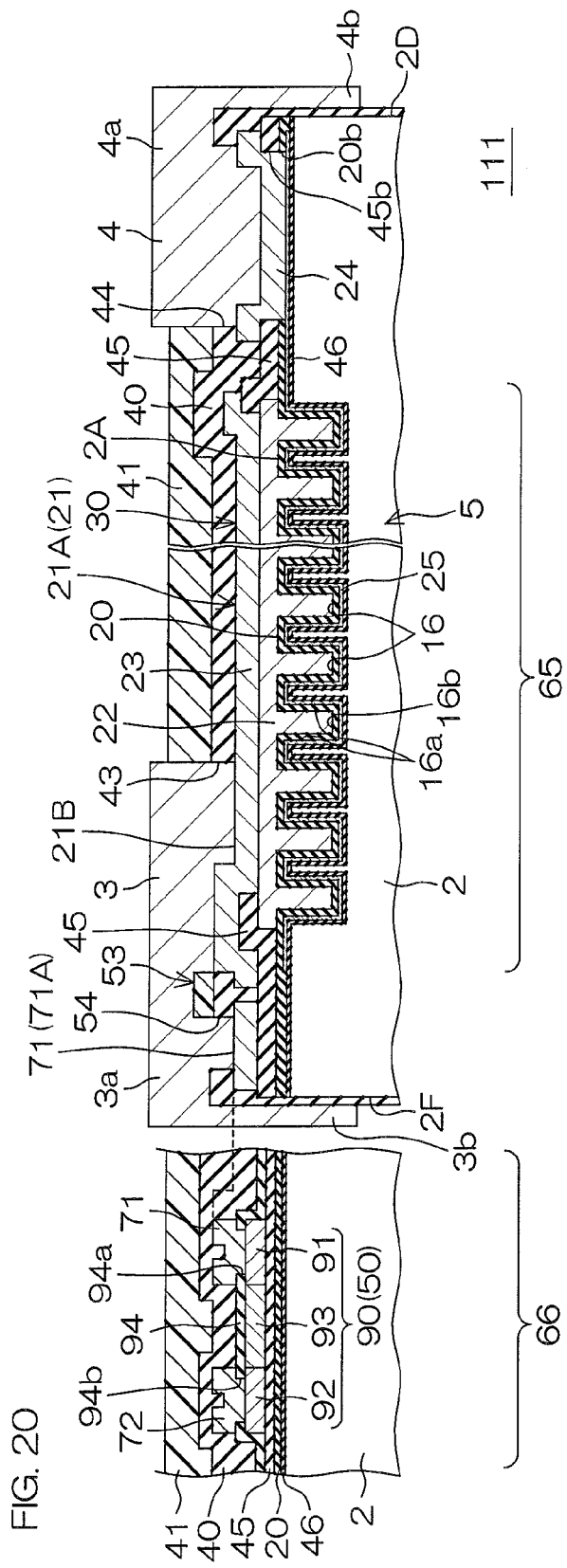
FIG. 20 is a sectional view for describing the arrangement of a chip capacitor according to an eleventh preferred embodiment of the present invention.

FIG. 20 is a sectional view for describing the arrangement of a chip capacitor 111 according to an eleventh preferred embodiment of the present invention. In FIG. 20, portions corresponding to respective portions shown in FIG. 19 and FIG. 16 are provided with the same reference symbols.

In the present preferred embodiment, the insulating film 46 is formed on the front surface of the substrate 2 and the lower electrode film 25 is formed thereon as in the tenth preferred embodiment (FIG. 19). Further, the bidirectional diode 50, formed by the polysilicon film 90 is formed outside the substrate 2 as in the seventh preferred embodiment (FIG. 16).

Therefore as the substrate 2, an insulating substrate, such as a glass substrate or a resin film etc., may be used besides a semiconductor substrate as represented by a silicon substrate.

Figure 21:
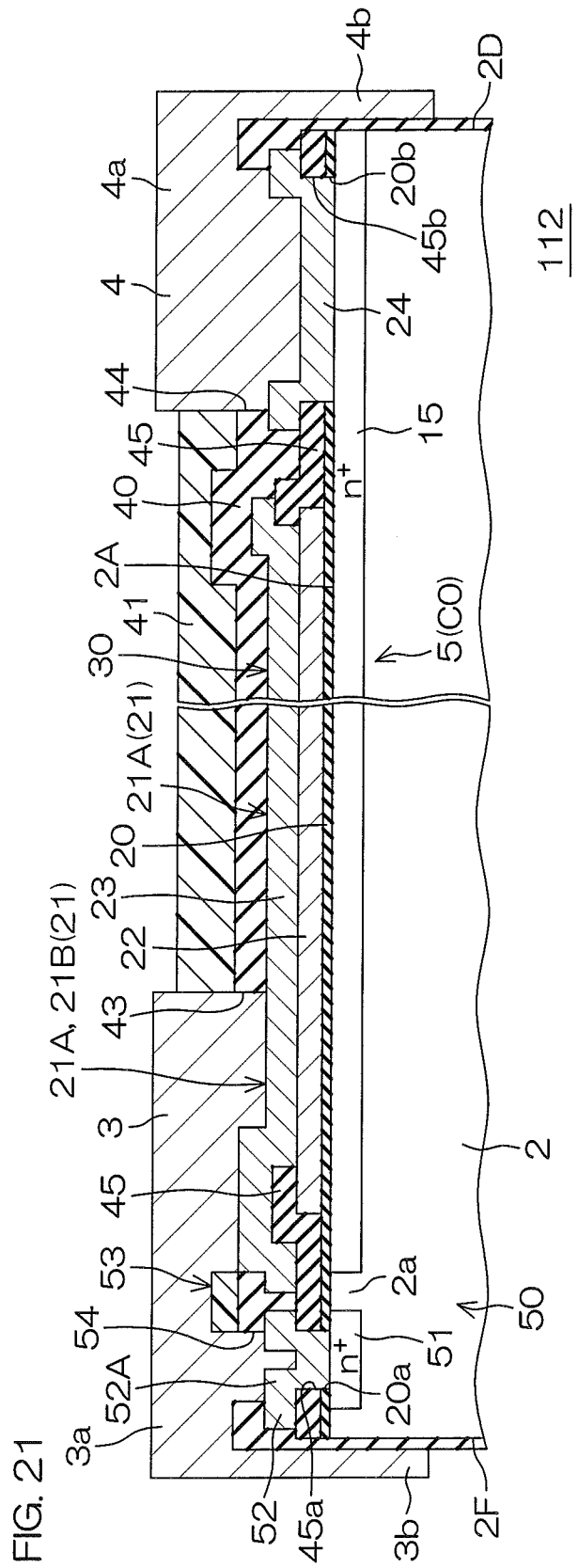
FIG. 21 is a sectional view for describing the arrangement of a chip capacitor according to a twelfth preferred embodiment of the present invention.

FIG. 21 is a sectional view for describing the arrangement of a chip capacitor 112 according to a twelfth preferred embodiment of the present invention. In FIG. 21, portions corresponding to respective portions shown in FIG. 3 are provided with the same reference symbols. In the present preferred embodiment, trenches are not formed in the substrate 2 and the substrate 2 has a flat element forming surface 2A. The present invention can be applied to such a planar type arrangement as well.

Although preferred embodiments of the present invention have been described above, the present invention may be implemented in yet other modes as illustrated by the following several examples.

(1) Although with each of the preferred embodiments described above, an example where the capacitor element includes a plurality of capacitor components was illustrated, the capacitor element may be constituted of a single capacitor component. In the case where the capacitor element includes a plurality of capacitor components, the number of the capacitor components is not restricted to seven as illustrated in the preferred embodiments and may be two to six or not less than eight.

(2) Although with each of the preferred embodiments, one capacitor component (the basic capacitance element) is connected to an external electrode without being connected via a fuse and the other capacitor components (the adjusting capacitance elements) are connected to the external electrode via fuses, such an arrangement is also merely one example. That is, all of the plurality of capacitor components may be connected to the external electrode via fuses. Oppositely, all of the capacitor components may be connected to the external electrode without being connected via a fuse. Further, one or more capacitor components may be connected to the external electrode without being connected via a fuse and other one or more capacitor components may be connected to the external electrode via fuses. A chip capacitor after trimming may include a capacitor component that is insulated from the external electrode because one or more fuses may be cut.

(3) Although with each of the preferred embodiments, an arrangement where the fuse units are provided at the upper electrode film was illustrated, the fuse units may also be provided at the lower electrode film in the case of an arrangement where the lower electrode film is provided as in the arrangements of the tenth and eleventh preferred embodiments (FIG. 19 and FIG. 20). Specifically, an arrangement may be provided where the lower electrode film 25 (see FIG. 19, etc.) is divided into a plurality of electrode film portions in accordance with the plurality of capacitor components and fuse units are interposed between a portion or all of the electrode film portions and the external electrode 4. In this case, the upper electrode film may be arranged as an electrode film in common to the plurality of capacitor components and does not have to be divided into a plurality of electrode film portions.

(4) In regard to an invention related to features of an external electrode with which a front surface portion and a side surface portion are formed integrally, it is not necessary for a bidirectional diode to be included inside a chip.

(5) In regard to an invention related to a chip capacitor including a bidirectional diode inside a chip, an external electrode may be of an arrangement that covers only a front surface (element forming surface) of a substrate.

(6) Although with each of the preferred embodiments, the upper electrode film is constituted of the laminated structure film of the polysilicon film and the metal film, the upper electrode film may be constituted of just the metal film. In particular, if fine trenches are not formed on the substrate front surface, there is no problem related to the property of being embedded inside a trench and therefore it is preferable to form the upper electrode film from only a metal film to reduce the resistance value. As the metal film, Al, Al—Si, Al—Si—Cu, W, TiN, etc., may be used.

(7) Although with each of the preferred embodiments, an example where trenches, each having side wall surfaces and a bottom wall surface, were formed on the substrate front surface, was illustrated, a trench without a bottom wall surface may be formed on the substrate front surface. Specifically, a trench with which a pair of side wall surfaces form a V-shaped section may be formed on the substrate front surface.

(8) Although with each of the preferred embodiments, a silicon substrate was indicated as an example of a semiconductor substrate, a substrate of a compound semiconductor or other substrate material may be used.

(9) With each of the preferred embodiments, in place of the bidirectional diode 50, a resistor element adopting the structure of a resistor portion 206, illustrated by a preferred embodiment of a reference example to be described below, may be connected between the first and second external electrodes 3 and 4 and in parallel to the capacitor element 5.

Besides the above, various design changes may be applied within the scope of the matters described in the claims.

Preferred Embodiments of a Reference Example of the Present Invention

Preferred embodiments of a reference example of the present invention shall now be described in detail with reference to the attached drawings.

<Overall Arrangement of a Chip Part>

Figure 22A:
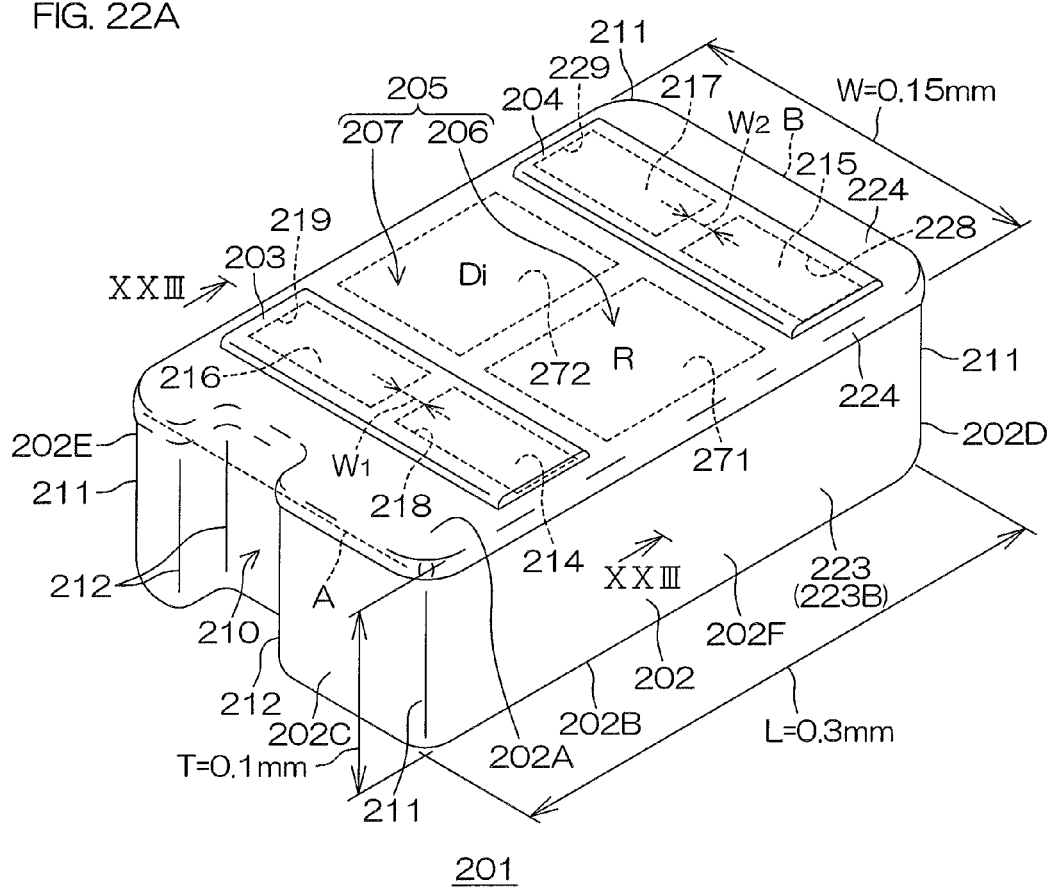
FIG. 22A is a schematic perspective view for describing the arrangement of a chip part according to a preferred embodiment of a reference example of the present invention.
Figure 22B:
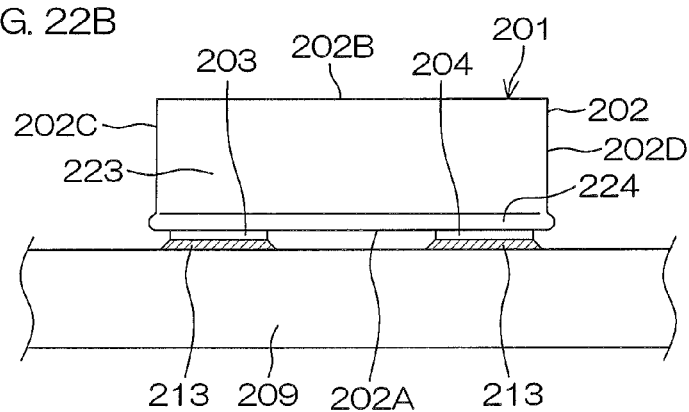
FIG. 22B is schematic side view of a state where the chip part is mounted on a circuit substrate.
Figure 23:
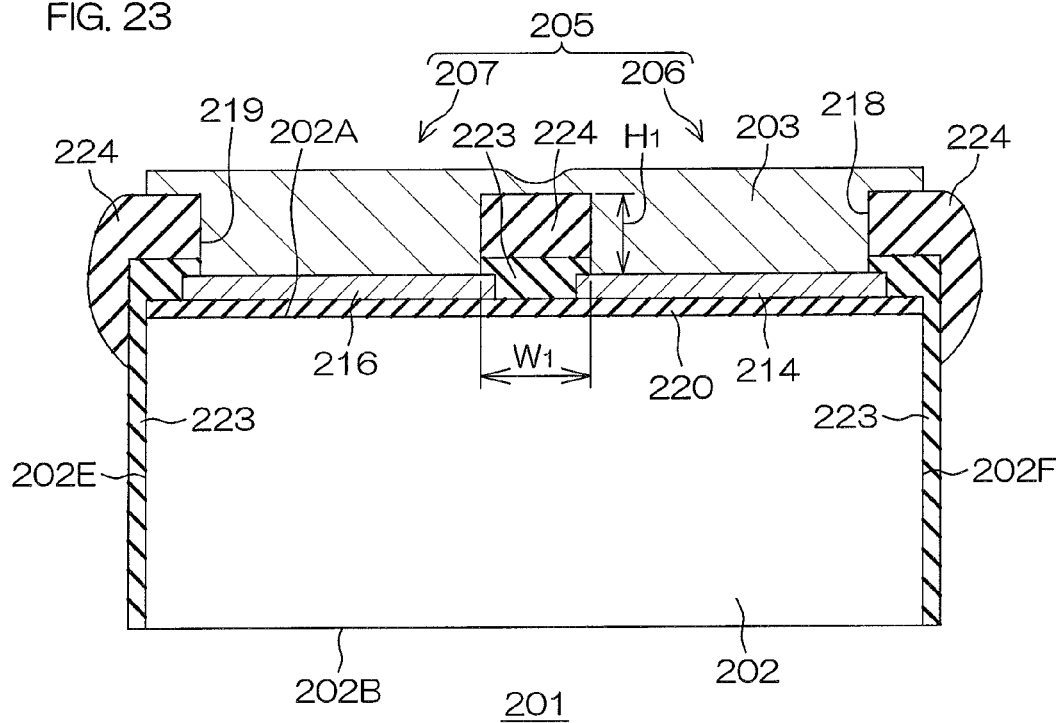
FIG. 23 is a sectional view of the chip part taken along section XXIII-XXIII in FIG. 22A.
Figure 24:
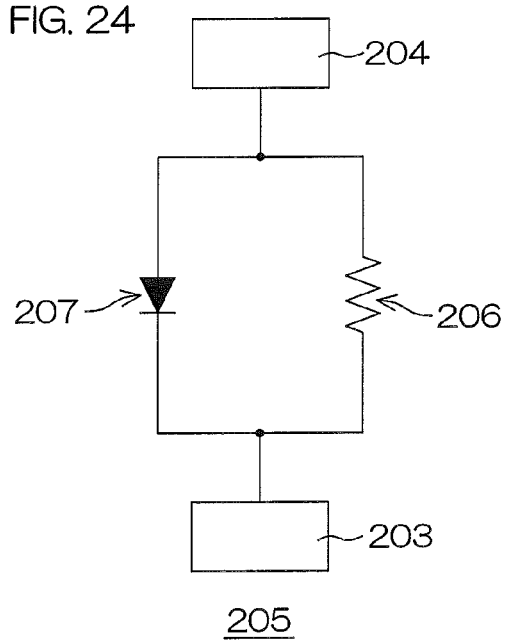
FIG. 24 is an electric circuit diagram of a composite element.

FIG. 22A is a schematic perspective view for describing the arrangement of a chip part according to a preferred embodiment of a reference example of the present invention, and FIG. 22B is schematic side view of a state where the chip part is mounted on a circuit substrate. FIG. 23 is a sectional view of the chip part taken along section XXIII-XXIII in FIG. 22A. FIG. 24 is an electric circuit diagram of a composite element.

The chip part 201 is a minute, discrete type chip part with which a composite element is contained in a single package (one chip) and has a rectangular parallelepiped shape as shown in FIG. 22A. In regard to the dimensions of the chip part 201, the length L in the long side direction is approximately 0.3 mm, the width W in the short side direction is approximately 0.15 mm, and the thickness T is approximately 0.1 mm.

The chip part 201 is obtained by forming multiple chip parts 201 in a lattice on a semiconductor wafer (silicon wafer) and then cutting the semiconductor wafer to separate it into the individual chip parts 201.

The chip part 201 mainly includes a semiconductor substrate 202, a first external connection electrode 203, a second external connection electrode 204, and an composite element 205. The first external connection electrode 203, the second external connection electrode 204, and the composite element 205 are formed on the semiconductor substrate 202 by using, for example, a semiconductor manufacturing process.

The semiconductor substrate 202 is made of Si (silicon) and has a substantially rectangular parallelepiped chip shape. With the semiconductor substrate 202, the upper surface in FIG. 22A is an element forming surface 202A. The element forming surface 202A is the front surface of the semiconductor substrate 202 and has a substantially oblong shape. The surface at the opposite side of the element forming surface 202A in the thickness direction of the semiconductor substrate 202 is a rear surface 202B. The element forming surface 202A and the rear surface 202B are substantially the same in shape. Also, besides the element forming surface 202A and the rear surface 202B, the semiconductor substrate 202 has a side surface 202C, a side surface 202D, a side surface 202E, and a side surface 202F that extend orthogonally with respect to these surfaces.

The side surface 202C is constructed between edges at one end in the long direction (the edges at the front left side in FIG. 22A) of the element forming surface 202A and the rear surface 202B, and the side surface 202D is constructed between edges at the other end in the long direction (the edges at the inner right side in FIG. 22A) of the element forming surface 202A and the rear surface 202B. The side surfaces 202C and 202D are the respective end surfaces of the semiconductor substrate 202 in the long direction. The side surface 202E is constructed between edges at one end in the short direction (the edges at the inner left side in FIG. 22A) of the element forming surface 202A and the rear surface 202B, and the side surface 202F is constructed between edges at the other end in the short direction (the edges at the front right side in FIG. 22A) of the element forming surface 202A and the rear surface 202B. The side surfaces 202E and 202F are the respective end surfaces of the semiconductor substrate 202 in the short direction.

An insulating film 220 is formed on the element forming surface 202A of the semiconductor substrate 202 as shown in FIG. 23. The insulating film 220 covers the entirety of the element forming surface 202A. Also with the semiconductor substrate 202, the element forming surface 202A, the side surface 202C, the side surface 202D, the side surface 202E, and the side surface 202F are covered by a protective film 223. Thus to be exact, the element forming surface 202A, the side surface 202C, the side surface 202D, the side surface 202E, and the side surface 202F in FIG. 22A are positioned at the inner sides (rear sides) of the protective film 223 and are not exposed to the exterior. Further, the protective film 223 on the element forming surface 202A is covered by a resin film 224. The resin film 224 protrudes from the element forming surface 202A to respective end portions at the element forming surface 202A side (upper end portions in FIG. 22A and FIG. 23) of the side surface 202C, the side surface 202D, the side surface 202E, and the side surface 202F.

With the semiconductor substrate 202, a recess 210, by which the semiconductor substrate 202 is notched in the thickness direction, is formed in a portion corresponding to a side A (one of the side surfaces 202C, 202D, 202E, and 202F, and in the present case, the side surface 202C, as shall be described later) of the element forming surface 202A of substantially oblong shape. The side A is also a side of the chip part 201 in a plan view. The recess 210 in FIG. 22A is formed in the side surface 202C and is recessed toward the side surface 202D side while extending in the thickness direction of the semiconductor substrate 202. The recess 210 penetrates through the semiconductor substrate 202 in the thickness direction, and end portions of the recess 210 in the thickness direction are exposed from the element forming surface 202A and the rear surface 202B, respectively. The recess 210 is smaller than the side surface 202C in the direction of extension of the side surface 202C (the short direction). The shape of the recess 210 in a plan view of viewing the semiconductor substrate 202 in the thickness direction (which is also the thickness direction of the chip part 201) is an oblong shape (rectangular shape) that is long in the short direction. The shape of the recess 210 in a plan view may be a trapezoidal shape that becomes narrow in width toward the direction in which the recess 210 is recessed (toward the side surface 202D side), or may be a triangular shape that becomes thin toward the recessing direction, or may be a U shape (a shape recessed in the shape of the letter U). In any case, the recess 210 can be formed easily as long as it has such a simple shape. Although the recess 210 is formed in the side surface 202C here, it may be formed in at least one of the side surface 202C to 202F instead of being formed in the side surface 202C.

The recess 210 indicates the orientation (chip direction) of the chip part 201 when the chip part 201 is mounted on a circuit substrate 209 (see FIG. 22B). The outline of the chip part 201 (to be accurate, the semiconductor substrate 202) in a plan view is a rectangle having the recess 210 at one side A and is therefore an asymmetrical outer shape in the long direction. That is, the asymmetrical outer shape has the recess 210 indicating the chip direction at a side (side A) among the side surfaces 202C, 202D, 202E, and 202F, and with the chip part 201, that the recess 210 side in the long direction is the chip direction is indicated by the asymmetrical outer shape. The chip direction of the chip part 201 can thus be recognized by simply making the outer shape of the semiconductor substrate 202 of the chip part 201 asymmetrical in a plan view. That is, the chip direction can be recognized by the outer shape of the chip part 201 even without a marking step. In particular, the asymmetrical outer shape of the chip part 201 is a rectangle having the recess 210, indicating the chip direction, at the side A, and therefore the recess 210 side in the long direction joining the side A and a side B at the opposite side can be made the chip direction with the chip part 201. Therefore, for example, by enabling the chip part 201 to be mounted correctly on the circuit substrate 209 when the side A is positioned at the left end when the long direction of the chip part 201 in a plan view is matched with the right/left direction, it can be ascertained from the outer appearance of the chip part 1 that the orientation of the chip part 1 must be set so that the side A is positioned at the left end in a plan view in the mounting process.

With the rectangular parallelepiped semiconductor substrate 202, corner portions 211 that form boundaries between mutually adjacent side surfaces (portions of intersection of mutually adjacent side surfaces) among the side surface 202C, side surface 202D, side surface 202E, and side surface 202F are shaped (rounded) to chamfered round shapes. Also with the semiconductor substrate 202, corner portions 212 that form boundaries between the recess 210 and the side surface 202C in the periphery of the recess 210 (corner portions at the recess 210 in the side surface 202C) are also shaped to chamfered round shapes. Here, the corner portions 212 are present not only at the boundaries of the recess 210 and the side surface 202C at the periphery of the recess 210 (portions besides the recess 210) but are also present at the innermost sides of the recess 210 and are thus present at four locations in a plan view.

All of the bent portions (corner portions 211 and 212) of the outline of the semiconductor substrate 202 in a plan view thus have round shapes. The occurrence of chipping can thus be prevented at the corner portions 211 and 212 of the round shapes. Improvement of yield (improvement of productivity) can thereby be achieved in the manufacture of the chip part 201.

The first external connection electrode 203 and the second external connection electrode 204 are formed on the element forming surface 202A of the semiconductor substrate 202 and are partially exposed from the resin film 224. Each of the first external connection electrode 203 and the second external connection electrode 204 is formed by laminating, for example, Ni (nickel), Pd (palladium), and Au (gold) in that order on the element forming surface 202A. The first external connection electrode 203 and the second external connection electrode 204 are disposed across an interval in the long direction of the element forming surface 202A and are long in the short direction of the element forming surface 202A. In FIG. 22A, the first external connection electrode 203 is provided at a position of the element forming surface 202A close to the side surface 202C and the second external connection electrode 204 is provided at a position close to the side surface 202D. The recess 210 in the side surface 202C is recessed to a depth that does not interfere with the first external connection electrode 203. However, depending on the case, the first external connection electrode 203 may also be provided with a recess (that becomes a portion of the recess 210) in accordance with the recess 210.

The composite element 205 is formed in a region of the element forming surface 202A of the semiconductor substrate 202 between the first external connection electrode 203 and the second external connection electrode 204, and is covered from above by the protective film 223 and the resin film 224. The composite element 205 of the present preferred embodiment includes a resistor portion 206 as an example of a first element and a diode 207 as an example of a second element that are adjacent to each other in the short direction of the element forming surface 202A (direction orthogonal to the direction in which the first external connection electrode 203 and the second external connection electrode 204 face each other). The composite element 205 is not restricted to a combination of the resistor portion 206 and the diode 207 and may, for example, be a combination of a resistor portion and a resistor portion (R+R), a combination of a diode and a diode (Di+Di), a combination of a capacitor and a resistor portion (C+R), etc. Also, the number of elements combined is not restricted to two and may be three, four, or more. Also, the plurality of elements may be disposed so as to be adjacent to each other in the long direction of the element forming surface 202A.

The resistor portion 206 includes a resistor network 271 and a first wiring film 214 as an example of a first internal electrode and a second wiring film 215 as an example of a second internal electrode that are disposed at one side and the other side in the long direction of the element forming surface 202A across the resistor network 271. In the present preferred embodiment, the first wiring film 214 is disposed below the first external connection electrode 203 and the second wiring film 215 is disposed below the second external connection electrode 204.

The diode 207 includes a diode cell region 272 and a cathode electrode film 216 as an example of a third internal electrode and an anode electrode film 217 as an example of a fourth internal electrode that are disposed at one side and the other side in the long direction of the element forming surface 202A across the diode cell region 272. In the present preferred embodiment, the cathode electrode film 216 is disposed below the first external connection electrode 203 and the anode electrode film 217 is disposed below the second external connection electrode 204.

As shown in FIG. 23, the first wiring film 214 and the cathode electrode film 216 are disposed on the insulating film 220 so as to be adjacent to each other in the short direction of the element forming surface 220A. Also, the first wiring film 214 and the cathode electrode film 216 are covered from above by the protective film 223 and the resin film 224. Pad openings 218 and 219, exposing portions of the first wiring film 214 and the cathode electrode film 216 respectively as separate pads, are formed in the protective film 223 and the resin film 224. A distance (pad space) $W_1$ between the pad openings 218 and 219 is, for example, 7 μm to 10 μm, and a height $H_1$ from a pad front surface (front surface of each film) to a front surface of the resin film 224 is, for example, 3 μm to 6 μm. By the first external connection electrode 203 being embedded in the pad openings 218 and 219 together so as to be continuous on the resin film 224, the first wiring film 214 and the cathode electrode film 216 are connected in common to the first external connection electrode 203.

In the same manner as in the arrangement shown in FIG. 23, the second wiring film 215 and the anode electrode film 217 are disposed on the insulating film 220 so as to be adjacent to each other in the short direction of the element forming surface 220A. Also, the second wiring film 215 and the anode electrode film 217 are covered from above by the protective film 223 and the resin film 224. Pad openings 228 and 229, exposing portions of the second wiring film 215 and the anode electrode film 217 respectively as separate pads, are formed in the protective film 223 and the resin film 224. A distance (pad space) $W_2$ (see FIG. 22A) between the pad openings 228 and 229 and a height from a pad front surface (front surface of each film) to the front surface of the resin film 224 are the same as the distance $W_1$ and the height $H_1$ described above. By the second external connection electrode 204 being embedded in the pad openings 228 and 229 together so as to be continuous on the resin film 224, the second wiring film 215 and the anode electrode film 217 are connected in common to the second external connection electrode 204.

By the above, with the chip part 201, the resistor portion 206 and the diode 207 are connected in parallel by the cathode side of the diode 207 being connected in common by the first external connection electrode 203 and the anode side of the diode 207 being connected in common by the second external connection electrode 204 as shown in FIG. 24. The resistor portion 206 and the diode 207 function as the single composite element 205 as a whole.

And by making the first external connection electrode 203 and the second external connection electrode 204 face the circuit substrate 209 as shown in FIG. 22B and electrically and mechanically connecting the electrodes to a circuit (not shown) on the circuit substrate 209 by solders 213, the chip part 201 can be flip-chip connected to circuit substrate 209. That is, the chip part 201 of the flip-chip connection type can be provided, and by performing face-down bonding with the element forming surface 202A being made to face the mounting surface of the mounting substrate 209, the chip part 201 can be connected to the mounting substrate 209 by wireless bonding. The area occupied by the chip part 201 on the mounting substrate 209 can thereby be made small. In particular, reduction of height of the chip part 201 on the mounting substrate 209 can be realized. Effective use can thereby be made of the space inside a casing of a compact electronic device, etc., to contribute to high-density packaging and downsizing. The first external connection electrode 203 and the second external connection electrode 204 that function as the external connection electrodes are preferably formed of gold (Au) or has gold plating applied on the surfaces thereof to improve solder wettability and improve reliability.

<Overall Arrangement of the Resistor Portion>

Figure 25:
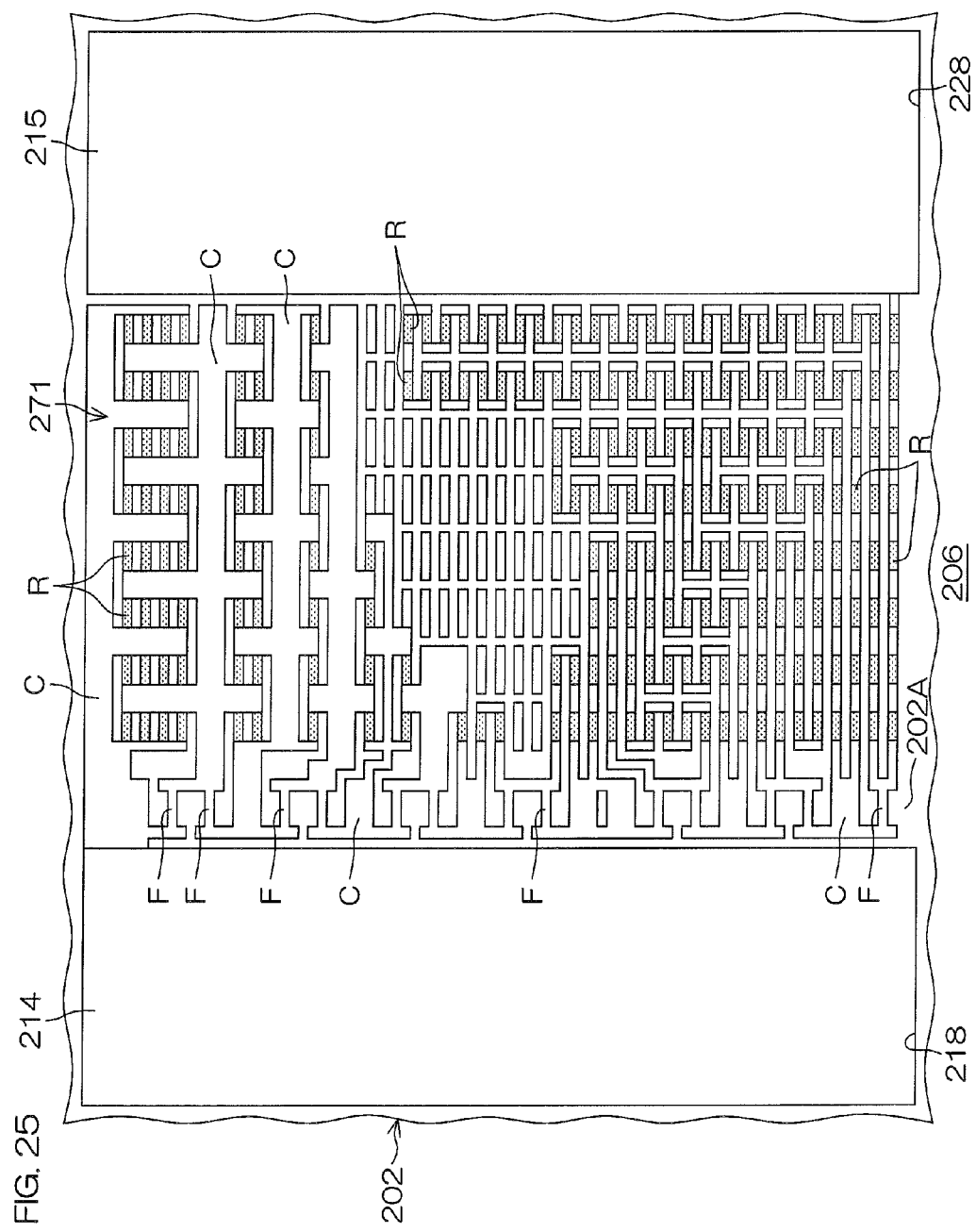
FIG. 25 is a plan view of a resistor portion of the composite element and is a diagram showing the arrangement in a plan view of a first wiring film, a second wiring film, and a resistor network.

FIG. 25 is a plan view of the resistor portion of the composite element and is a diagram showing the arrangement in a plan view of the first wiring film, the second wiring film, and the resistor network.

The resistor network 271 of the resistor portion 206 has, for example, a total of 352 resistor bodies R arranged from 8 resistor bodies R being arrayed along the row direction (length direction of the semiconductor substrate 2) and 44 resistor bodies R being arrayed along the column direction (width direction of the semiconductor substrate 202). The respective resistor bodies R have an equal resistance value.

The multiple resistor bodies R are electrically connected in groups of predetermined numbers of 1 to 64 to form a plurality of types of resistor units (unit resistors). The plurality of types of resistor units thus formed are connected in predetermined modes via connection conductor films C. Further, on the element forming surface 202A of the semiconductor substrate 202, a plurality of fuse films F are provided that are capable of being fused to electrically incorporate resistor units into the resistor portion 206 or electrically separate resistor units from the resistor portion 206. The plurality of fuse films F and the connection conductor films C are arrayed along the inner side of the first wiring film 214 so that the positioning regions thereof are rectilinear. More specifically, the plurality of fuse films F and the connection conductor films C are disposed rectilinearly.

FIG. 26A is partially enlarged plan view of the resistor portion. FIG. 26B is a vertical sectional view in the length direction taken along B-B of FIG. 26A for describing the arrangement of resistor bodies in the resistor portion. FIG. 26C is a vertical sectional view in the width direction taken along C-C of FIG. 26A for describing the arrangement of the resistor bodies in the resistor portion.

The arrangement of the resistor bodies R shall now be described with reference to FIG. 26A, FIG. 26B, and FIG. 26C.

The chip part 201 includes the insulating film 220, resistor body films 221, wiring films 222, the protective film 223, and the resin film 224 (see FIG. 26B and FIG. 26C). The insulating film 220, the resistor body films 221, the wiring films 222, the protective film 223, and the resin film 224 are formed on the semiconductor substrate 202 (element forming surface 202A).

The insulating film 220 is made of $SiO_2$ (silicon oxide). The insulating film 220 covers the entirety of the element forming surface 202A of the semiconductor substrate 202. The thickness of the insulating film 220 is approximately 10000 Å.

The resistor body films 221 make up the resistor bodies R. The resistor body films 221 are formed of TiN or TiON and are laminated on the front surface of the insulating film 220. The thickness of each resistor body film 221 is approximately 2000 Å. The resistor body films 221 form a plurality of lines (hereinafter referred to as "resistor body film lines 221A") extending as lines between the first wiring film 214 and the second wiring film 215, and there are cases where a resistor body film line 221A is cut at predetermined positions in the line direction (see FIG. 26A).

The wiring films 222 are laminated on the resistor body film lines 221A. The wiring films 222 are made of Al (aluminum) or an alloy (AlCu alloy) of aluminum and Cu (copper). The thickness of each wiring film 222 is approximately 8000 Å. The wiring films 222 are laminated on the resistor body film lines 221A while being spaced apart by fixed intervals R in the line direction.

Figure 27A:
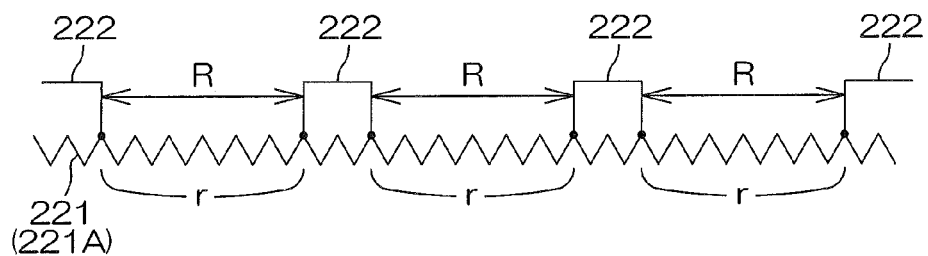
FIG. 27 shows diagrams showing the electrical features of resistor body film lines and wiring films in the form of circuit symbols and an electric circuit diagram.

The electrical features of the resistor body film lines 221A and the wiring films 222 of this arrangement are indicated by circuit symbols in FIG. 27. That is, as shown in FIG. 27A, each of the resistor body film line 221A portions in regions of the predetermined interval R forms a resistor body R with a fixed resistance value r.

Figure 27B:
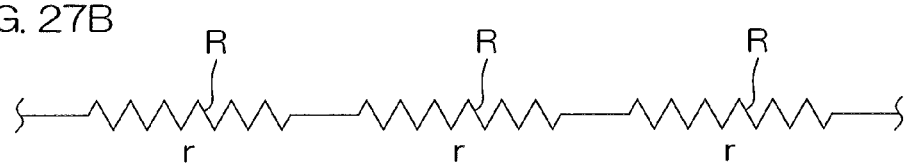

In each region at which the wiring film 222 is laminated, the wiring film 222 electrically connects mutually adjacent resistor bodies R so that the resistor body film line 221A is short-circuited by the wiring film 222. A resistor circuit, made up of serial connections of resistor bodies R of resistance r, is thus formed as shown in FIG. 27B.

Figure 27C:
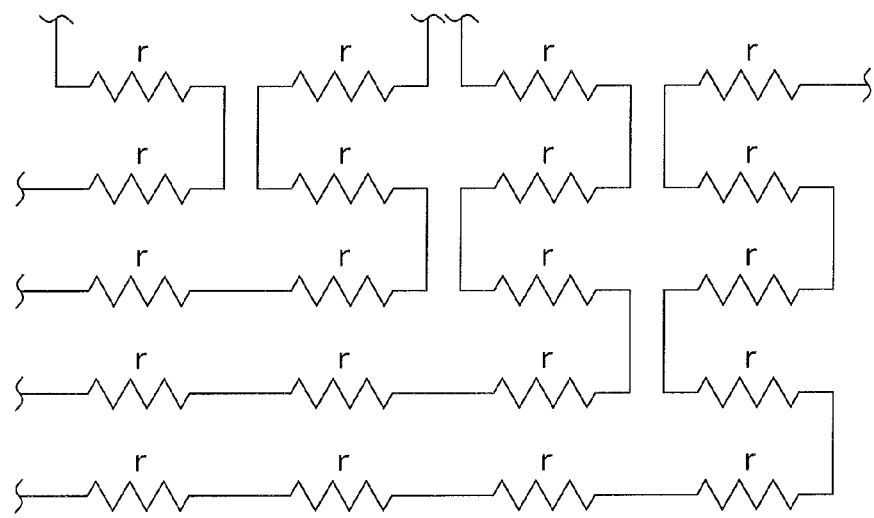

Also, adjacent resistor body film lines 221A are connected to each other by the resistor body films 221 and wiring films 222, and the resistor network 271 shown in FIG. 26A forms the resistor circuit (made up of the unit resistors of resistor bodies R) shown in FIG. 27C.

Here, based on the characteristic that resistor body films 221 of the same shape and same size that are formed on the semiconductor substrate 202 are substantially the same in value, the plurality of resistor bodies R arrayed in a matrix on the semiconductor substrate 202 have an equal resistance value.

Also, the wiring films 222 laminated on the resistor body film lines 221A form the resistor bodies R and also serve the role of connection wiring films that connect a plurality of resistor bodies R to arrange a resistor unit.

Figures 28A, 28B:
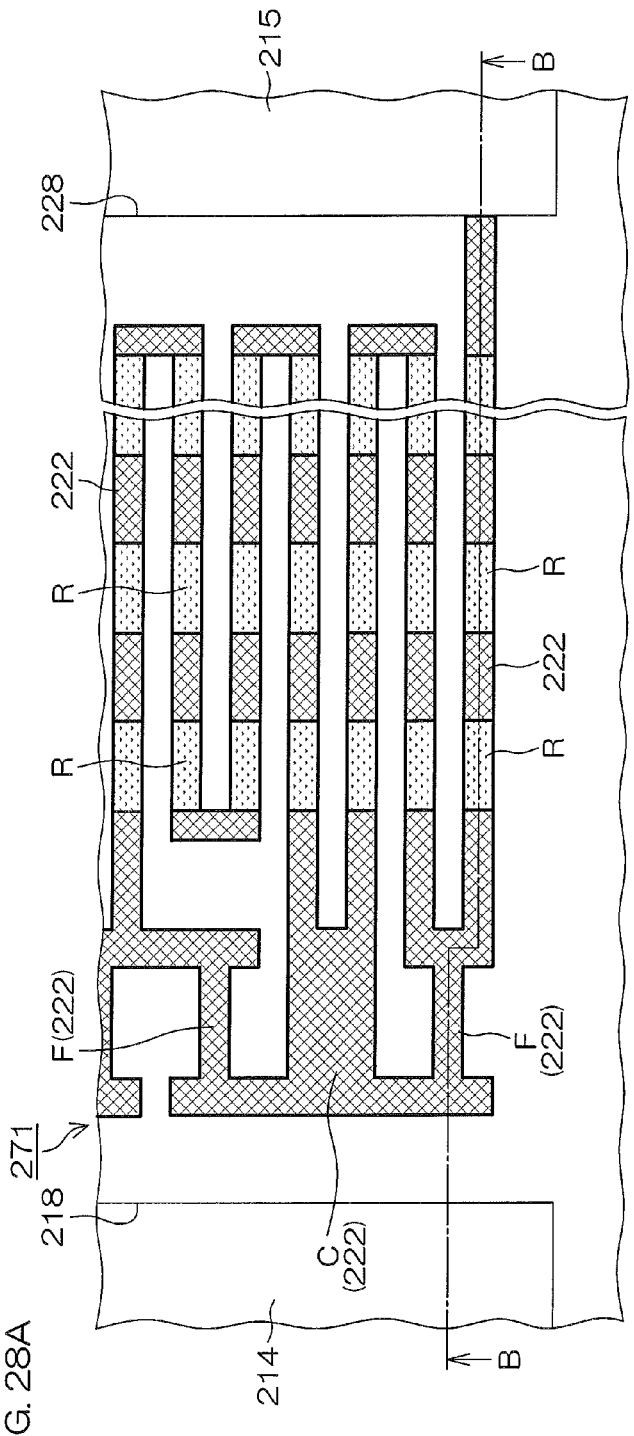
FIG. 28A is a partially enlarged plan view of a region including fuse films drawn by enlarging a portion of the plan view of the chip part.
FIG. 28B is a structural sectional view taken along B-B in FIG. 28A.

FIG. 28A is partially enlarged plan view of a region including the fuse films drawn by enlarging a portion of the plan view of the chip part, and FIG. 28B is a structural sectional view taken along B-B in FIG. 28A.

As shown in FIGS. 28A and 28B, in the resistor network 271, the fuse films F and the connection conductor films C are also formed by the wiring films 222, which are laminated on the resistor body films 221 that form the resistor bodies R. That is, the fuse films F and the connection conductor films C are formed of Al or AlCu alloy, which is the same metal material as that of the wiring films 222, on the same layer as the wiring films 222, which are laminated on the resistor body film lines 221A that form the resistor bodies R.

That is, on the same layer laminated on the resistor body films 20, the wiring films for forming the resistor bodies R, the fuse films F, the connection conductor films C, and the first wiring film 214 and second wiring film 215 for connecting the resistor portion 206 to the first external connection electrode 203 and the second external connection electrode 204 are formed as the wiring films 222 by the same manufacturing process (the sputtering and photolithography process to be described below) using the same metal material (Al or AlCu alloy).

The fuse film F may refer not only to a portion of the wiring films 222 but may also refer to an assembly (fuse element) of a portion of a resistor body R (resistor body film 221) and a portion of the wiring film 222 on the resistor body film 221.

Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

Figure 29:
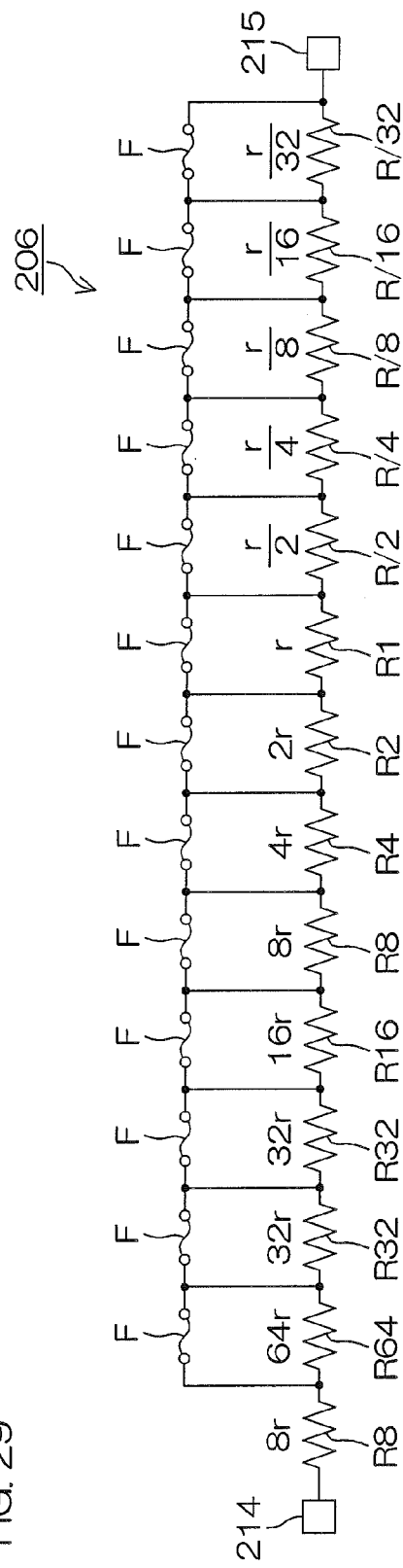
FIG. 29 is an electric circuit diagram of the resistor portion according to the preferred embodiment of the reference example of the present invention.

FIG. 29 is an electric circuit diagram of the resistor portion according to the preferred embodiment of the reference example of the present invention.

Referring to FIG. 29, the resistor portion 206 is arranged by serially connecting a reference resistor unit R8, a resistor unit R64, two resistor units R32, a resistor unit R16, a resistor unit R8, a resistor unit R4, a resistor unit R2, a resistor unit R1, a resistor unit R/2, a resistor unit R/4, a resistor unit R/8, a resistor unit R/16, and a resistor unit R/32 in that order from the first wiring film 214. Each of the reference resistor unit R8 and resistor units R64 to R2 is arranged by serially connecting the same number of resistor bodies R as the number at the end of its symbol ("64" in the case of R64). The resistor unit R1 is arranged from a single resistor body R. Each of the resistor units R/2 to R/32 is arranged by connecting the same number of resistor bodies R as the number at the end of its symbol ("32" in the case of R/32) in parallel. The meaning of the number at the end of the symbol of the resistor unit is the same in FIG. 30 and FIG. 31 to be described below.

One fuse film F is connected in parallel to each of the resistor unit R64 to resistor unit R/32, besides the reference resistor unit R8. The fuse films F are mutually connected in series directly or via the connection conductor film C (see FIG. 28A).

In a state where none of the fuse films F is fused as shown in FIG. 29, the resistor portion 206 forms a resistor circuit of the reference resistor unit R8 (resistance value: 8r), formed by the serial connection of the 8 resistor bodies R provided between the first wiring film 214 and the second wiring film 215. For example, if the resistance value r of a single resistor body R is r=80Ω, the resistor portion 206 is arranged with the first wiring film 214 and the second wiring film 215 being connected by a resistor circuit of 8r=640Ω.

Also in the state where none of the fuse films F is fused, the plurality of types of resistor units besides the reference resistor unit R8 are put in short-circuited states. That is, although 13 resistor units R64 to R/32 of 12 types are connected in series to the reference resistor unit R8, each resistor unit is short-circuited by the fuse film F that is connected in parallel and thus electrically, the respective resistor units are not incorporated in the resistor portion 206.

With the chip part 201 according to the present preferred embodiment, a fuse film F is selectively fused, for example, by laser light in accordance with the required resistance value. The resistor unit with which the fuse film F connected in parallel is fused is thereby incorporated into the resistor portion 206. The overall resistance value of the resistor portion 206 can thus be set to the resistance value resulting from serially connecting and incorporating the resistor units corresponding to the fused fuse films F.

In particular, the plurality of types of resistor units include the plurality of types of serial resistor units, with which the resistor bodies R having the equal resistance value are connected in series with the number of resistor bodies R being increased in geometric progression as 1, 2, 4, 8, 16, 32, . . . , and the plurality of types of parallel resistor units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the resistor portion 206 as a whole can be adjusted finely and digitally to an arbitrary resistance value to enable a resistor of a desired value to be formed in the chip part 201.

Figure 30:
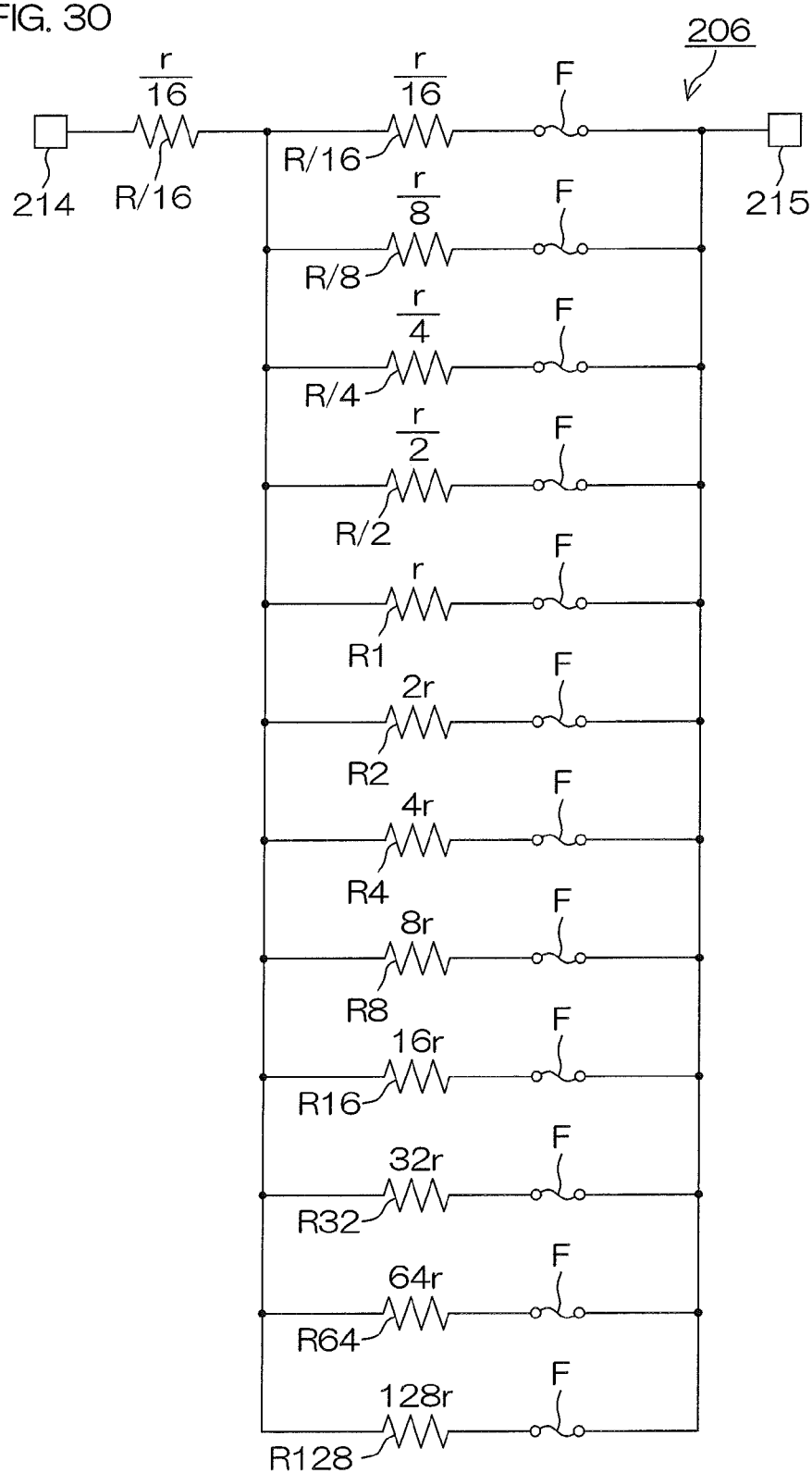
FIG. 30 is an electric circuit diagram of a resistor portion according to another preferred embodiment of the reference example.

FIG. 30 is an electric circuit diagram of a resistor according to another preferred embodiment of the reference example.

Instead of arranging the resistor portion 206 by serially connecting the reference resistor unit R8 and the resistor unit R64 to the resistor unit R/32 as described above, the resistor portion 206 may be arranged as shown in FIG. 30. To be detailed, the resistor portion 206 may be arranged, between the first wiring film 214 and the second wiring film 215, as a serial connection circuit of the reference resistor unit R/16 and the parallel connection circuit of the 12 types of resistor units R/16, R/8, R/4, R/2, R1, R2, R4, R8, R16, R32, R64, and R128.

In this case, a fuse film F is serially connected to each of the 12 types of resistor units besides the reference resistor unit R/16. In a state where none of the fuse films F is fused, the respective resistor units are electrically incorporated in the resistor portion 206. By selectively fusing a fuse film F, for example, by laser light in accordance with the required resistance value, the resistor unit corresponding to the fused fuse film F (the resistor unit connected in series to the fuse film F) is electrically separated from the resistor portion 206 and the resistance value of the chip part 201 as a whole can thereby be adjusted.

Figure 31:
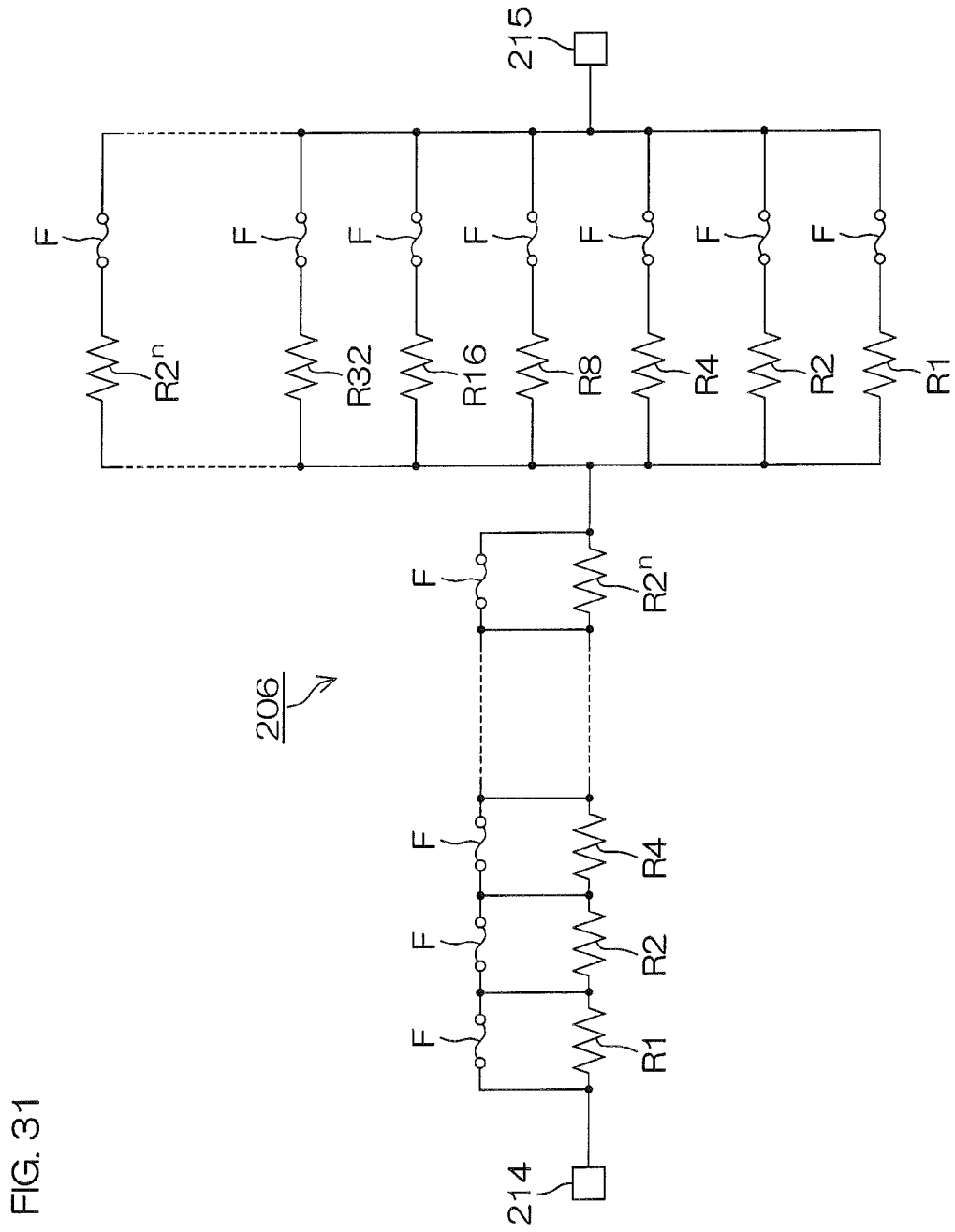
FIG. 31 is an electric circuit diagram of a resistor portion according to yet another preferred embodiment of the reference example.

FIG. 31 is an electric circuit diagram of a resistor according to yet another preferred embodiment of the reference example.

A feature of the resistor portion 206 shown in FIG. 31 is that it has the circuit arrangement where a serial connection of a plurality of types of resistor units and a parallel connection of a plurality of types of resistor units are connected in series. As in a previous preferred embodiment, with the plurality of types of resistor units connected in series, a fuse film F is connected in parallel to each resistor unit and all of the plurality of types of resistor units that are connected in series are put in short-circuited states by the fuse films F. Therefore, when a fuse film F is fused, the resistor unit that was short-circuited by the fused fuse film F is electrically incorporated into the resistor portion 206.

On the other hand, a fuse film F is connected in series to each of the plurality of types of resistor units that are connected in parallel. Therefore by fusing a fuse film F, the resistor unit connected in series to the fused fuse film F can be electrically disconnected from the parallel connection of resistor units.

With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

Figure 32:
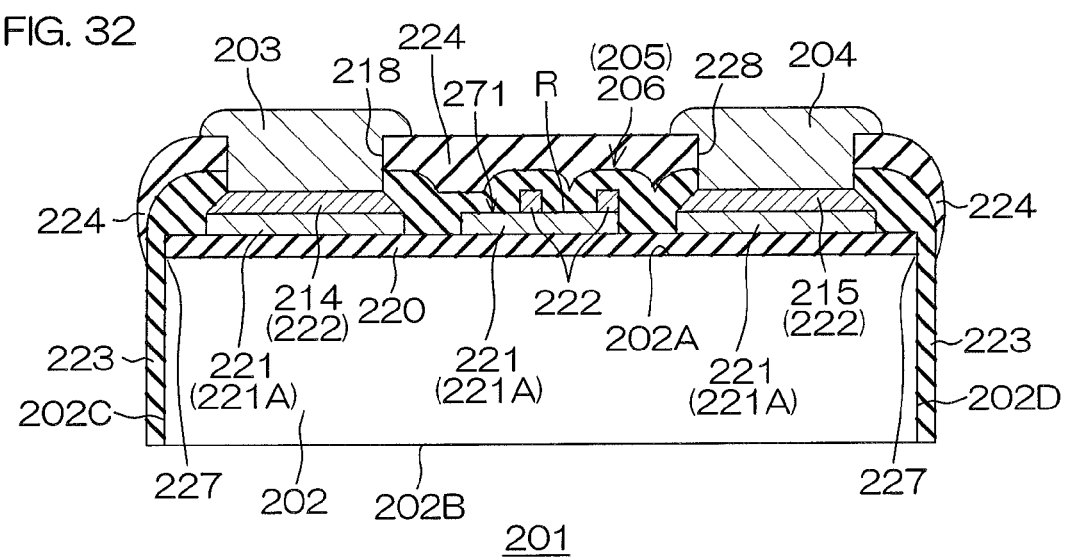
FIG. 32 is a schematic sectional view of the chip part and shows the resistor portion.

FIG. 32 is a schematic sectional view of the chip part and shows the resistor portion.

The chip part 1 (the resistor portion 206 portion) shall now be described in further detail with reference to FIG. 32. For the sake of description, the resistor portion 206 is illustrated in a simplified form and hatching is applied to respective components besides the semiconductor substrate 202 in FIG. 32.

Here, the protective film 223 and the resin film 224 shall be described.

The protective film 223 is made, for example, from SiN (silicon nitride) and the thickness thereof is approximately 3000 Å. The protective film 223 is provided across the entirety of the element forming surface 202A, covers the resistor body films 221 and the respective wiring films 222 on the resistor body films 221 (that is, the resistor portion 206) from the front surface (upper side in FIG. 32) (that is, covers the upper surfaces of the respective resistor bodies R in the resistor portion 206), and covers the respective entireties of the four side surfaces 202C to 202F (see FIG. 22A) of the semiconductor substrate 202. At the element forming surface 202A, short-circuiting across the resistor bodies R (short-circuiting across adjacent resistor body film lines 221A) at portions besides the wiring films 222 is prevented by the protective film 223. On the other hand, at the side surfaces 202C to 202F, short-circuiting at the respective side surfaces 202C to 202F (forming of a short circuit path at any of the side surfaces) is prevented by the protective film 223.

The resin film 224, together with the protective film 223, protects the chip part 201 and is made of a resin, such as polyimide, etc. The thickness of the resin film 224 is approximately 5 μm. The resin film 224 covers the upper surface of the protective film 223 across its entirety and covers end portions (upper end portions in FIG. 32) at the element forming surface 202A side of the protective film 223 on the four side surfaces 202C to 202F of the semiconductor substrate 202. That is, the resin film 224 leaves exposed at least portions of the protective film 223 on the four side surfaces 202C to 202F at the side (lower side in FIG. 32) opposite to the element forming surface 202A.

With such a resin film 224, the portion coinciding with the four side surfaces 202C to 202F in a plan view is an arcuate overhanging portion that overhangs further to the sides (outward) than the protective film 223 on the side surfaces 202C to 202F. That is, the resin film 224 protrudes beyond protective film 223 at the side surfaces 202C to 202F. Such a resin film 224 has side surfaces of round shapes that project to the sides at the arcuate overhanging portion. Therefore, when the chip part 201 contacts an object in the surroundings, the overhanging portion of the resin film 224 contacts the object in the surroundings first and relaxes the impact due to the contact to prevent the impact from being applied to the composite element 205, etc. In particular, the overhanging portion of the resin film 224 has the side surfaces with round shapes and can thus relax the impact due to contact smoothly.

An arrangement where the resin film 224 does not cover the protective film 223 at the side surfaces 202C to 202F at all (an arrangement where the entirety of the protective film 223 at the side surfaces 202C to 202F is exposed) is also possible.

Also as mentioned above, in the resin film 224, the pad openings 218 and 228 are formed, one at each of two positions that are separated in a plan view. Each of the pad openings 218 and 228 is a penetrating hole penetrating continuously through the resin film 224 and the protective film 223 in the respective thickness directions. The pad openings 218 and 228 are thus formed not only in the resin film 224 but also in the protective film 223. Portions of the first wiring film 214 and the second wiring film 215 are exposed respectively as pads from the pad openings 218 and 228.

The pad opening 218 is completely filled by the first external connection electrode 203 and the pad opening 228 is completely filled by the second external connection electrode 204. Portions of the first external connection electrode 203 and the second external connection electrode 204 respectively protrude from the pad openings 218 and 228 at the front surface of the resin film 224. The first external connection electrode 203 is electrically connected via the pad opening 218 to the first wiring film 214. The second external connection electrode 204 is electrically connected via the pad opening 228 to the second wiring film 215. Each of the first external connection electrode 203 and the second external connection electrode 204 is thereby electrically connected to the resistor portion 206.

The resin film 224 and the protective film 223, in which the pad openings 218 and 228 are formed, are thus formed so that the first external connection electrode 203 and the second external connection electrode 204 are exposed from the pad openings 218 and 228. Electrical connection between the chip part 201 and the circuit substrate 209 can thus be achieved via the first external connection electrode 203 and the second external connection electrode 204 protruding from the pad openings 218 and 228 at the front surface of the resin film 224 (see FIG. 22B).

<Overall Arrangement of the Diode>

Figure 33:
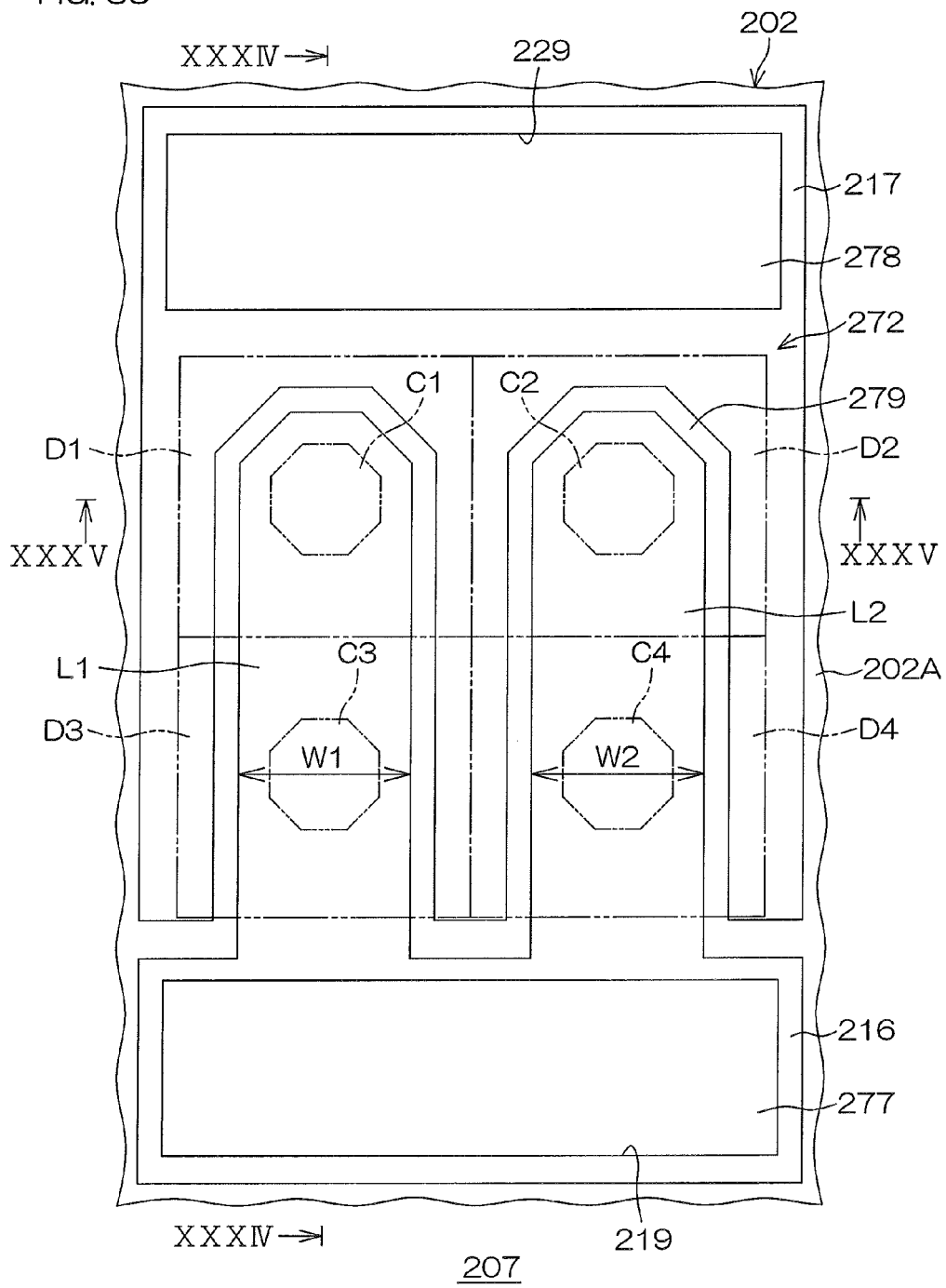
FIG. 33 is a plan view of a diode of the composite element.
Figure 34:
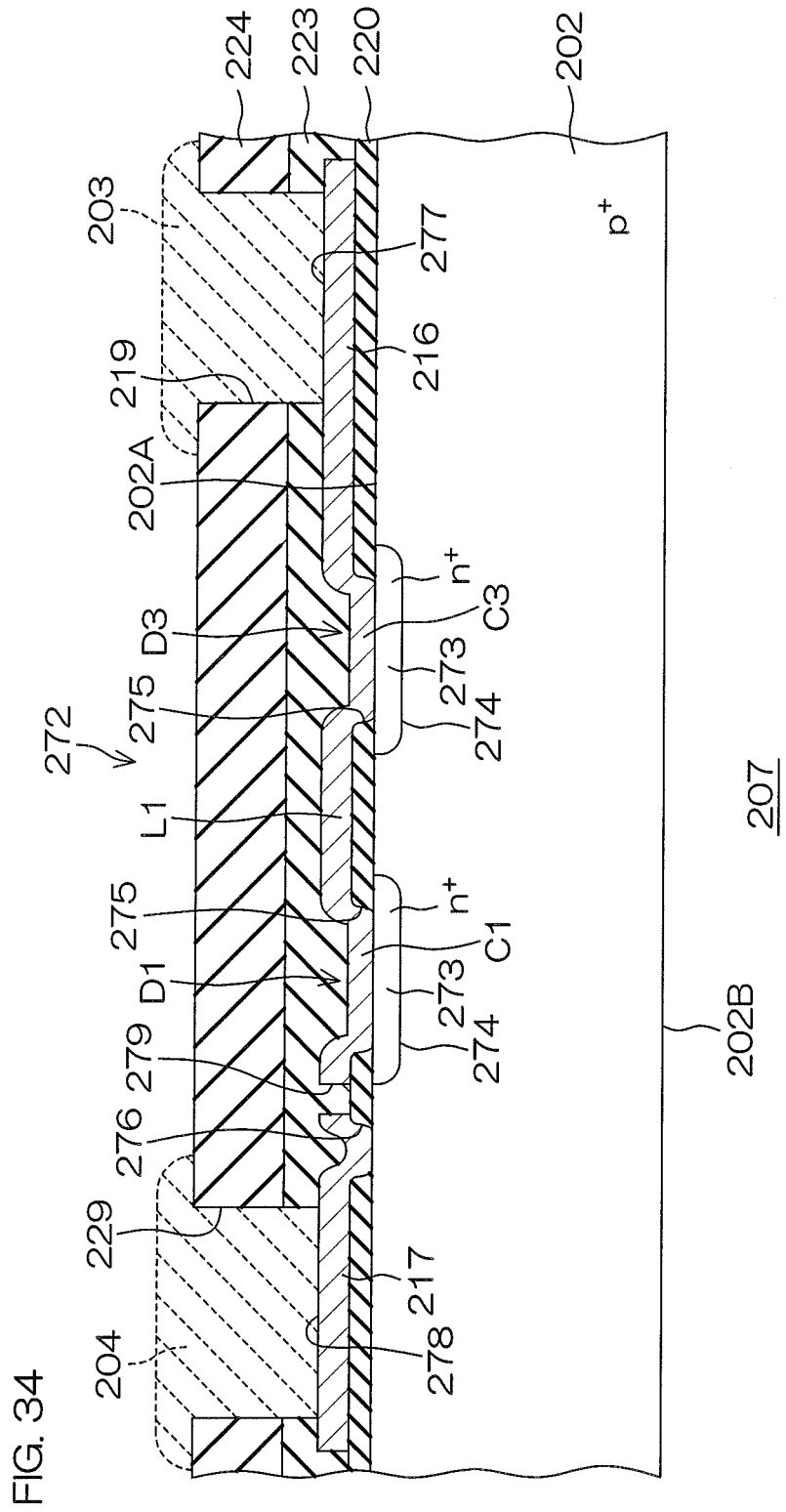
FIG. 34 is a sectional view of the diode taken along section XXXIV-XXXIV in FIG. 33.
Figure 35:
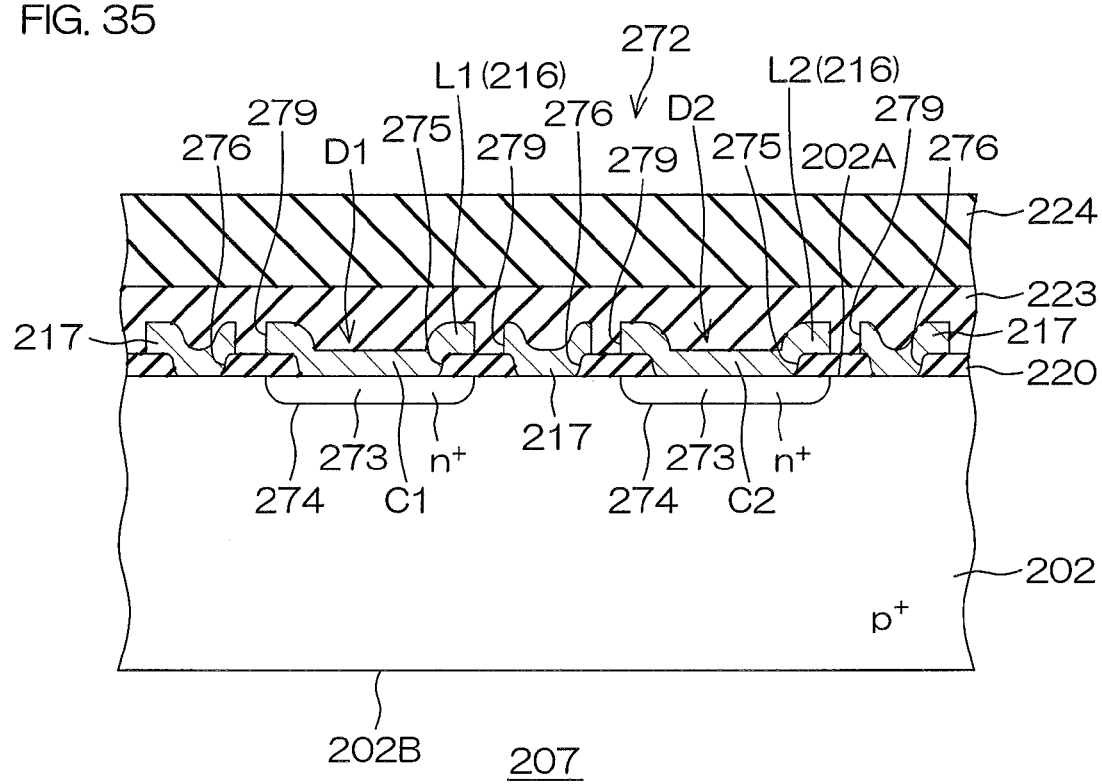
FIG. 35 is a sectional view of the diode taken along section XXXV-XXXV in FIG. 33.

FIG. 33 is a plan view of the diode of the composite element, and FIG. 34 is a sectional view of the diode taken along section XXXIV-XXXIV in FIG. 33. Further, FIG. 35 is a sectional view of the diode taken along section XXXV-XXXV in FIG. 33.

In the present preferred embodiment, the diode cell region 272 of the diode 207 is formed to a rectangular shape. The plurality of diode cells D1 to D4 are disposed inside the diode cell region 272. In regard to the plurality of diode cells D1 to D4, four are provided in the present preferred embodiment and these are arrayed two-dimensionally at equal intervals in a matrix along the long direction and short direction of the semiconductor substrate 202.

Figure 36:
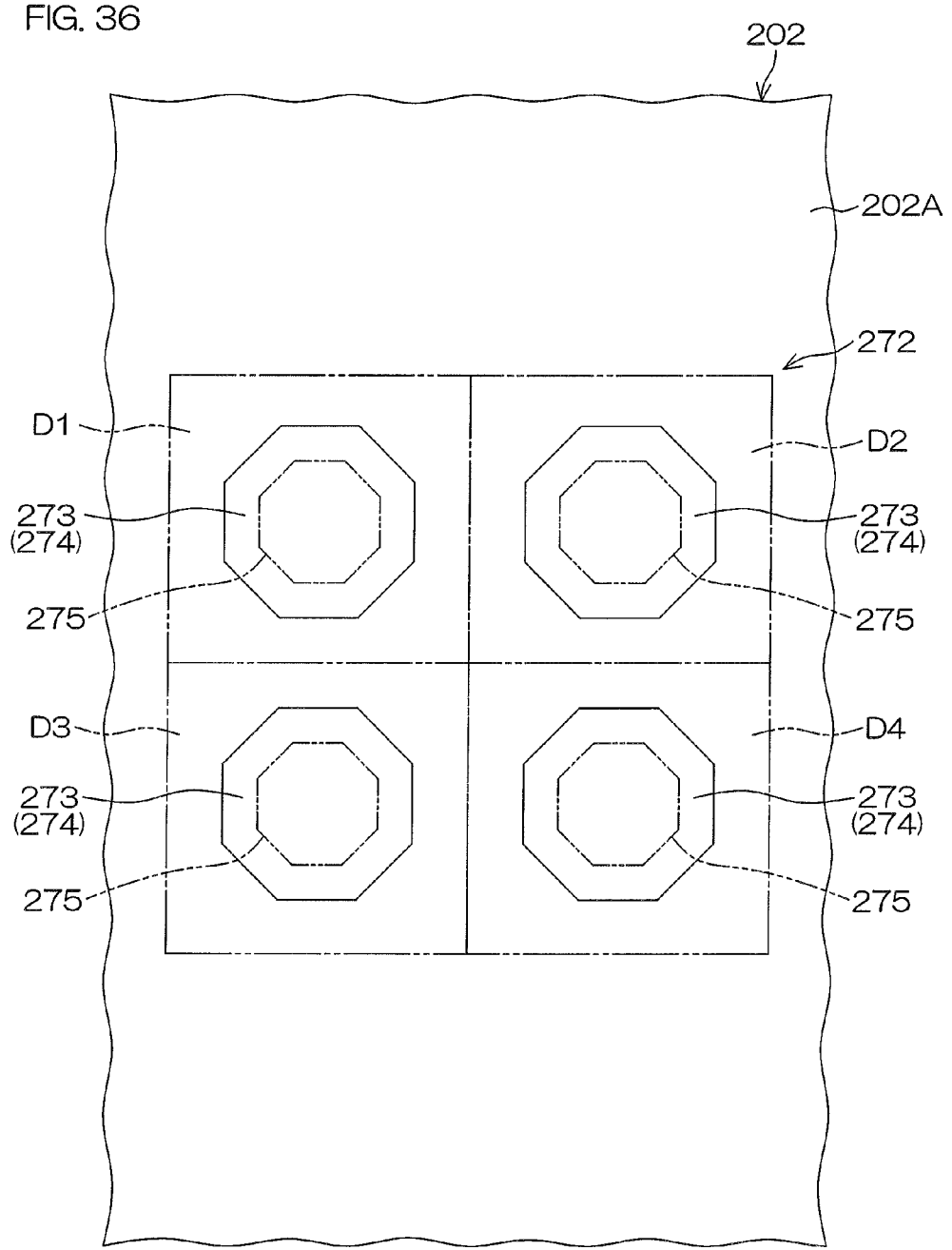
FIG. 36 is a plan view of the diode with a cathode electrode film, an anode electrode film, and the arrangement formed thereon being removed to show the structure of a front surface of a semiconductor substrate.

FIG. 36 is a plan view showing the structure of the front surface (element forming surface 202A) of the semiconductor substrate 202 with the cathode electrode film 216, the anode electrode film 217, and the arrangement formed thereon being removed.

In each of the regions of the diode cells D1 to D4, an $n^+$-type region 273 is formed as an example of an n-type diffusion layer in a surface layer region of the $p^+$-type semiconductor substrate 202. The $n^+$-type regions 273 are separated according to each individual diode cell. The diode cells D1 to D4 are thereby made to respectively have p-n junction regions 274 that are separated according to each individual diode cell.

In the present preferred embodiment, the plurality of diode cells D1 to D4 are formed to be equal in size and equal in shape and are specifically formed to rectangular shapes, and the $n^+$-type region 273 with a polygonal shape is formed in the rectangular region of each diode cell. In the present preferred embodiment, each $n^+$-type region 273 is formed to a regular octagon having four sides extending along the four sides forming the rectangular region of the corresponding diode cell among the diode cells D1 to D4 and another four sides respectively facing the four corner portions of the rectangular region of the corresponding diode cell among the diode cells D1 to D4.

As mentioned above, the insulating film 220 is formed on the element forming surface 202A of the semiconductor substrate 202 (see FIG. 34 and FIG. 35). Contact holes 275 (cathode contact holes) exposing front surfaces of the respective $n^+$-type regions 273 of the diode cells D1 to D4 and contact holes 276 (anode contact holes) exposing the element forming surface 202A are formed in the insulating film 220. The cathode electrode film 216 and the anode electrode film 217 are formed on the front surface of the insulating film 220.

The cathode electrode film 216 includes a lead-out electrode L1 connected to the plurality of diode cells D1 and D3, a lead-out electrode L2 connected to the plurality of diode cells D2 and D4, and a cathode pad 277 formed integral to the lead-out electrodes L1 and L2 (cathode lead-out electrodes). The cathode pad 277 is formed to a rectangle at one end portion of the element forming surface 202A. The first external connection electrode 203 is connected to the cathode pad 277. The first external connection electrode 203 is thereby connected in common to the lead-out electrodes L1 and L2.

The anode electrode film 217 is connected to the $p^+$-type semiconductor substrate 202 and has an anode pad 278 near one end portion of the element forming surface 202A. The anode pad 278 is constituted of a region of the anode electrode film 217 that is disposed at the one end portion of the element forming surface 202A. The second external connection electrode 204 is connected to the anode pad 278. The region of the anode electrode film 217 besides the anode pad 278 is an anode lead-out electrode that is led out from the contact holes 276.

The lead-out electrode L1 enters into the contact holes 275 of the diode cells D1 and D3 from the front surface of the insulating film 220 and is in ohmic contact with the respective $n^+$-type regions 273 of the diode cells D1 and D3 inside the respective contact holes 275. In the lead-out electrode L1, the portions connected to the diode cells D1 and D3 inside the contact holes 275 constitute cell connection portions C1 and C3. Similarly, the lead-out electrode L2 enters into the contact holes 275 of the diode cells D2 and D4 from the front surface of the insulating film 220 and is in ohmic contact with the respective $n^+$-type regions 273 of the diode cells D2 and D4 inside the respective contact holes 275. In the lead-out electrode L2, the portions connected to the diode cells D2 and D4 inside the contact holes 275 constitute cell connection portions C2 and C4. The anode electrode film 217 extends to inner sides of the contact holes 276 from the front surface of the insulating film 220 and is in ohmic contact with the p$^+$-type semiconductor substrate 202 inside the contact holes 276. In the present preferred embodiment, the cathode electrode film 216 and the anode electrode film 217 are made of the same material.

In the present preferred embodiment, AlSi films are used as the electrode films. When an AlSi film is used, the anode electrode film 217 can be put in ohmic contact with the p$^+$-type semiconductor substrate 202 without having to provide a p$^+$-type region on the front surface of the semiconductor substrate 202. That is, an ohmic junction can be formed by putting the anode electrode film 217 in direct contact with the p$^+$-type semiconductor substrate 202. A process for forming the p$^+$-type region can thus be omitted.

The cathode electrode film 216 and the anode electrode film 217 are separated by a slit 279. The lead-out electrode L1 is formed rectilinearly along a straight line passing from the diode cell D1 to the cathode pad 277 through the diode cell D3. Similarly, the lead-out electrode L2 is formed rectilinearly along a straight line passing from the diode cell D4 to the cathode pad 277 through the diode cell D2. The lead-out electrodes L1 and L2 respectively have uniform widths W1 and W2 at all locations between the n$^+$-type regions 273 and the cathode pad 277, and the widths W1 and W2 are wider than the widths of the cell connection portions C1, C2, C3, and C4. The widths of the cell connection portions C1 to C4 are defined by the lengths in the direction orthogonal to the lead-out directions of the lead-out electrodes L1 and L2. Tip end portions of the lead-out electrodes L1 and L2 are shaped to match the planar shapes of the n$^+$-type regions 273. Base end portions of the lead-out electrodes L1 and L2 are connected to the cathode pad 277. The slit 279 is formed so as to border the lead-out electrodes L1 and L2. On the other hand, the anode electrode film 217 is formed on the front surface of the insulating film 220 so as to surround the cathode electrode film 216 across an interval corresponding to the slit 279 of substantially fixed width. The anode electrode film 217 integrally includes a comb-teeth-like portion extending in the long direction of the element forming surface 202A and the anode pad 278 that is constituted of a rectangular region.

As mentioned above, the cathode electrode film 216 and the anode electrode film 217 are covered by the protective film 223, constituted, for example, of a nitride film, and the resin film 224 is further formed on the protective film 223. The pad opening 219 exposing the cathode pad 277 and the pad opening 229 exposing the anode pad 278 are formed so as to penetrate through the protective film 223 and the resin film 224. The first external connection electrode 203 and the second external connection electrode 204 are respectively embedded in the pad openings 219 and 229. The protective film 223 and the resin film 224 suppress or prevent the entry of moisture to the lead-out electrodes L1 and L2 and the p-n junction regions 274 and also absorb impacts, etc., from the exterior, thereby contributing to improvement of the durability of the diode 207.

In each of the diode cells D1 to D4, the p-n junction region 274 is formed between the p-type semiconductor substrate 202 and the n$^+$-type region 273, and a p-n junction diode is thus formed respectively. The n$^+$-type regions 273 of the plurality of diode cells D1 to D4 are connected in common to the cathode electrode film 216, and the p$^+$-type semiconductor substrate 202, which is the p-type region in common to the diode cells D1 to D4, is connected in common to the anode electrode film 217. The plurality of diode cells D1 to D4, formed on the semiconductor substrate 202, are thereby connected in parallel all together.

Figure 37:
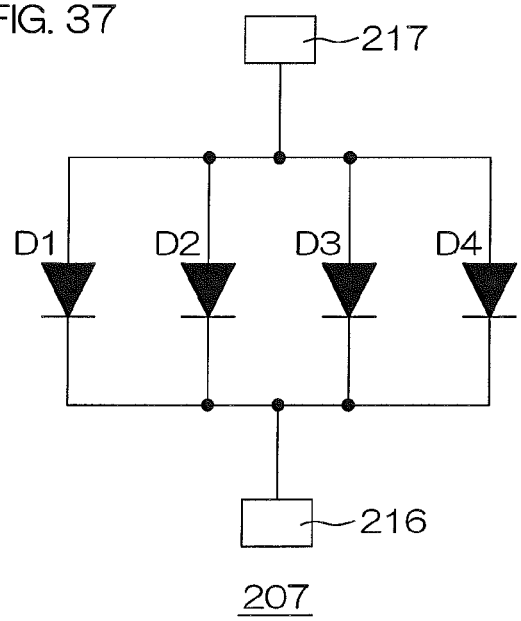
FIG. 37 is an electric circuit diagram showing the electrical structure of the interior of the diode.

FIG. 37 is an electric circuit diagram showing the electrical structure of the interior of the diode.

With the p-n junction diodes respectively constituted by the diode cells D1 to D4, the cathode sides are connected in common by the cathode electrode film 216, the anode sides are connected in common by the anode electrode film 217, and all of the diodes are thereby connected in parallel and made to function as a single diode as a whole.

With the arrangement of the present preferred embodiment, the diode 207 has the plurality of diode cells D1 to D4 and each of the diode cells D1 to D4 has the p-n junction region 274. The p-n junction regions 274 are separated according to each of the diode cells D1 to D4. The diode 207 is thus made long in the peripheral length of the p-n junction regions 274, that is, the total peripheral length (total extension) of the n$^+$-type regions 273 in the semiconductor substrate 202. The electric field can thereby be dispersed and prevented from concentrating at vicinities of the p-n junction regions 274, and the ESD tolerance can thus be improved. That is, even when the diode 207 is to be formed compactly, the total peripheral length of the p-n junction regions 274 can be made large, thereby enabling both downsizing of the diode 207 and securing of the ESD tolerance to be achieved at the same time.

Figure 38:
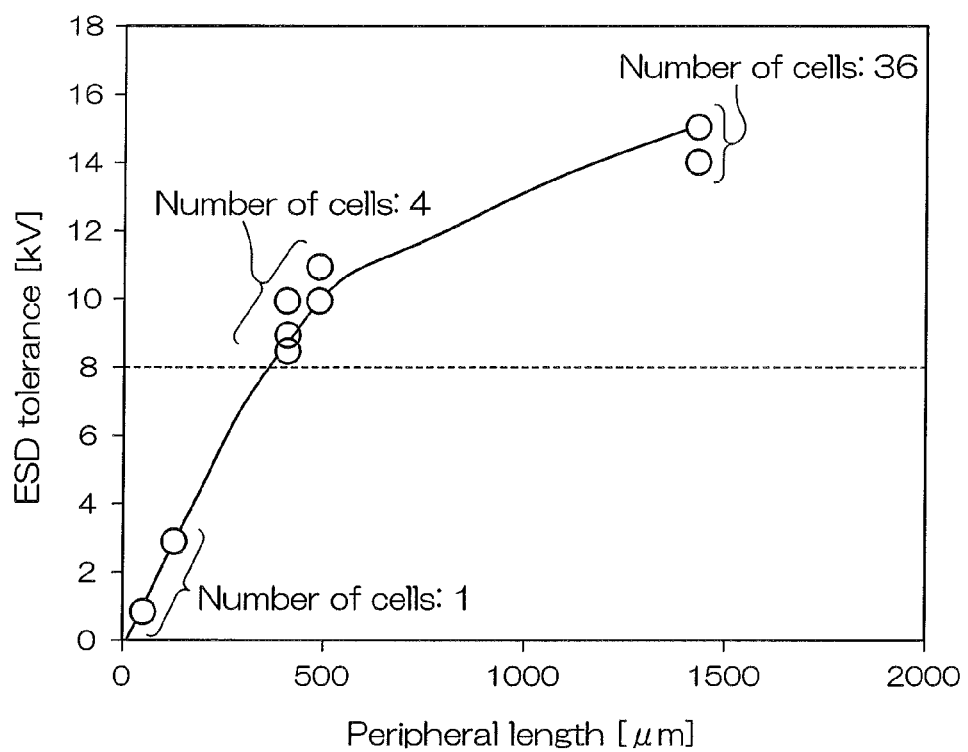
FIG. 38 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

FIG. 38 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

Further with the present preferred embodiment, the widths W1 and W2 of the lead-out electrodes L1 and L2 are wider than the widths of the cell connection portions C1 to C4 at all locations between the cell connection portions C1 to C4 and the cathode pad 277. A large allowable current amount can thus be set and electromigration can be reduced to improve reliability with respect to a large current. That is, a chip diode that is compact, high in ESD tolerance, and yet secured in reliability with respect to large currents can be provided.

Also with the present preferred embodiment, the plurality of diode cells D1 and D3 and the plurality of diode cells D2 and D4, which are respectively aligned along straight lines directed toward the cathode pad 277, are connected to the cathode pad 277 by the rectilinear lead-out electrodes L1 and L2 in common. The lengths of the lead-out electrodes from the diode cells D1 to D4 to the cathode pad 277 can thereby be minimized and electromigration can thus be reduced more effectively. Also, a single lead-out electrode L1 or L2 can be shared by the plurality of diode cells D1 and D3 or the plurality of diode cells D2 and D4, and therefore lead-out electrodes of wide line widths can be laid out on the semiconductor substrate 202 while forming a large number of diode cells D1 to D4 to increase the peripheral length of the diode junction regions (p-n junction regions 274). Both further improvement of ESD tolerance and reduction of electromigration can thereby be achieved at the same time to further improve the reliability.

Also, the end portions of the lead-out electrodes L1 and L2 have partially polygonal shapes matching the shapes (polygons) of the $n^+$-type regions 273 and can thus be connected to the $n^+$-type regions 273 while making small the areas occupied by the lead-out electrodes L1 and L2.

Also with the present preferred embodiment, the insulating film 220 is formed on the semiconductor substrate 202 and the cell connection portions C1 to C4 of the lead-out electrodes L1 and L2 are connected to the diode cells D1 to D4 via the contact holes 275 formed in the insulating film 220. The cathode pad 277 is disposed on the insulating film 220 in the region outside the contact holes 275. That is, the cathode pad 277 is provided at a position separated from positions directly above the p-n junction regions 274. Also, the anode electrode film 217 is connected to the semiconductor substrate 202 via the contact holes 276 formed in the insulating film 220, and the anode pad 278 is disposed on the insulating film 220 in the region outside the contact holes 276. The anode pad 278 is also disposed at a position separated from positions directly above the p-n junction regions 274. Application of a large impact to the p-n junction regions 274 can thus be avoided during mounting of the chip part 201 on the circuit substrate 209 as shown in FIG. 22B. Destruction of the p-n junction regions 274 can thereby be avoided and the chip part 201 that is excellent in durability against external forces can thereby be realized.

Also with the present preferred embodiment, the anode electrode film 217 is constituted of an AlSi film. An AlSi film is close in work function to a p-type semiconductor (especially a p-type silicon semiconductor) and can thus form a satisfactory ohmic junction with the $p^+$-type semiconductor substrate 202. There is thus no need to form a high impurity concentration diffusion layer for ohmic junction on the $p^+$-type semiconductor substrate 202. The manufacturing process can thereby be simplified and the productivity and the production cost can be reduced accordingly.

<Method for Manufacturing the Chip Part>

Figure 39:
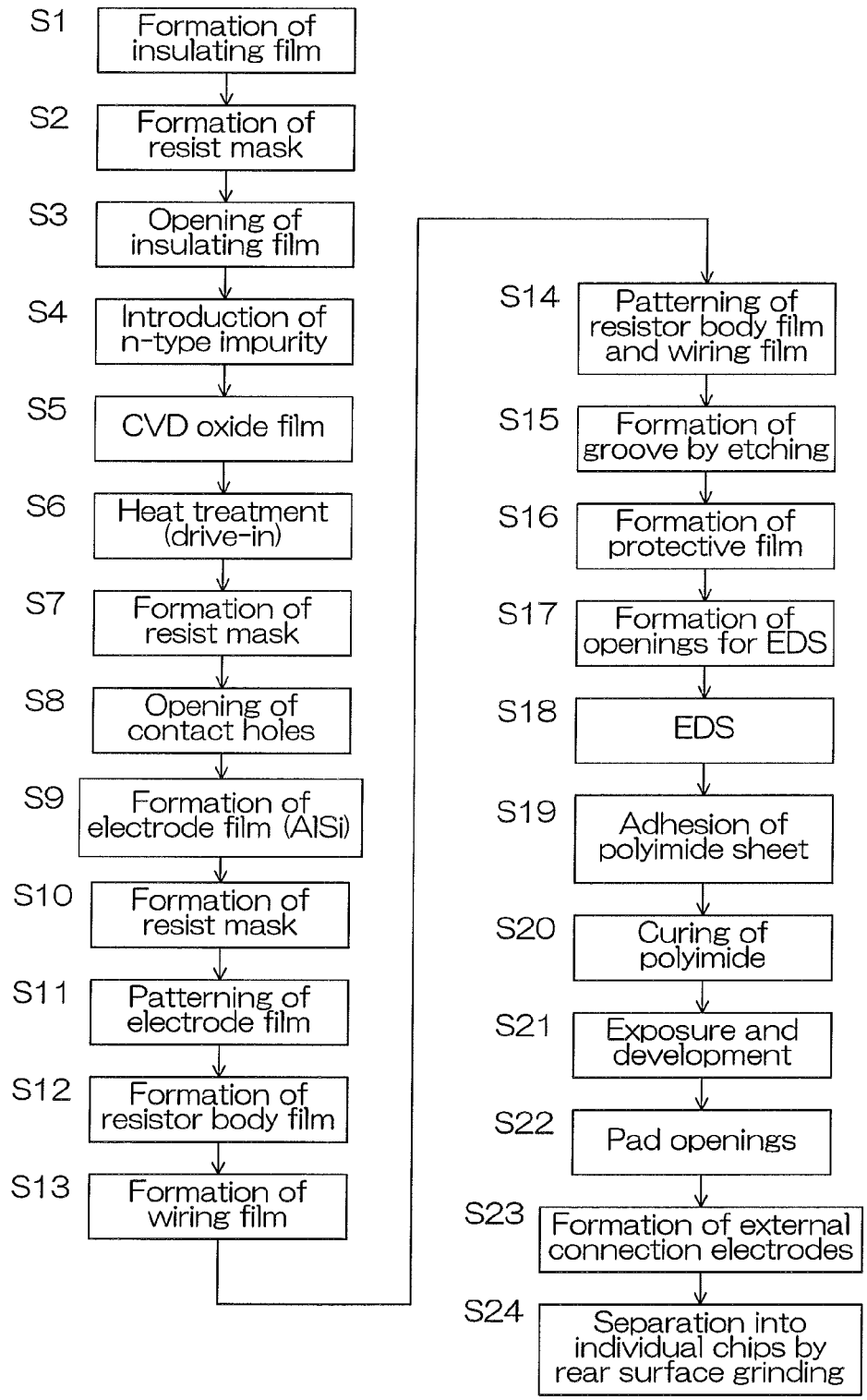
FIG. 39 is a process diagram for describing an example of a manufacturing process of the chip part.
Figure 41A:
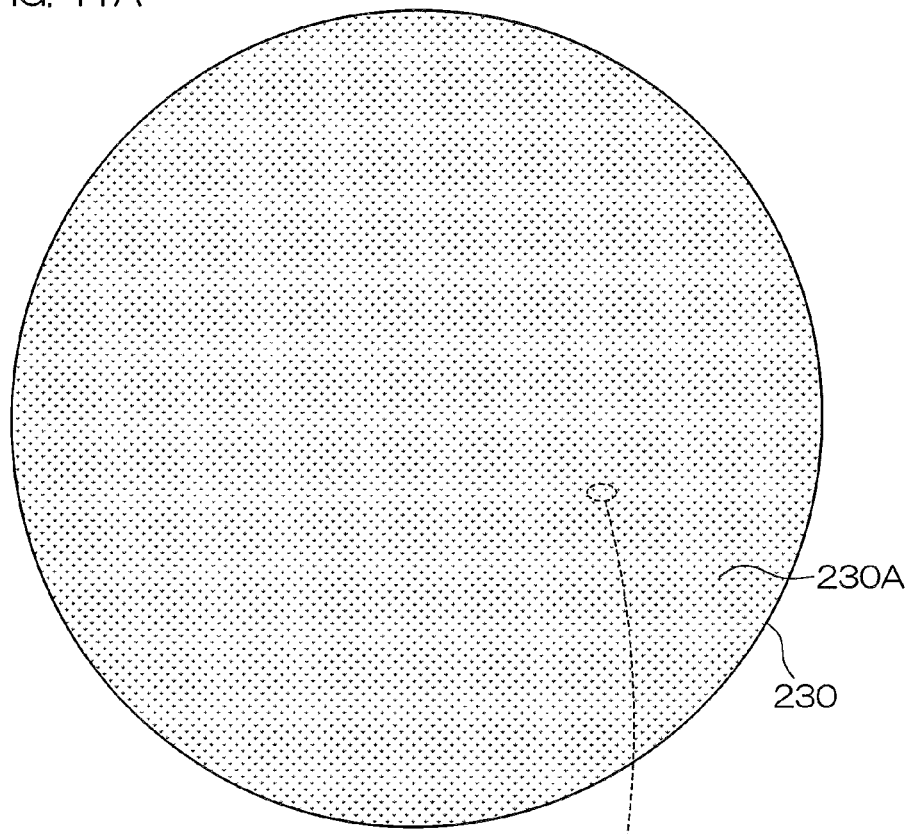
FIG. 41A is a schematic plan view of the semiconductor wafer after the groove has been formed.
Figure 41B:
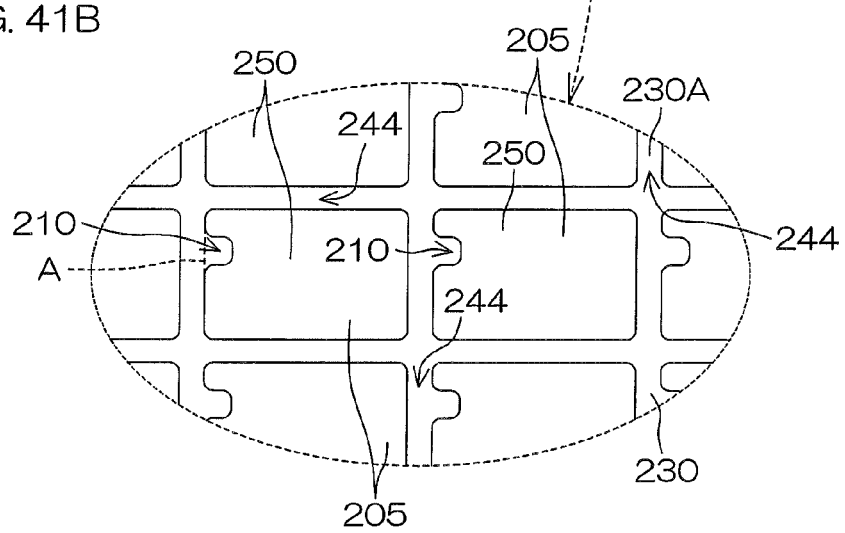
FIG. 41B is an enlarged view of a portion in FIG. 41A.
Figure 42A:
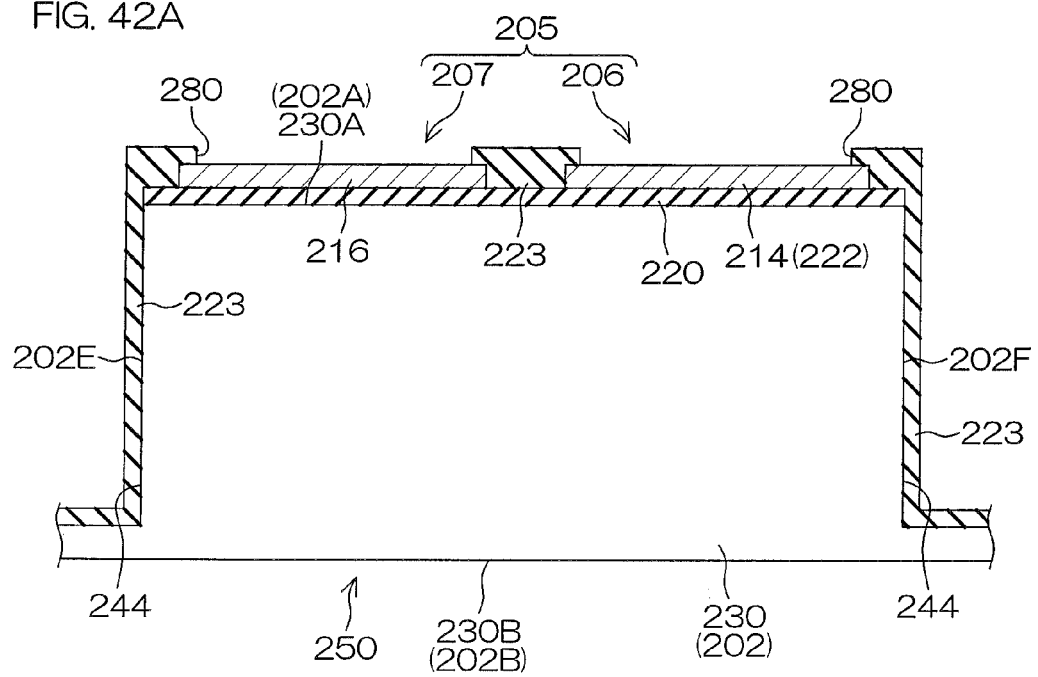
FIG. 42A is a sectional view of the arrangement of the chip part in the middle of the manufacturing process.
Figure 42B:
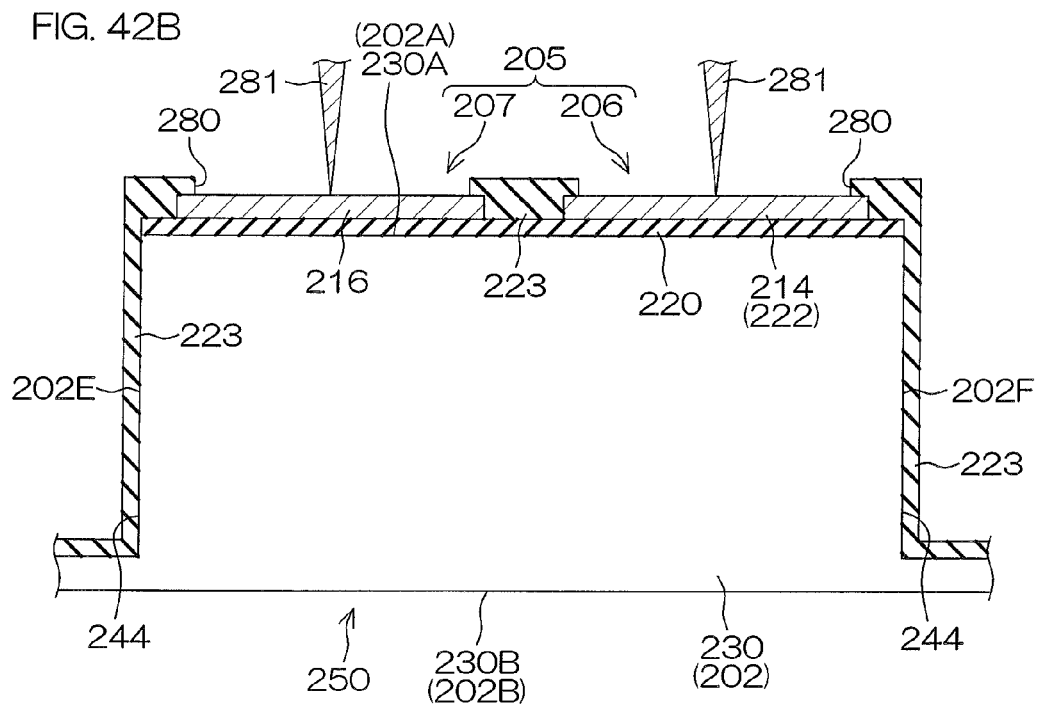
FIG. 42B is a diagram of a step subsequent to that of FIG. 42A.

FIG. 39 is a process diagram for describing an example of a manufacturing process of the chip part. FIG. 40 is a schematic plan view of a portion of a resist pattern used for forming a groove in a semiconductor wafer. FIG. 41A is a schematic plan view of the semiconductor wafer after the groove has been formed, and FIG. 41B is an enlarged view of a portion in FIG. 41A. FIGS. 42A to 42C are sectional views of the arrangement of the chip part in the middle of the manufacturing process. FIG. 43 is an illustrative perspective view of a state of adhering a polyimide sheet onto the semiconductor wafer.

First, the $p^+$-type semiconductor wafer 230 is prepared as the base substrate of the semiconductor substrate 202. A front surface 230A of the semiconductor wafer 230 is the element forming surface 202A of the semiconductor substrate 202 and a rear surface 230B of the semiconductor wafer 230 is the rear surface 202B of the semiconductor substrate 202.

Next, with reference to FIG. 34 and FIG. 35 together with FIG. 39, the insulating film 220 (with a thickness, for example, of 8000 Å to 8600 Å), which is a thermal oxide film or CVD oxide film, etc., is formed on the front surface 230A of the $p^+$-type semiconductor wafer 230 (the element forming surface 202A of the semiconductor wafer 202) (S1) and a resist mask is formed thereabove (S2). Openings corresponding to the $n^+$-type regions 273 are then formed in the insulating film 220 by etching using the resist mask (S3). Further, after peeling off the resist mask, an n-type impurity is introduced to surface layer portions of the semiconductor wafer 230 that are exposed from the openings formed in the insulating film 220 (S4). The introduction of the n-type impurity may be performed by a step of depositing phosphorus as the n-type impurity on the front surface (so-called phosphorus deposition) or by implantation of n-type impurity ions (for example, phosphorus ions). Phosphorus deposition is a process of depositing phosphorus on the front surface 230A of the semiconductor wafer 230 exposed inside the openings in the insulating film 220 by conveying the semiconductor wafer 230 into a diffusion furnace and performing heat treatment while making $POCl_3$ gas flow inside a diffusion passage. After thickening the insulating film 220 (thickening, for example, by approximately 1200 Å by CVD oxide film formation) as necessary (S5), heat treatment (drive-in) for activation of the impurity ions introduced into the semiconductor wafer 230 is performed (S6). The $n^+$-type regions 273 are thereby formed on the surface layer portion of the semiconductor wafer 230.

Thereafter, another resist mask having openings matching the contact holes 275 and 276 is formed on the insulating film 220 (S7). The contact holes 275 and 276 are formed in the insulating film 220 by etching via the resist mask (S8), and the resist mask is peeled off thereafter.

An electrode film for forming the cathode electrode film 216 and the anode electrode film 217 is then formed on the insulating film 220, for example, by sputtering (S9). In the present preferred embodiment, an electrode film (for example of 10000 Å thickness), made of AlSi, is formed. Another resist mask having an opening pattern corresponding to the slit 279 is then formed on the electrode film (S10) and the slit 279 is formed in the electrode film by etching (for example, reactive ion etching) via the resist mask (S11). The width of the slit 279 may be approximately 3 μm. The electrode film is thereby separated into the cathode electrode film 216 and the anode electrode film 217.

Next, with reference to FIG. 32 together with FIG. 39, after peeling off the resist film, the resistor body film 221 of TiN or TiON is formed, for example, by sputtering on the insulating film 220 (S12) and further, the wiring film 222 of aluminum (Al) is laminated on the resistor body film 221 (S13). Thereafter, a photolithography process is used and, for example, dry etching is performed to selectively remove the resistor body film 221 and the wiring film 222 (S14). The arrangement where the resistor body film lines 221A of fixed width, at which the resistor body film 221 is laminated, are arrayed in the column direction while being spaced apart by fixed intervals in a plan view is thereby obtained. At this point, regions at which the resistor body film lines 221A and the wiring films 222 are interrupted are also formed. Thereafter, the wiring films 222 laminated on the resistor body film lines 221A are removed selectively. The resistor network 271 of the arrangement where the wiring films 222 (first wiring film 214 and second wiring film 215) are laminated on the resistor body film lines 221A while being spaced apart by the fixed intervals R is consequently obtained.

Thereafter, a resist pattern 241 having an opening is formed. As shown in FIG. 40, when a plurality of the chip parts 201 are disposed in an array (that is also a lattice), the resist pattern 241 has the opening 242 that matches regions (hatched portions in FIG. 40) between outlines of mutually adjacent chip parts 201 in a plan view. The overall shape of the opening 242 is thus a lattice having a plurality of mutually orthogonal rectilinear portions 242A and 242B. Also, in either of the rectilinear portions 242A and 242B (the rectilinear portions 242A in the present example), projecting portions 242C, projecting orthogonally from the rectilinear portions 242A, are provided in continuous form in correspondence to the recesses 210 of the chip parts 201 (see FIG. 22A).

Here, with each chip part 201, the corner portions 211 and 212 have round shapes (see FIG. 22A) as described above. Accordingly, the mutually orthogonal rectilinear portions 242A and 242B in the opening 242 are curvingly connected to each other. The mutually orthogonal rectilinear portions 242A and projecting portions 242C are also curvingly connected to each other. Intersection portions 243A of the rectilinear portions 242A and 242B and intersection portions 243B of the rectilinear portions 242A and projecting portions 242C thus have round shapes with rounded corners. Also, in each projecting portion 242C, corners besides the intersection portion 243B are also rounded.

The insulating film 220 and the semiconductor wafer 230 are then respectively removed selectively by plasma etching using the resist pattern 241 as a mask. A groove 244, penetrating through the insulating film 220 and reaching the middle of the thickness of the semiconductor wafer 230, is thereby formed at positions coinciding with the opening 242 of the resist pattern 241 in a plan view (S15). The groove 244 has mutually facing side surfaces and a bottom surface joining the lower ends (ends at the rear surface 230B side of the semiconductor wafer 230) of the facing side surfaces as shown in FIGS. 42A to C. The depth of the groove 244 on the basis of the front surface 230A of the semiconductor wafer 230 is approximately 100 μm and the width of the groove 244 is approximately 20 μm.

Referring to FIG. 41B, the overall shape of the groove 244 is a lattice that coincides with the opening 242 (see FIG. 40) of the resist pattern 241 in a plan view. At the front surface 230A of the semiconductor wafer 230, rectangular frame portions of the groove 244 surround the regions in which the composite elements 205 are formed. In the semiconductor wafer 230, each portion surrounded by the groove 244 is a semi-finished product 250 of the chip part 201. At the front surface 230A of the semiconductor wafer 230, one semi-finished product 250 is positioned in each region surrounded by the groove 244, and these semi-finished products 250 are aligned and disposed in an array.

After the groove 244 has been formed, the resist pattern 241 is removed and the protective film 223 is formed on the front surface 230A of the semiconductor wafer 230 by the CVD method as shown in FIG. 42A (S16). The protective film 223 has a thickness of approximately 3000 Å. The protective film 223 is formed so as to cover not only the entirety of the front surface 230A of the semiconductor wafer 230 but also the inner surfaces of the groove 244. The protective film 223 is a thin film that is formed to a substantially fixed thickness on the inner surfaces of the groove 244 and therefore does not fill the groove 244 completely. Thereafter, the protective film 223 is selectively etched to form openings 280 that expose the first wiring film 214, the second wiring film 215, the cathode electrode film 216, and the anode electrode film 217 (S17).

Thereafter, as shown in FIG. 42B, EDS (electrical die sorting) measurement using probes 281 is performed (S18). In the EDS measurement, resistor measurement of putting the probes 281 in contact across the first wiring film 214 and the second wiring film 215 to inspect the electrical characteristics of the resistor portion 206 and diode measurement of putting the probes 281 in contact across the cathode electrode film 216 and the anode electrode film 217 to inspect the electrical characteristics of the diode 207 are performed in separate steps. The respective electrical characteristics of the resistor portion 206 and the diode 207 can thereby be obtained as mutually independent values.

Figure 43A:
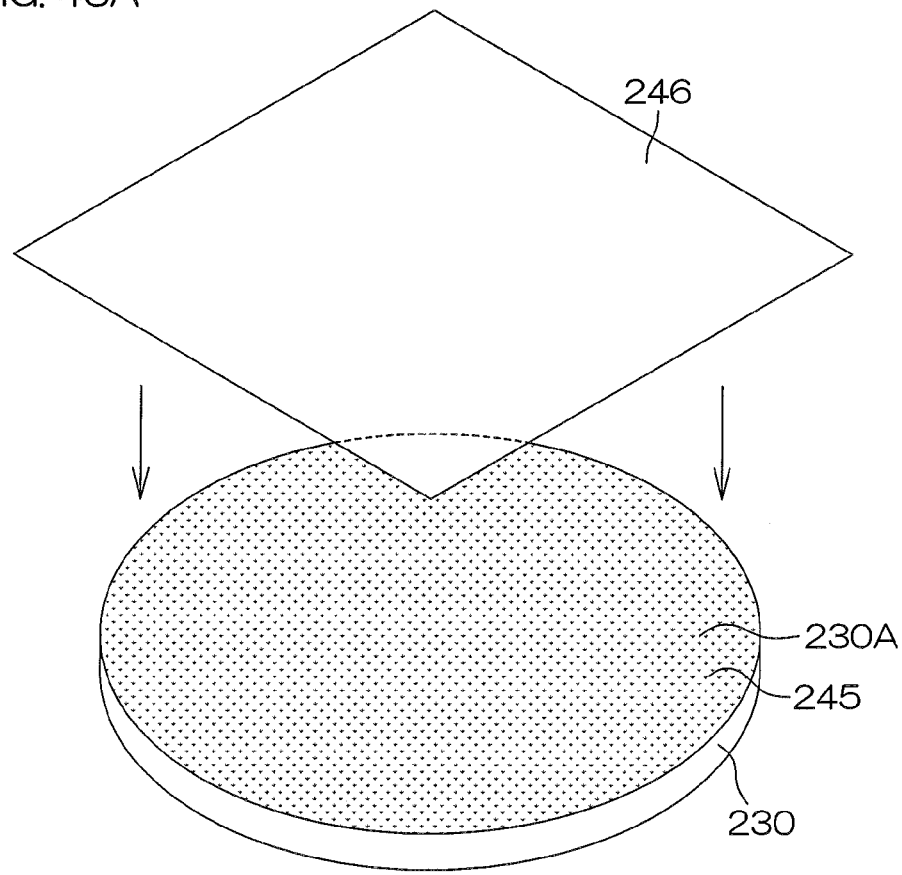
FIG. 43 is an illustrative perspective view of a state of adhering a polyimide sheet onto the semiconductor wafer.

Thereafter, a photosensitive resin sheet 246, made of polyimide, is adhered onto the semiconductor wafer 230 from above the protective film 223 at portions besides the groove 244 as shown in FIG. 43A (S19).

Figure 43B:
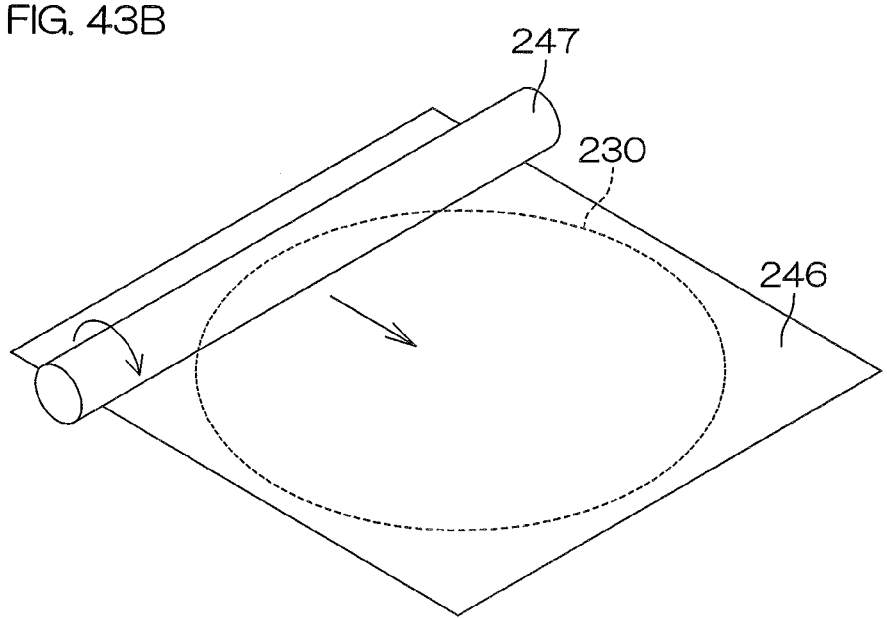

After covering the semiconductor wafer 230 with the polyimide sheet 246 from the front surface 230A side, the sheet 246 is pressed against the semiconductor wafer 230 by a rotating roller 247 as shown in FIG. 43B. When the sheet 246 has been adhered on the entirety of the front surface of the protective film 223 at portions besides the groove 244, although portions of the sheet 246 are slightly indented toward the groove 244 side, only upper end portions of the side surfaces of the groove 244 are covered and the sheet 246 does not reach the bottom surface of the groove 244. A space of substantially the same size as the groove 244 is thus formed inside the groove 244 between the sheet 246 and the bottom surface of the groove 244. The thickness of the sheet 246 in this state is 10 μm to 30 μm.

Thereafter, a heat treatment is applied to the sheet 246 (S20). The thickness of the sheet 246 is thereby thermally contracted to approximately 5 μm.

Thereafter, the sheet 246 is patterned (exposed and developed) to selectively remove portions of the sheet 246 coinciding with the groove 244 in a plan view (S21). The sheet 246 is thereby separated at portions above the groove 244 and separated edge portions of the sheet 246 overlap with the protective film 223 on the side surfaces of the groove 244 while drooping slightly toward the groove 244 side. The resin film 224, with which the overhanging portions of round shapes are formed naturally at the edge portions, is thereby obtained.

Thereafter, the resin film 224 and the protective film 223 are selectively removed by etching to form the pad openings 218, 219, 228, and 229 at the same time as shown in FIG. 42C (S22).

Thereafter, as shown in FIG. 42C, Ni/Pd/Au laminated films, arranged by laminating Ni, Pd, and Au, are grown by electroless plating from the films 214 to 217 exposed in the respective pad openings 218, 219, 228, and 229. This plating process is continued until the laminated films growing from mutually adjacent pad openings 218 and 219 are made integral across the protective film 223 in between. Similarly, the laminated films growing from mutually adjacent pad openings 228 and 229 are also made integral across the protective film 223 in between. The first external connection electrode 203 in common to the first wiring film 214 and the cathode electrode film 216 and the second external connection electrode 204 in common to the second wiring film 215 and the anode electrode film 217 are thereby formed at the same time (S23).

Then after performing a conduction test across the first external connection electrode 203 and the second external connection electrode 204, the semiconductor wafer 230 is ground from the rear surface 230B. Here, the entirety of the portions of the semiconductor wafer 230 forming the side surfaces of the groove 244 is covered by the protective film 223 so that formation of microcracks, etc., in those portions during the grinding of the semiconductor wafer 230 is prevented, and even if a microcrack forms, the microcrack can be embedded by the protective film 223 to suppress expansion of the microcrack.

When the semiconductor wafer 230 has been thinned by grinding until the bottom surface of the groove 244 is reached, portions joining mutually adjacent semi-finished products 250 are no longer present and the semiconductor wafer 230 is thus divided with the groove 244 as boundaries and the semi-finished products 250 are separated individually as chip parts 201. The chip parts 201 are thereby completed. Even if the chip parts 201 are small in chip size, the chip parts 201 can be separated into individual chips by thus forming the groove 244 in advance and then grinding the semiconductor wafer 230 from the rear surface 230B. Therefore in comparison to the conventional case where the semiconductor wafer 230 is diced using a dicing saw to separate the chip parts 201 into individual chips, the dicing step can be eliminated to promote cost reduction and time savings and achieve improvement of yield.

With the present preferred embodiment, the first wiring film 214 and the second wiring film 215 of the resistor portion 206 and the cathode electrode film 216 and the anode electrode film 217 of the diode 207 are mutually independent and therefore even if these plurality of elements are connected in parallel, the electrical characteristics of the resistor portion 206 and the diode 207 can be measured mutually independently as shown in FIG. 42B. Further, after the EDS measurement, the electrode films that were mutually independent are electrically connected to each other by the first external connection electrode 203 and the second external connection electrode 204 in common. Consequently, the chip part 201 (composite element) with two electrodes can be provided.

Also, for example as shown in FIG. 22A, by setting the space $W_1$ between the pad openings 218 and 219 and by setting the space $W_2$ between the pad openings 228 and 229 to appropriate sizes, coupling of the first wiring film 214 and the cathode electrode film 216 to each other and coupling of the second wiring film 215 and the anode electrode film 217 to each other can be achieved easily by plating growth.

Also with the present preferred embodiment, the semiconductor substrate 202 is constituted of the p-type semiconductor and therefore stable characteristics can be realized even if an epitaxial layer is not formed on the semiconductor substrate 202. That is, an n-type semiconductor wafer is large in in-plane variation of resistivity, and therefore when an n-type semiconductor wafer is used, an epitaxial layer with low in-plane variation of resistivity must be formed on the front surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a diode with stable characteristics can be cut out from any location of the wafer without having to form an epitaxial layer. Therefore by using the $p^+$-type semiconductor substrate 202, the manufacturing process can be simplified and the manufacturing cost can be reduced.

Figure 44A:
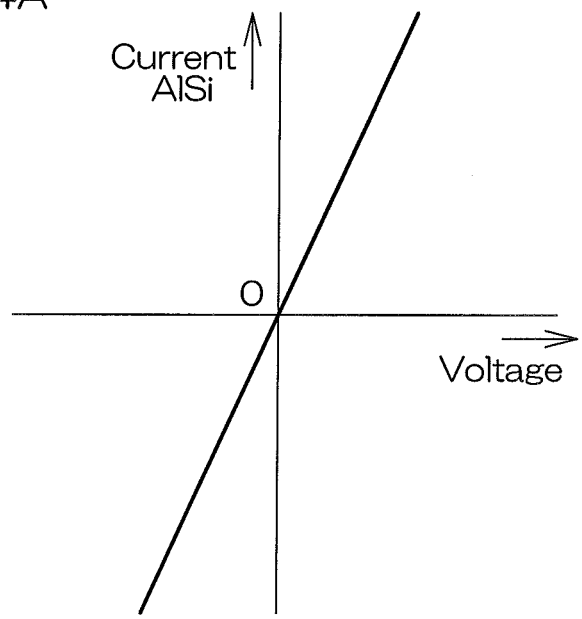
FIG. 44A and FIG. 44B are diagrams for describing the ohmic contact of an AlSi electrode film and a $p^+$-type semiconductor substrate.
Figure 44B:
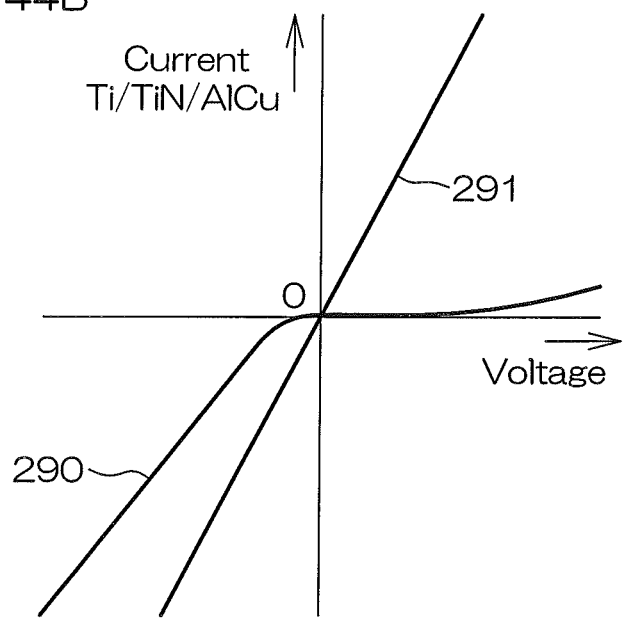

FIG. 44A and FIG. 44B are diagrams for describing the ohmic contact of an AlSi electrode film and a $p^+$-type semiconductor substrate.

FIG. 44A shows voltage vs. current characteristics between a $p^+$-type silicon substrate and an AlSi film when the AlSi film is formed on the $p^+$-type silicon substrate. The current is proportional to the applied voltage and it can thus be understood that a satisfactory ohmic contact is formed. For comparison, a curve 290 in FIG. 43B shows the same characteristics in a case where the electrode film formed on the $p^+$-type silicon substrate is arranged as a laminated film in which a Ti film, a TiN film, and an AlCu film are laminated successively from the substrate front surface. The voltage vs. current characteristics are not linear characteristics and it can thus be understood that an ohmic contact is not obtained. On the other hand, a curve 291 shows the voltage vs. current characteristics in a case where a high concentration region is formed by introducing a p-type impurity to a higher concentration in the front surface of a $p^+$-type silicon substrate and an electrode film, constituted of a laminated film formed by laminating a Ti film, a TiN film, and an AlCu film successively on the substrate front surface, is put in contact with the high concentration region. In this case, the voltage vs. current characteristics are linear characteristics and it can thus be understood that a satisfactory ohmic contact is obtained. From the above, it can be understood that by using an AlSi film as the electrode film, a cathode electrode film and an anode electrode film that are in ohmic contact with the $p^+$-type silicon substrate can be formed without having to form a high concentration region in the $p^+$-type silicon substrate and the manufacturing process can thereby be simplified.

Figure 45:
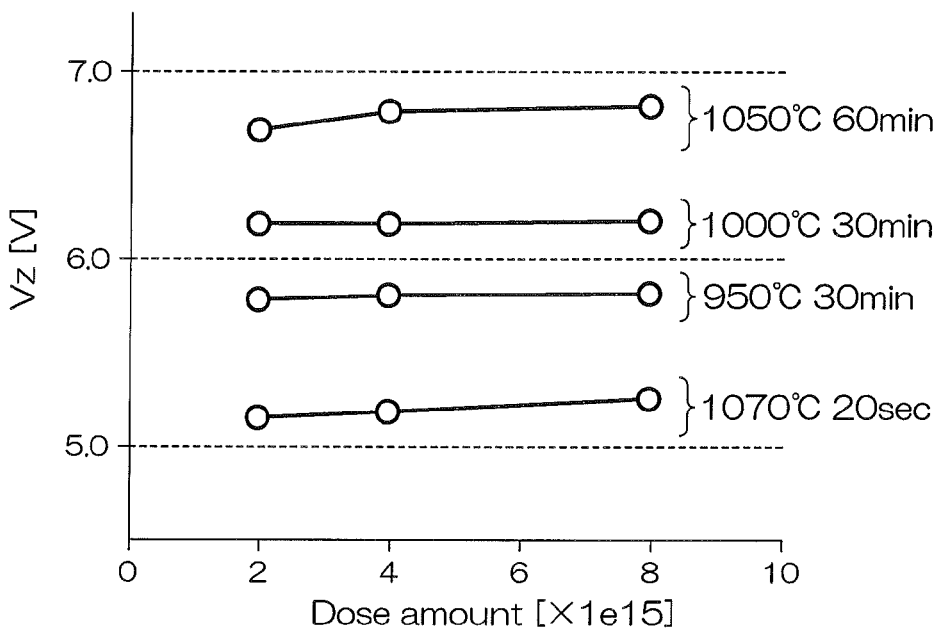
FIG. 45 is a diagram for describing a feature related to adjustment of a Zener voltage (Vz) of the diode.

FIG. 45 is a diagram for describing a feature related to adjustment of a Zener voltage (Vz) of the diode 207. That is, the feature concerning Zener voltage adjustment in a case where the diode 207 is arranged as a Zener diode is shown. To describe more specifically, after introducing an n-type impurity (for example, phosphorus) in the surface layer portion of the semiconductor substrate 202 to form the $n^+$-type regions 273, the heat treatment (drive-in) for activating the introduced impurity is performed. The Zener voltage changes in accordance with the temperature and duration of the heat treatment. Specifically, the Zener voltage tends to increase with increase in the amount of heat applied to the semiconductor substrate 202 during the heat treatment. The Zener voltage can be adjusted using this tendency. As can be understood from FIG. 45, the Zener voltage is more strongly dependent on the heat amount during the heat treatment than the impurity dose amount.

Figure 46:
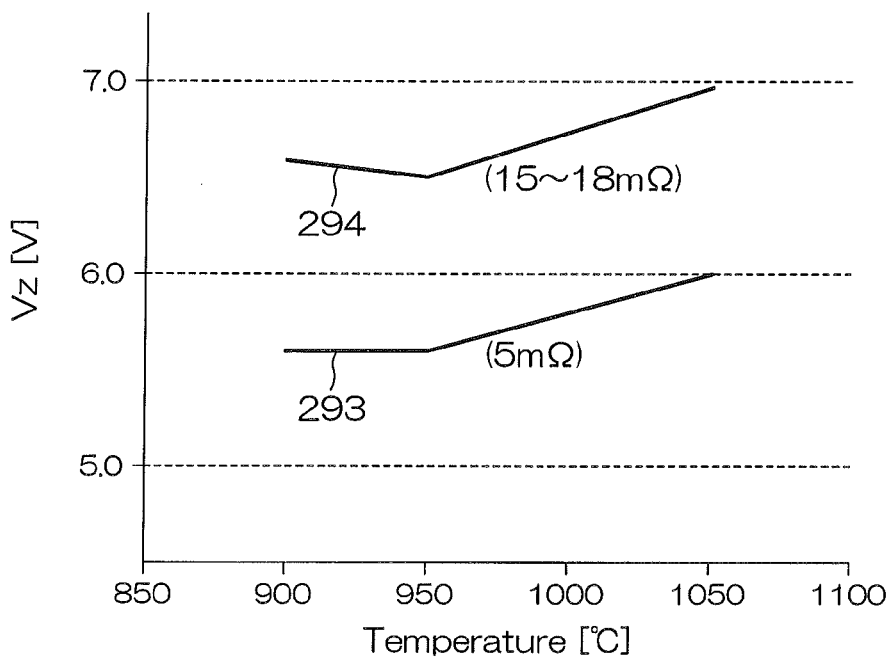
FIG. 46 is a diagram for describing another feature related to the adjustment of the Zener voltage (Vz).

FIG. 46 is a diagram for describing another feature related to the adjustment of the Zener voltage (Vz). Specifically, changes of the Zener diode with respect to the temperature during the heat treatment for activating the n-type impurity introduced into the semiconductor substrate 202 are shown, with a curve 293 showing the Zener voltage in a case of using a semiconductor substrate with a comparatively low resistivity (for example, 5 mΩ) and a curve 294 showing the Zener voltage in a case of using a semiconductor substrate with a comparatively high resistivity (for example, 15 to 18 mΩ). From a comparison of the curves 293 and 294, it can be understood that the Zener voltage is dependent on the resistivity of the semiconductor substrate. The Zener voltage can thus be adjusted to a design value by applying a semiconductor substrate with a resistivity that is appropriate in accordance with the targeted Zener voltage.

Figure 47:
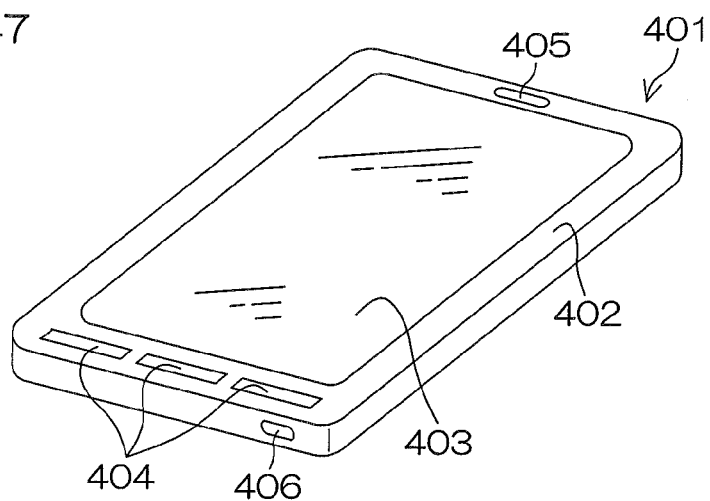
FIG. 47 is a perspective view of an outer appearance of a smartphone that is an example of an electronic device in which the chip part is used.

FIG. 47 is a perspective view of an outer appearance of a smartphone that is an example of an electronic device in which the chip part is used.

The smartphone 401 is arranged by housing electronic parts in the interior of a casing 402 with a flat rectangular parallelepiped shape. The casing 402 has a pair of major surfaces, each of oblong shape, at its front side and rear side, and the pair of major surfaces are coupled by four side surfaces. A display surface of a display panel 403, constituted of a liquid crystal panel or an organic EL panel, etc., is exposed at one of the major surfaces of the casing 402.

The display surface of the display panel 403 constitutes a touch panel and provides an input interface for a user.

The display panel 403 is formed to an oblong shape that occupies most of one of the major surfaces of the casing 402. Operation buttons 404 are disposed along one short side of the display panel 403. In the present preferred embodiment, a plurality (three) of the operation buttons 404 are lined up along the short side of the display panel 403. The user can call and execute necessary functions by performing operations of the smartphone 401 by operating the operation buttons 404 and the touch panel.

A speaker 405 is disposed in a vicinity of the other short side of the display panel 403. The speaker 405 provides an earpiece for a telephone function and is also used as an acoustic conversion unit for reproducing music data, etc. On the other hand, close to the operation buttons 404, a microphone 406 is disposed at one of the side surfaces of the casing 402. The microphone 406 provides a mouthpiece for the telephone function and may also be used as a microphone for sound recording.

Figure 48:
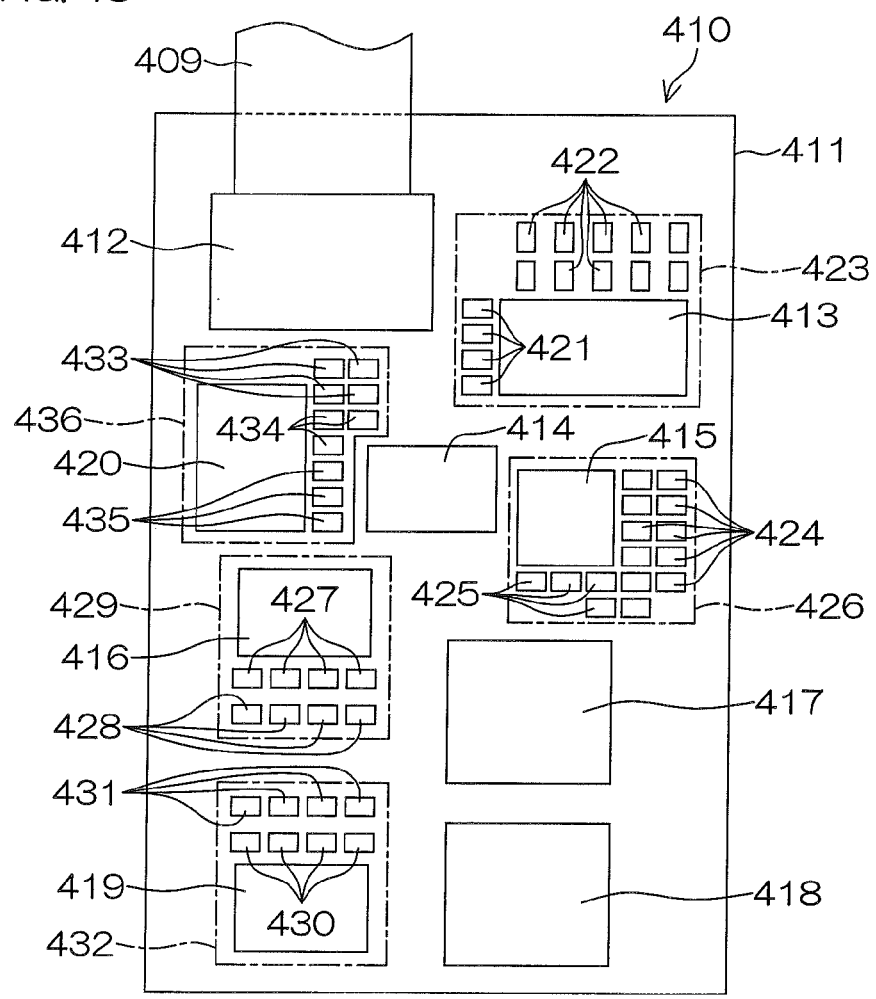
FIG. 48 is an illustrative plan view of the arrangement of an electronic circuit assembly housed in a casing of the smartphone.

FIG. 48 is an illustrative plan view of the arrangement of an electronic circuit assembly housed in the interior of the casing of the smartphone.

The electronic circuit assembly 410 includes a wiring substrate 411 and circuit parts mounted on a mounting surface of the wiring substrate 411. The plurality of circuit parts include a plurality of integrated circuit elements (ICs) 412 to 420 and a plurality of chip parts. The plurality of ICs include a transmission processing IC 412, a one-segment TV receiving IC 413, a GPS receiving IC 414, an FM tuner IC 415, a power supply IC 416, a flash memory 417, a microcomputer 418, a power supply IC 419, and a baseband IC 420. The plurality of chip parts include chip inductors 421, 425, and 435, chip resistors 422, 424, and 433, chip capacitors 427, 430, and 434, and chip diodes 428 and 431. The chip parts are mounted on the mounting surface of the wiring substrate 411, for example, by flip-chip bonding. The structure of the chip part 201 described above may be applied to the chip inductors 421, 425, and 435, chip resistors 422, 424, and 433, chip capacitors 427, 430, and 434, and chip diodes 428 and 431.

The transmission processing IC 412 has incorporated therein an electronic circuit arranged to generate display control signals for the display panel 403 and receive input signals from the touch panel on the front surface of the display panel 403. For connection with the display panel 403, the transmission processing IC 412 is connected to a flexible wiring 409.

The one-segment TV receiving IC 413 incorporates an electronic circuit that constitutes a receiver for receiving one-segment broadcast (terrestrial digital television broadcast targeted for reception by portable equipment) radio waves. A plurality of the chip inductors 421 and a plurality of the chip resistors 422 are disposed in a vicinity of the one-segment TV receiving IC 413. The one-segment TV receiving IC 413, the chip inductors 421, and the chip resistors 422 constitute a one-segment broadcast receiving circuit 423. The chip inductors 421 and the chip resistors 422 respectively have accurately adjusted inductances and resistances and provide circuit constants of high precision to the one-segment broadcast receiving circuit 423.

The GPS receiving IC 414 incorporates an electronic circuit that receives radio waves from GPS satellites and outputs positional information of the smartphone 401.

The FM tuner IC 415 constitutes, together with a plurality of the chip resistors 424 and a plurality of the chip inductors 425 mounted on the wiring substrate 411 in a vicinity thereof, an FM broadcast receiving circuit 426. The chip resistors 424 and the chip inductors 425 respectively have accurately adjusted resistance value and inductances and provide circuit constants of high precision to the FM broadcast receiving circuit 426.

A plurality of the chip capacitors 427 and a plurality of the chip diodes 428 are mounted on the mounting surface of the wiring substrate 411 in a vicinity of the power supply IC 416. Together with the chip capacitors 427 and the chip diodes 428, the power supply IC 416 constitutes a power supply circuit 429.

The flash memory 417 is a storage device for recording operating system programs, data generated in the interior of the smartphone 401, and data and programs acquired from the exterior by communication functions, etc.

The microcomputer 418 is a computing processing circuit that incorporates a CPU, a ROM, and a RAM and realizes a plurality of functions of the smartphone 401 by executing various computational processes. More specifically, computational processes for image processing and various application programs are realized by actions of the microcomputer 418.

A plurality of the chip capacitors 430 and a plurality of the chip diodes 431 are mounted on the mounting surface of the wiring substrate 411 in a vicinity of the power supply IC 419. Together with the chip capacitors 430 and the chip diodes 431, the power supply IC 419 constitutes a power supply circuit 432.

A plurality of the chip resistors 433, a plurality of the chip capacitors 434, and a plurality of the chip inductors 435 are mounted on the mounting surface of the wiring substrate 411 in a vicinity of the baseband IC 420. Together with the chip resistors 433, the chip capacitors 434, and the chip inductors 435, the baseband IC 420 constitutes a baseband communication circuit 436. The baseband communication circuit 436 provides communication functions for telephone communication and data communication.

With the above arrangement, electric power that is appropriately adjusted by the power supply circuits 429 and 432 is supplied to the transmission processing IC 412, the GPS receiving IC 414, the one-segment broadcast receiving circuit 423, the FM broadcast receiving circuit 426, the baseband communication circuit 436, the flash memory 417, and the microcomputer 418. The microcomputer 418 performs computational processes in response to input signals input via the transmission processing IC 412 and makes the display control signals be output from the transmission processing IC 412 to the display panel 403 to make the display panel 403 perform various displays.

When receiving of a one-segment broadcast is commanded by operation of the touch panel or the operation buttons 404, the one-segment broadcast is received by actions of the one-segment broadcast receiving circuit 423. Computational processes for outputting the received images to the display panel 403 and making the received audio signals be acoustically converted by the speaker 405 are executed by the microcomputer 418.

Also, when positional information of the smartphone 401 is required, the microcomputer 418 acquires the positional information output by the GPS receiving IC 414 and executes computational processes using the positional information.

Further, when an FM broadcast receiving command is input by operation of the touch panel or the operation buttons 404, the microcomputer 418 starts up the FM broadcast receiving circuit 426 and executes computational processes for outputting the received audio signals from the speaker 405.

The flash memory 417 is used for storing data acquired by communication and storing data prepared by computations by the microcomputer 418 and inputs from the touch panel. The microcomputer 418 writes data into the flash memory 417 or reads data from the flash memory 417 as necessary.

The telephone communication or data communication functions are realized by the baseband communication circuit 436. The microcomputer 418 controls the baseband communication circuit 436 to perform processes for sending and receiving audio signals or data.

Although preferred embodiments of the reference example of the present invention have been described above, the present invention may be implemented in yet other modes as well.

For example, various elements, such as a capacitor, inductor, etc., may be provided in place of the resistor portion 206 and the diode 207 in the composite element 205 and the combination of elements may be changed as suited.

Also, the first external connection electrode 203 and the second external connection electrode 204 may be formed by a method besides a plating method.

Also, although an example where four diode cells are formed on the semiconductor substrate was illustrated as an example of the diode 207, one, two, or three diode cells may be formed or not less than four diode cells may be formed on the semiconductor substrate.

By this arrangement, an electronic device can be provided such that a circuit assembly, using a chip part including a composite element, with which the respective electrical characteristics of single elements can be measured mutually independently even with the external connection electrodes being two electrodes, is housed inside a casing.

While preferred embodiments of the present invention and of a reference example of the present invention have been described, the preferred embodiments are merely specific examples used to clarify the technical contents of the present invention, and the present invention should not be interpreted as being limited only to these specific examples, and the spirit and scope of the present invention shall be limited only by the appended claims.

The present application corresponds to Japanese Patent Application No. 2012-242834 filed on Nov. 2, 2012 in the Japan Patent Office and Japanese Patent Application No. 2013-183157 filed on Sep. 4, 2013 in the Japan Patent Office, and the entire disclosures of these applications are incorporated herein by reference.

DESCRIPTION OF THE SYMBOLS 1 chip capacitor (first preferred embodiment)
2 silicon substrate
2A element forming surface
2B rear surface
2C, 2D, 2E, 2F side surface
2a p-type region
3 first external electrode
3A long side
3B short side
3a front surface portion
3b side surface portion
4 second external electrode
4A long side
4B short side
4a front surface portion
4b side surface portion
5 capacitor element
7 corner portion
9 mounting substrate
10 circuit assembly
11 land
12 suction nozzle
13 solder
15 $n^+$-type impurity diffusion layer (lower electrode)
16 trench
16a side wall surface
16b bottom wall surface
17 fuse unit
20 capacitance film
20a-20d opening
21 upper electrode film
21A capacitor electrode region
21B pad region
21C fuse region
22 polysilicon film
23 metal film
24 pad metal film
25 lower electrode film
30 electrode film portion
30A connection portion
30B main portion
30a stepped edge portion
30b first rectilinear edge portion
30c second rectilinear edge portion
31-36 electrode film portion
38 laser light
39 cover film
40 passivation film
41 resin film
43, 44 pad opening
45 insulating film
45a-45d opening
46 insulating film
46a, 46b opening
50 bidirectional diode
501 first diode
502 second diode
51 $n^+$-type impurity diffusion layer
52 wiring film
52A pad region
53 insulating layer
54 pad opening
60 inspection probe
65 capacitor region
66 diode region
67 p-type impurity diffusion layer
68 $n^+$-type impurity diffusion layer
69 $n^+$-type impurity diffusion layer
71 wiring film
71A pad region
72 wiring film
73 wiring film
75 n-type silicon epitaxial layer
77 $n^+$-type impurity diffusion layer
78 $p^+$-type impurity diffusion layer
79 $p^+$-type impurity diffusion layer
81 long side
82 short side
85 front surface peripheral edge
90 polysilicon film
91, 92 n-type polysilicon region
93 p-type polysilicon region 94 interlayer insulating film
94a-94f opening
95 p-type polysilicon film
96, 97 n-type diffusion region
98 first polysilicon film
98p p-type region
98n n-type region
99 second polysilicon film
102 chip capacitor (second preferred embodiment)
103 chip capacitor (third preferred embodiment)
104 chip capacitor (fourth preferred embodiment)
105 chip capacitor (fifth preferred embodiment)
106 chip capacitor (sixth preferred embodiment)
107 chip capacitor (seventh preferred embodiment)
108 chip capacitor (eighth preferred embodiment)
109 chip capacitor (ninth preferred embodiment)
110 chip capacitor (tenth preferred embodiment)
111 chip capacitor (eleventh preferred embodiment)
112 chip capacitor (twelfth preferred embodiment)
C0 capacitor component (basic capacitance element)
C1~C6 capacitor component (adjusting capacitance element)
F1~F6 fuse
201 chip part
202 semiconductor substrate
202A element forming surface
203 first external connection electrode
204 second external connection electrode
205 composite element
206 resistor portion
207 diode
209 circuit substrate
210 recess
211 corner portion
214 first wiring film
215 second wiring film
216 cathode electrode film
217 anode electrode film
218 pad opening
219 pad opening
221 resistor body film
222 wiring film
223 protective film
224 resin film
228 pad opening
229 pad opening
273 n$^+$-type region
274 pn junction region
277 cathode pad
278 anode pad
401 smartphone
402 casing
410 electronic circuit assembly
411 wiring substrate
421 chip inductor
422 chip resistor
424 chip resistor
425 chip inductor
427 chip capacitor
428 chip diode
430 chip capacitor
431 chip diode
433 chip resistor
434 chip capacitor
435 chip inductor
L1 lead-out electrode
L2 lead-out electrode

What is claimed is:

1. A chip part comprising
a substrate having an element forming surface and having a first region and a second region, the first region and the second region being apart from each other in a plan view of the element forming surface,
a composite element including a first element and a second element that are formed mutually independently on the element forming surface and having external connection electrodes constituted of the two electrodes of a first external connection electrode and a second external connection electrode,
a first internal electrode and a second internal electrode formed as one and another pole of the first element,
a third internal electrode and a fourth internal electrode formed as one and another pole of the second element, and
wherein the first external connection electrode is connected in common to the first internal electrode and the third internal electrode,
the second external connection electrode is connected in common to the second internal electrode and the fourth internal electrode,
the first internal electrode and the third internal electrode are disposed within an inner area surrounded by a periphery of the first external connection electrode in the plan view in the first region such that the first internal electrode and the third internal electrode are adjacent to each other, and
the second internal electrode and the fourth internal electrode are disposed within an inner area surrounded by a periphery of the second external connection electrode in the plan view in the second region such that the second internal electrode and the fourth internal electrode are adjacent to each other.

2. The chip part according to claim 1, further comprising an insulating film formed so as to cover the first internal electrode, the second internal electrode, the third internal electrode, and the fourth internal electrode and having pad openings formed therein to expose portions of the first to fourth internal electrodes as pads, and
wherein the first external connection electrode and the second external connection electrode extend across the insulating film and enter into the respective pad openings.

3. The chip part according to claim 2, wherein a distance between the pad openings of the first and third internal electrodes and/or a distance between the pad openings of the second and fourth internal electrodes are or is 7 µm to 10 µm.

4. The chip part according to claim 1, wherein the first element includes a resistor portion, formed of a thin film resistor body formed on the substrate, and a wiring film connected to the resistor portion, and
portions of the wiring film form the first and second internal electrodes.

5. The chip part according to claim 4, wherein portions of the thin film resistor body and the wiring film are used as a fuse element.

6. The chip part according to claim 1, wherein the second element includes a plurality of diode cells, each having a diode junction region formed in the substrate, a first lead-out electrode connected to poles at one side of the diode cells, and a second lead-out electrode connected to poles at another side of the diode cells,
a portion of the first lead-out electrode forms the third internal electrode and a portion of the second lead-out electrode forms the fourth internal electrode.

7. The chip part according to claim 6, wherein each diode junction region is a pn junction region.

8. The chip part according to claim 7, wherein the substrate is constituted of a p-type semiconductor substrate, an n-type diffusion layer, forming the pn junction region in conjunction with the p-type semiconductor substrate, is formed in the p-type semiconductor substrate,
the second lead-out electrode is electrically connected to the semiconductor substrate, and
the first lead-out electrode contacts the n-type diffusion layer.

9. The chip part according to claim 8, wherein the second lead-out electrode includes an electrode film that contacts the p-type semiconductor substrate and is formed of AlSi.

10. The chip part according to claim 1, wherein each of the first external connection electrode and the second external connection electrode includes an Ni layer and an Au layer and the Au layer is exposed at the uppermost surface.

11. The chip part according to claim 10, wherein each of the first external connection electrode and second external connection electrode further includes a Pd layer interposed between the Ni layer and the Au layer.

12. The chip part according to claim 1, wherein the element forming surface of the substrate has a rectangular shape with rounded corner portions.

13. The chip part according to claim 12, wherein a recess is formed in a middle portion of at least one side of the rectangular shape.

14. A circuit assembly comprising
a mounting substrate and
the chip part according to claim 1 mounted on the mounting substrate.

15. The circuit assembly according to claim 14, wherein the chip part is connected to the mounting substrate by wireless bonding.

16. An electronic device comprising
the circuit assembly according to claim 14 and
a casing housing the circuit assembly.

* * * * *